United States Patent [19]
Regula

[11] Patent Number: 6,091,705
[45] Date of Patent: Jul. 18, 2000

[54] METHOD AND APPARATUS FOR A FAULT TOLERANT, SOFTWARE TRANSPARENT AND HIGH DATA INTEGRITY EXTENSION TO A BACKPLANE BUS OR INTERCONNECT

[75] Inventor: Jack Regula, San Jose, Calif.

[73] Assignee: Sebring Systems, Inc., Campbell, Calif.

[21] Appl. No.: 08/771,581

[22] Filed: Dec. 20, 1996

[51] Int. Cl.[7] .................................. H04J 1/16; H04J 3/14
[52] U.S. Cl. ............................................................. 370/223
[58] Field of Search ................................... 370/221–224, 370/254, 258, 401–408, 503; 375/354, 356, 371–376; 340/825.08

[56] References Cited

U.S. PATENT DOCUMENTS

| | | | |
|---|---|---|---|
| 4,736,393 | 4/1988 | Grimes et al. ......................... | 340/825.2 |
| 4,845,709 | 7/1989 | Matsumoto et al. ................ | 340/825.05 |
| 4,939,752 | 7/1990 | Literati et al. ........................... | 375/356 |
| 5,241,543 | 8/1993 | Amada et al. ........................... | 370/503 |
| 5,764,924 | 6/1998 | Hong ....................................... | 395/281 |
| 5,828,670 | 10/1998 | Narashima et al. .................... | 370/516 |

OTHER PUBLICATIONS

Master Thesis by Ivan Tving, Aug. 28, 1994 "Multiprocessor interconnection using SCI".

PCI Local Bus Specification, Revision 2.1, Jun. 1, 1995 PCI Special Interest Group.

PCI to PCI Bridge Architecture Specification, Version 1.0, 1994 PCI Special Interest Group.

*Primary Examiner*—Ajit Patel
*Attorney, Agent, or Firm*—Swernofsky Law Group; Daniels B. Curtis

[57] ABSTRACT

The disclosure relates to apparatus and methods that provide a system interconnect for transporting cells between nodes on a dual counter-rotating ring network, including a link selection register for selecting the shortest path to a destination node, use of a fault tolerant frequency reference to synchronize node clocks, interconnect initialization, multi-ring topologies along with an addressing schema and ring-to-ring couplers. The disclosure also discusses flow control of cells leaving nodes, coupling cells from one ring to another, and use of such an interconnect as a bus replacement.

24 Claims, 28 Drawing Sheets

METHOD AND APPARATUS FOR A FAULT TOLERANT, SOFTWARE TRANSPARENT AND HIGH DATA INTEGRITY EXTENSION TO A BACKPLANE BUS OR INTERCONNECT

BACKGROUND OF THE INVENTION

1. Field of the Invention

This invention relates to the field of computer and network interconnections, backplane busses and bus-to-bus bridges, and more specifically to a method, apparatus, and system for building a very high speed, fault tolerant, high-data-integrity network of bus-to-bus bridges. This network is completely transparent in operation to modules that use it to communicate with each other. Modules that are connected to different, interconnected busses communicate as if they were connected to the same bus. The invention provides a bandwidth many times that of a single bus and can be used to replace and/or extend conventional backplane busses or to form a network switch fabric.

2. Description of the Prior Art

A major issue in the information age is the speed at which data can be transferred between points. This issue exists in computers both for transferring data between memory and a central processing unit, and for transferring data between devices and/or memory. The issue also exists for transferring data between computers or digitized voice data between telephone units.

As processor speed and network traffic has increased, the physical limitations of traditional interconnects have become more apparent. With commonly available home computers operating at a clock speed of more than 200 MHz, the computing bottleneck is generally a result of moving data within the system and not as a result of processing the data. Rambuss technology is one approach that addresses a similar problem in providing a high bandwidth interconnection between a processor and memory. Other approaches exist for generalized high speed interconnects such as the scaleable coherent interface (SCI).

A problem is that vast amounts of data need to be transported from one place to another as quickly as possible with minimal latency and maximum throughput. This issue is complicated by the advantages of remaining backward compatible with existing device interface standards because of the existing market investment in such devices. Thus, a need exists for an interconnect that operates, and is configured, as a bus-to-bus bridge and can be used without changes to a computer's operating system or drivers related to the functions of the interconnected device.

Historically, devices have been attached to a computer bus such as the Small Computer System Interconnect (SCSI) bus, or the Peripheral Component Interconnect (PCI) bus. These busses make physical tradeoffs between the bus bandwidth, the length of the bus, and cost. They are limited to only a single data transfer between devices on these busses at any given time.

Some bus topologies, such as a ring topology, allow for multiple transfers to occur between devices. In a ring topology, a number of nodes are connected together using a serial arrangement of point-to-point busses such that each node "directly" communicates to a limited number of nodes. Data passes from one node to another by passing through intermediate nodes. Thus, with a four-node ring at least four separate data transfers can occur at the same time. Because data may pass through a number of nodes on the ring, the latency of each node must be minimized to achieve maximal bandwidth between two non-adjacent nodes. Often, such rings have a sufficiently complex protocol that software (or complex and therefore slow or expensive hardware) is required to process each unit of data (cell or packet) received by a node. This software increases the latency in each node.

SCI (IEEE std 1596–1992) can be used as a computer interconnect. This usage is well described in *Multiprocess Interconnection using SCI,* by Ivan Tving, © 1994 and is included by reference as illustrative of the prior art. One problem with SCI is that it is not completely synchronous. The specification requires an "elastic buffer" to serve as a synchronization barrier between one node and its adjacent downstream node. This elastic buffer is used to get around the problems of clock drift and bit skew between the parallel data signals. This pleisochronous operation requires that idle symbols must be added to the data stream. Inclusion of these idle symbols decreases the interconnect's bandwidth, increases each SCI node's latency and increases the cost of SCI. SCI also supports cache coherent operation (not required for many applications) increasing protocol complexity.

Additionally, details of the PCI bus operation are described in the PCI *Local Bus Specification,* revision 2.0, © 1993, PCI Special Interest Group, that is included by reference as illustrative of the prior art. Further, details relating to how PCI busses are bridged together are provided by the *PCI to PCI Bridge Architecture Specification,* version 1.0, © 1994, PCI Special Interest Group, that also is included by reference as illustrative of the prior art.

Because the interconnect is fundamental to devices that transport data, the device fails if the interconnect fails. Thus, there exists a need for a fault tolerant interconnection. Such a fault tolerant interconnection should provide a high data integrity interconnection, automatically detect and adjust for failures in the interconnect and allow for replacing nodes on the interconnect while the interconnect is operating (a hot swap capability).

SUMMARY OF THE INVENTION

An object of the present invention is to provide a system interconnect with nodes and paths that provides a frequency reference to each node on the interconnect, with the frequency reference being used to generate the same frequency node clock in each node and with data from one node being sent to another adjacent node without including a data clock signal.

Another object of the present invention is to provide an interconnect initialization mechanism and method that propagates the initialization from node to node on the interconnect.

Another object of the present invention is to provide a system interconnect that detects interrupt conditions on a bus attached to a node and of propagating the interrupt condition to another node on the system interconnect.

Another object of the present invention is to provide a system interconnect that performs flow control to limit the number of cells transmitted by a node.

Another object of the present invention is to provide a link selection register that selects which path of a dual ring network is used when transmitting a cell from one node to another.

Another object of the present invention is a multiple ring system interconnect that allows cells to be sent from one ring to another by using a routing tag in the cell.

Another object of the present invention is to provide a backup frequency reference mechanism to provide fault-tolerant operation of the system interconnect.

Another object of the present invention is to provide a system interconnect that communicates bus operations performed on one bus to be communicated to devices on another bus with the busses being connected to differing nodes on the interconnect.

A preferred embodiment of the present invention includes a method and apparatus for implementing a system interconnect for transporting a first cell containing a plurality of data between a plurality of nodes. The system interconnect includes a first unidirectional path between each pair of adjacent nodes of said plurality of nodes. The first unidirectional path includes an incoming end, an outgoing end, a first plurality of signal lines and a frequency reference line. The pair of adjacent nodes have a source node and a receiver node with each of the plurality of nodes including an input section connected to the incoming end of an input path and an output section connected to the outgoing end of an output path. A frequency reference signal is provided on the frequency reference line to the plurality of nodes. A phase lock loop frequency multiplier generates a node clock based on said frequency reference signal. The node clock has the same frequency for each of said plurality of nodes. The source node includes a source node clock and the receiver node includes a receiver node clock. The output section of the source node transmits the first cell over a first unidirectional path to the input section of the receiver node. This transmission is accomplished by emitting a plurality of data transitions, representing the first cell, onto a first plurality of signal lines at the outgoing end of the first unidirectional path. The input section of the receiver node receives the data transitions from the first plurality of signal lines at the incoming end of the first unidirectional path.

A method and apparatus for initializing a plurality of nodes on a ring network of a system interconnect includes a network also having a plurality of links with initialization being accomplished by a first node emitting a reset sequence to a second node and the second node further emits the reset sequence.

A method and apparatus for configuring a system interconnect for transporting a cell from a source node on a ring network to a destination node on said network includes a system interconnect having a plurality of nodes, a first path and a second path, with one of said plurality of nodes being a configuration node. Configuration is accomplished by initializing the nodes and with the configuration node emitting a first identifying address sequence containing a configuration node address onto a first path, a second node receiving from the first path the first identifying address sequence, the second node modifying the configuration node address to create a second node address and the second node emitting a second identifying address sequence containing the second node address onto the first path.

A method and apparatus for transporting a cell from a source node on a ling network, with a plurality of links, to a destination node of a plurality of destination nodes includes tracking a number of incomplete transactions and delaying the generation of the cell if one more than the number of incomplete transaction is outside a sliding window width. After one more than the number of incomplete transactions is within the sliding window width, the cell is generated and transported to the destination node.

A method and apparatus for transporting a cell from a source node on a ring network to a destination node on the network, includes a clockwise path and a counterclockwise path, with transporting the cell being accomplished by accessing a link selection register at the source node to select which path to use to transport the cell and then transporting the cell over the selected path.

Another embodiment of the method and apparatus for transporting a cell from a source node on a network to a destination node on the network wherein the network has a plurality of rings with each ring having a plurality of nodes and the plurality of rings have a source ring and a second ring connected by a ring coupler node, cell transportation is accomplished by the source node constructing a cell with a routing tag containing a first and second forward hop address and transmitting the cell onto the source ring. The ring coupler node swallows the cell from the source ring and transmits the cell onto the second ring.

Another embodiment is a method and apparatus for transporting a cell (with a routing tag) from a first ring to a second ring by a ring-to-ring coupler node that has an address wherein the transportation is accomplished by receiving the cell from the first ring, determining disposition of the cell solely from said routing tag and the address of the ring-to-ring coupler node and transmitting the cell onto the second ring.

In a method and apparatus that recovers from the loss of an initial frequency reference signal on a first path, recovery is accomplished by delaying a backup frequency reference signal to create a delayed frequency reference signal that is in phase with the initial frequency reference signal, and after the loss of the initial frequency reference signal is detected, using the delayed frequency reference signal.

A method and apparatus for accessing a first bus connected to a system interconnect at a first node, modules access the first bus by performing a bus operation on a second bus connected to the system interconnect at a second node and converting the bus operation into a cell. The cell is then transported over the system interconnect from the second node to the first node, and the first node then performs an equivalent bus operation on the first bus after receiving the cell.

Another embodiment is a method and apparatus for constructing a routing tag for a cell based on an address provided by a bus operation on a bus. Constructing the routing tag is accomplished by capturing the address from the bus and converting the address to a value stored in the routing tag.

An advantage of the present invention is that it provides a very high speed system interconnect with very little latency in each node on the interconnect without a distributed data clock.

Another advantage of the present invention is that it provides a high speed replacement for existing computer buses.

Another advantage of the present invention is that each node provides self adjusting flow control capabilities.

Another advantage of the present invention is that it provides a link selection register that selects which path of a multiple ring system interconnect to use to transmit a cell.

Another advantage of the present invention is that it provides a self contained routing tag that allows a cell to hop from ring to ling in a multiple ring system interconnect.

Another advantage of the present invention is that it provides a backup frequency reference for fault tolerant operation.

These and other objects and advantages of the present invention will no doubt become obvious to those of ordinary skill in the art after having read the following detailed description of the preferred embodiments that are illustrated in the various drawing figures.

DESCRIPTION OF THE PREFERRED EMBODIMENTS

Notations and Nomenclature

The following "notations and nomenclature" are provided to assist in understanding the present invention and the preferred embodiments thereof.

Capturing—A cell is captured by the node when the node determines that the contents of the cell are to be used by the node.

Emitting—The process of sending signals onto a path. A cell is transmitted onto a path by emitting the cell's data onto the path. Some signals are emitted onto the ring that are not part of a cell.

Hexadecimal Numbers—Hex numbers are indicated by an alphanumeric string with a postfix of the character "h". Thus, 1fh indicates a binary value of 11111.

Swallowing—A cell is swallowed by a node when the node removes the cell from the ring. Thus, a destination node swallows and captures a cell addressed to the destination node. A source node swallows a cell addressed to a destination node that returns to the source node. All nodes capture the contents of a broadcast cell and the source node swallows the broadcast cell.

Transmitted—A cell is transmitted onto path in a ring by emitting the data that makes up the cell onto the path.

Overview

The invention comprises a method, apparatus, and system for building a very high speed, fault tolerant, high-data-integrity network of bus-to-bus bridges. This network is completely transparent in operation and in configuration to modules that use it to communicate with each other. Modules that are connected to different, interconnected busses communicate as if they were connected to the same bus. The invention provides a bandwidth many times that of a single bus.

Figure 1A:
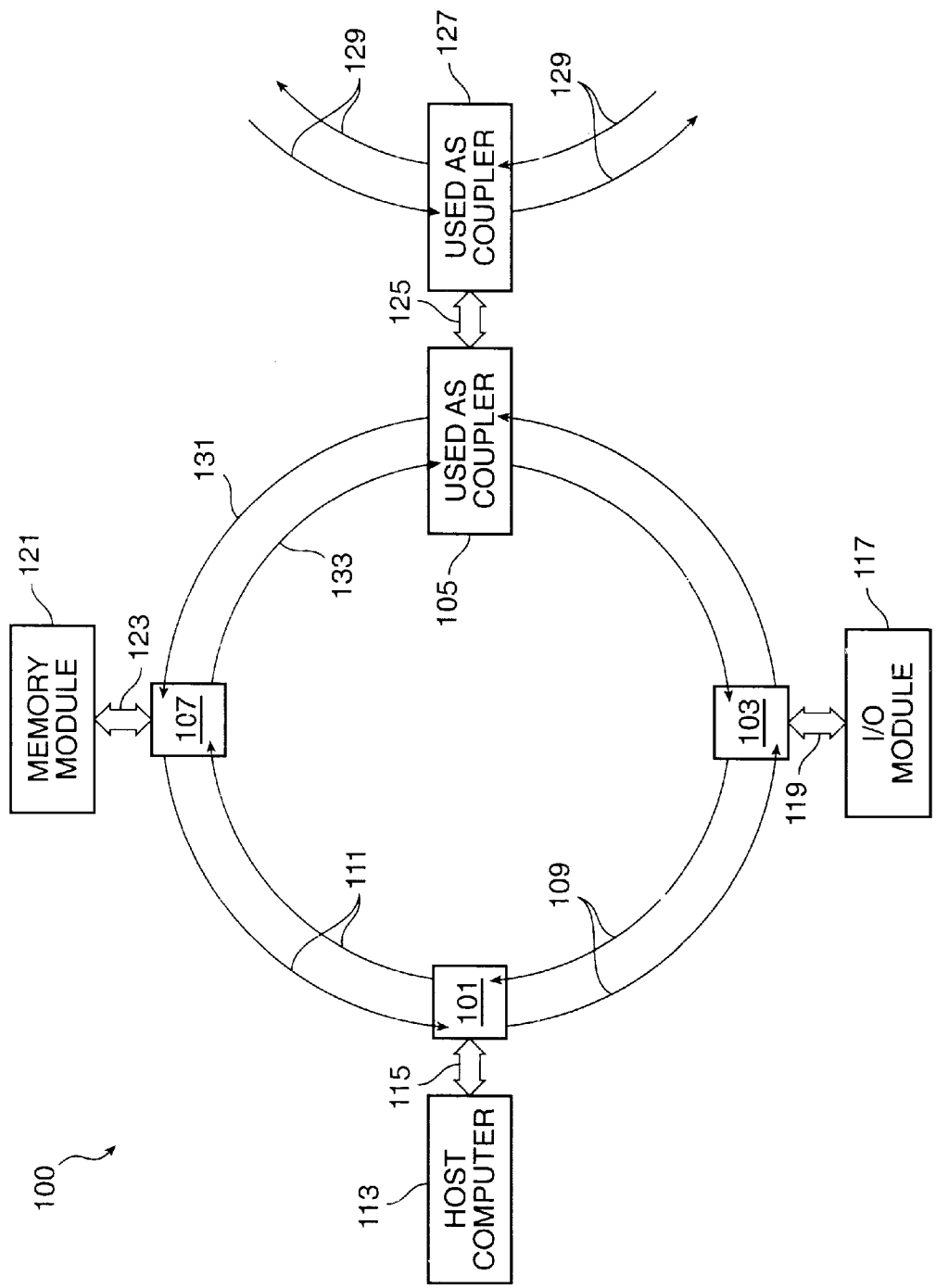
FIG. 1a illustrates a coupled dual counter-rotating ring in accordance with a preferred embodiment of the invention.

FIG. 1a illustrates a dual path counter rotating ring topology, of the present invention, referred to by the general reference character 100. The ring topology 100 includes a plurality of nodes 101, 103, 105, 107, each which is directly connected to two adjacent neighbor nodes in a ring configuration. For example, the node 101 is directly connected to the node 103 by a first link 109 and the node 107 by a second link 111. Both links 109 and 111 comprise two unidirectional data paths each the reverse of the other. The operation of these links is described hereinafter.

The node 101 is attached to a host computer 113 by a well-known PCI bus 115. The host computer 113 communicates through the node 101 using existing device driver methods (such as software drivers) on the host computer 113 to an input/output module 117 attached to the node 103 by a PCI bus 119. The node 101 processes PCI bus commands generated by the host computer 113 to transmit information (contained in cells) over the ring 100 to the node 103. At the node 103 this information is converted to appropriate PCI bus operations and so communicates with the input/output module 117. The ring topology 100 also supports a memory module 121 that can be accessed by the host computer 113 in the same manner as previously described. Additionally, the ring topology supports coupling two rings together. The node 105 communicates over a bus 125 to a node 127 on a separate ring 129. Thus, the host computer 113 also has the ability to access nodes on the separate ring 129. A dual path ring topology includes a counterclockwise path 131 and a clockwise path 133 within the links 109, 111. One skilled in the art will understand that the memory module 121 and the input/output module 117 are simply examples of devices that can be connected to a PCI bus. Further, one skilled in the art understands that multiple PCI devices can be attached to the PCI bus.

Figure 1B:
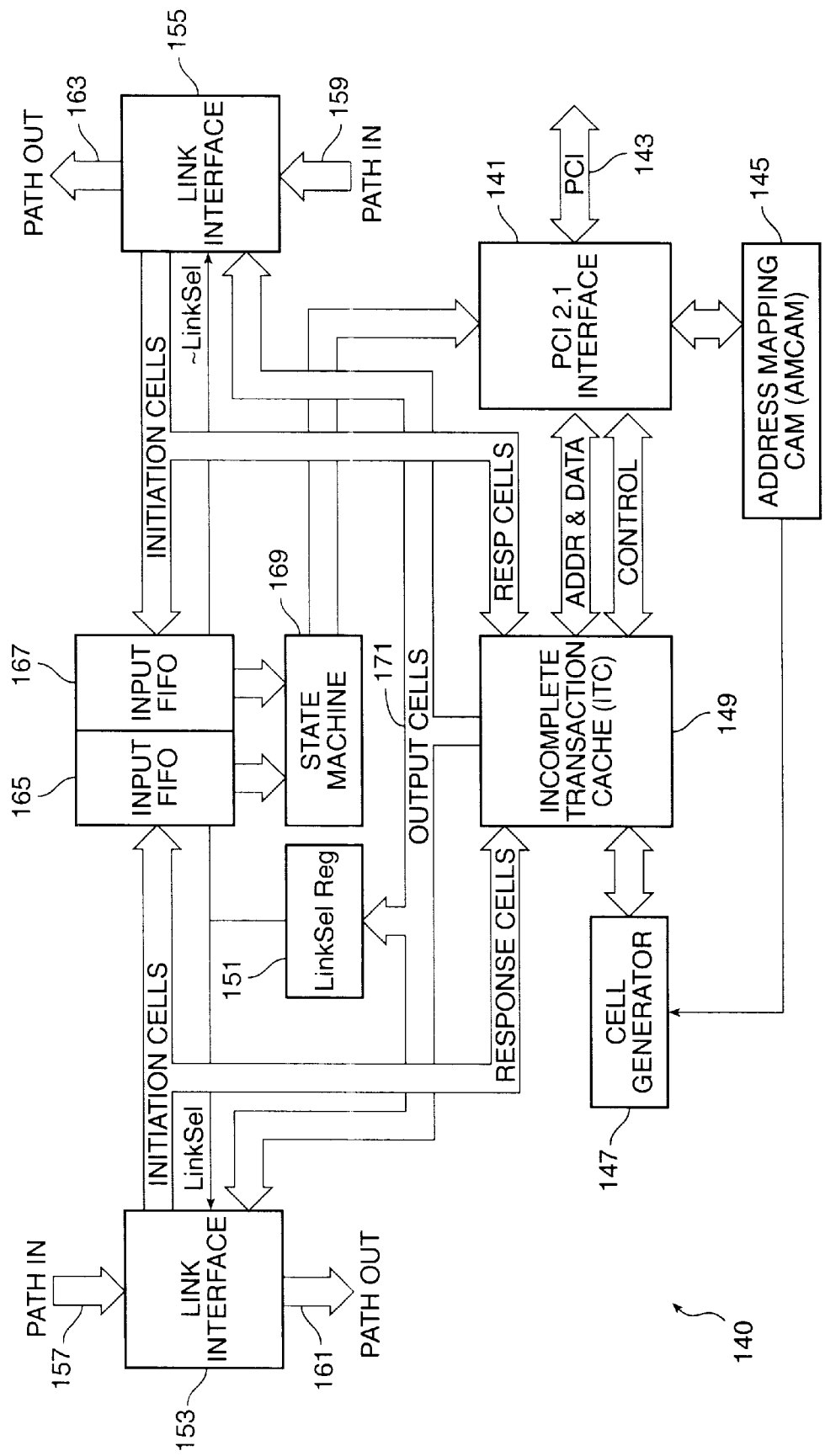
FIG. 1b illustrates a functional overview of the path salient aspects of the invention in accordance with a preferred embodiment of the invention.

FIG. 1b illustrates the structure of a node, referred to by the general reference character 140, and includes a bus interface 141 attached to a bus 143. In a preferred embodiment, the bus 143 is a PCI bus and the bus interface 141 includes separate master/initiator interface and slave/target interface logic.

The node 140 also includes an address mapping content addressable memory (AMCAM) 145 that translates an address supplied by the bus 143 into a network address that is supplied to a cell generator 147. Further, an incomplete transaction cache (ITC) 149 serves as a write-posting and read-prefetch buffer. The ITC 149 also contains requisite transaction information and the state machine and decoding logic required to provide error free transactions or notification of transaction errors; and an accounting mechanism to track incomplete transactions. The operation of the ITC is described hereinafter concerning FIG. 20.

The cell generator 147 translates transactions on the bus 143. Address-phase and write-transaction-data-phase bus transaction subactions are converted into initiation cells and stored in individual entries in the ITC 149. Copies of these cells remain in the ITC 149 after they are transmitted over a link. A given initiation cell remains in the ITC until the node receives an appropriate response cell associated with the given initiation cell. A PCI bus write command creates a write transaction initiation cell. An acknowledgment response cell completes the transaction initiated by a write transaction initiation cell. A PCI bus read command creates a read transaction initiation cell. This cell invokes one or more acknowledgment response cells containing the requested data. Read transaction initiation cells remain in the ITC 149 until the requested data has been supplied to the bus interface 141 to satisfy the PCI bus 143 read command, or until an age limit is reached or until displaced by another cell.

A link selection register 151 determines which of the two outbound links is used to transmit a cell initiated by the node 140. The link selection register 151 is configured to specify the shortest path for the cell to reach its destination node. If the ring has a fault, the link selection register 151 adaptively selects the surviving path. Response cells are always sent on the opposite path used by the corresponding initiation cell.

The node 140 also includes a plurality of link interfaces 153, 155 respectively attached to the incoming end of a unidirectional link 157, 159, and the outgoing end of a unidirectional link 161, 163. Each link interface 153, 155 swallows cells addressed to the node 140 or cells transmitted by the node 140. Further, each link interface 153, 155 forwards cells that are not swallowed to the next node on the path. Also, broadcast cells are captured by the node 140 and forwarded to the next node on the path. Additionally, each link interface 153, 155 transmits cells that oliginate within the node 140 such as by operation of the PCI interface 141.

Each of the link interfaces 153, 155 are respectively connected to an input FIFO buffer 165, 167. Initiation cells that are swallowed or captured are temporarily stored in these FIFO buffers 165, 167 until the cells can be processed. However, response cells are not queued in the FIFO buffers 165, 167 and instead are immediately processed by the ITC 149.

The node 140 also includes a state machine 169 that reads cells from the input FIFO buffers 165, 167, interprets the contents of the cells, and performs operations on the PCI interface 141.

Other logic (not shown in FIG. 1b) automates the configuration of the node 140 such that node-to-node communication over the ring topology 100 does not require interconnect specific or other non-standard (device-unique) configuration software. This logic includes a set of configuration space registers (CSRs), a means of addressing the CSRs as if they were part of a hierarchical bridge network instead of part of a dual counter-rotating ring network, a means for propagating writes to certain of these CSRs to other nodes in the interconnect, and copies of the CSR in the other nodes. In a preferred embodiment within the PCI environment, these additional CSRs are as defined in the *PCI to PCI Bridge Architecture Specification*.

An incoming cell enters the node through one of the link interfaces 153, 155. If the cell is a broadcast cell, not originally transmitted by the node, or the cell is not addressed to the node, the cell is forwarded to the next node on the path. If the incoming cell that arrives at the link interface 153 is an initiation cell addressed to this node, the cell flows to the input FIFO 165. Once in the input FIFO 165, the cell is processed by the state machine 169 causing the PCI interface 141 to perform operations on the PCI bus 143. These operations result in response cells being sent to the cell's source node. An operation on the PCI bus 143 results in a cell being generated by the cell generator 147. This cell is stored in the ITC 149 and flow controlled. When the cell is to be transmitted, it is examined and selects which path to use based on the link select register 151.

If the incoming cell is a response cell, it flows to the ITC 149 where transaction bookkeeping operations are performed. If the response cells contain data, the data is stored in the ITC 149 until accessed by a PCI bus 143 operation.

Single ring

Although a preferred embodiment of the invention utilizes a dual path counter rotating ring, aspects of the invention can be practiced within a single ring.

Node

Cells, containing data and administrative information, generally travel around the ring in a unidirectional manner. The interconnect 100 includes the counterclockwise path 131 and the clockwise path 133. The number of nodes on the ring is limited by the number of bits in the administrative information used for node addressing. A preferred embodiment allocates five bits for node addressing on the ring and five additional bits for addressing one of a plurality of rings. This allows 32 addressable nodes on each of 32 rings.

Figure 2:
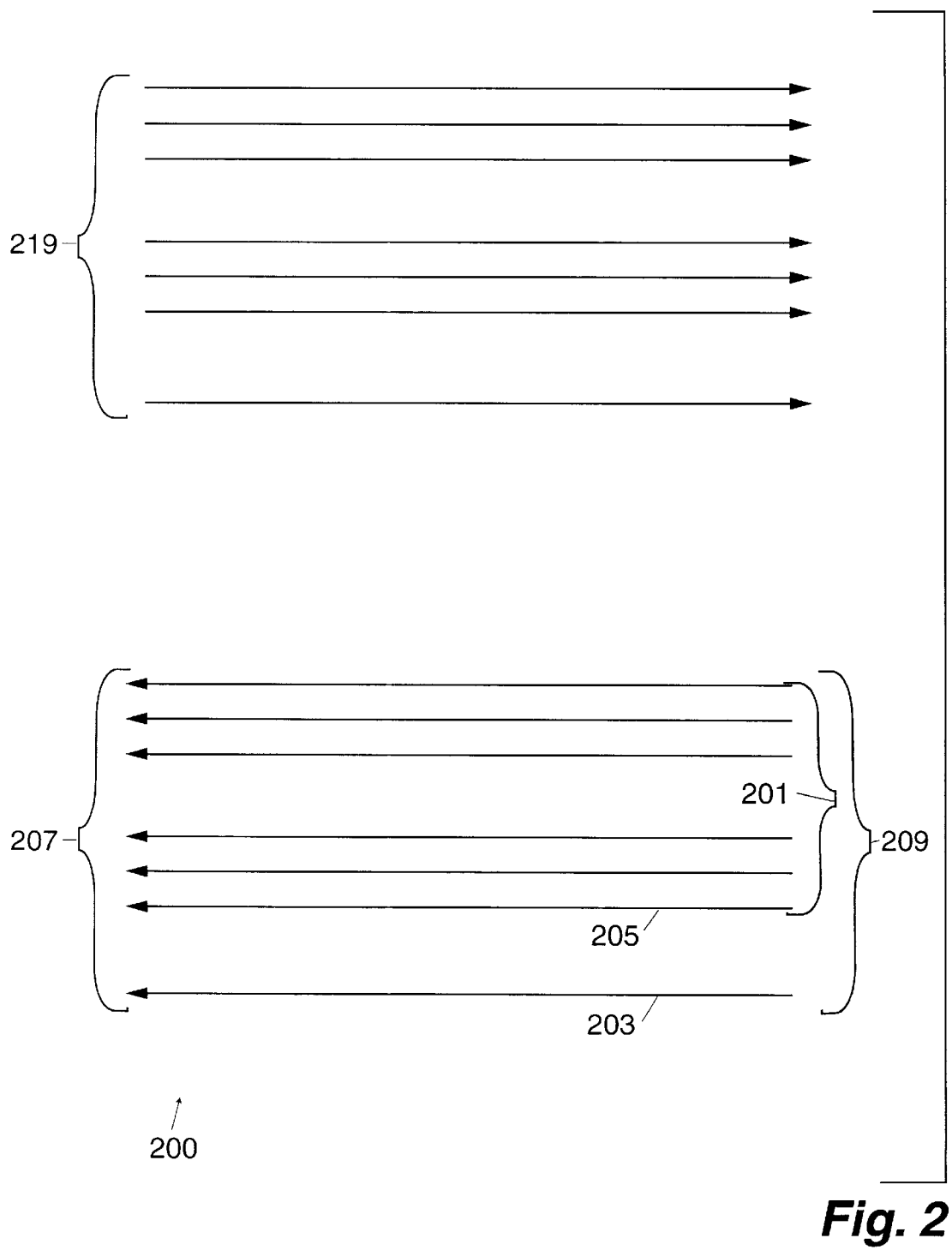
FIG. 2 illustrates the structure of a link that connects adjacent nodes in accordance with a preferred embodiment of the invention.

Cells are sent from the source node 105 to the adjacent receiver node 107 over the counterclockwise unidirectional path 131 within the link. FIG. 2 illustrates the components of a link as indicated by a general reference character 200. The link 200 includes the unidirectional path 131 that contains a plurality of data signal lines 201 and a frequency reference signal line 203. A cell flag signal line 205 (one of the plurality of data signal lines 201) carries a cell flag signal that, in normal operation, delineates cell boundaries. The others of the plurality of data signal lines 201 carry data signals. Because the path 131 is unidirectional, it has an incoming end 207 and an outgoing end 209. The link 200 also includes a plurality of components 219 of the corresponding clockwise unidirectional path 133.

The cell flag signal is carried in parallel with the plurality of data signals. In normal operation, the transitions of the cell flag signal identify the beginning and end of individual cells and allow use of variable length cells for improved efficiency. In addition, the cell flag signal allows a higher data clock rate because the cell flag signal eliminates the need for a cell-synchronization searching state machine that could limit the clock rate.

The frequency reference signal line 203 carries a frequency reference signal. In a preferred embodiment, this frequency reference signal is used as a reference for the higher frequency node clock signals that are derived from the frequency reference signal by a frequency multiplying phase locked loop. This allows each node to generate its own node clock at the same frequency as every other node—but of arbitrary phase. At least one node on the ring is capable of generating the frequency reference signal. This node is called the clock originator. A preferred embodiment also includes a backup clock originator. Fault tolerance considerations relevant to the frequency reference signal are discussed hereinafter concerning FIG. 18.

Figure 3:
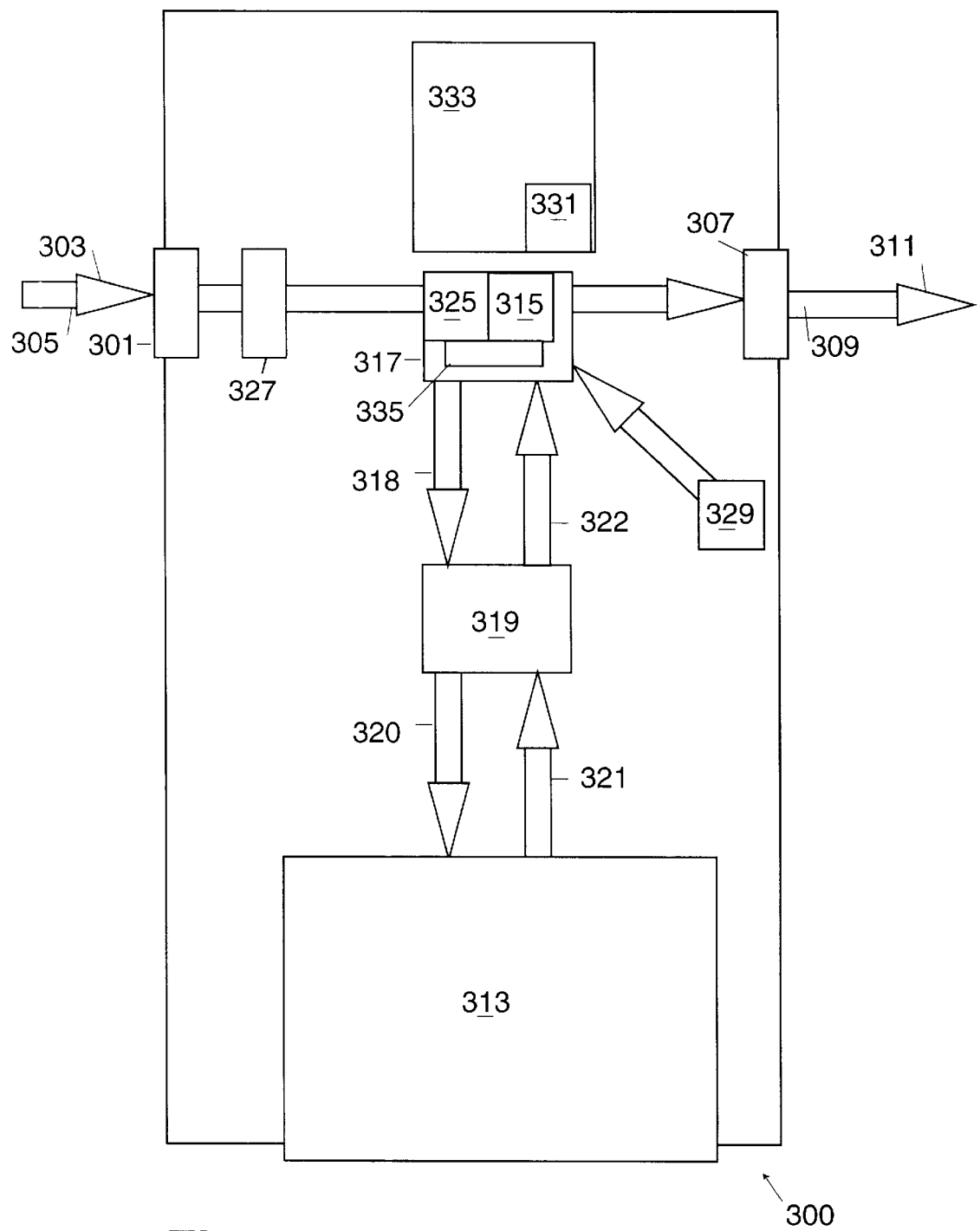
FIG. 3 illustrates the structure of a node in accordance with a preferred embodiment of the invention.

FIG. 3 illustrates aspects of a clock originator node indicated by a general reference character 300. Like other nodes, the clock originator node 300 includes an input section 301 that receives signals from an incoming end 303 of an input path 305. Each node also includes an output section 307 that emits signals to an outgoing end 309 of an output path 311. The input and output sections 301, 307 comprise part of a link interface. The details of the link interface are described hereinafter in relation to FIGS. 10 and 19. Each node further includes an interface mechanism 313 used to process information between an external interface mechanism, such as a PCI bus, and other mechanisms of the node including some of the mechanisms shown in FIG. 1*b*.

A cell enters the node 300 through the input section 301 and as the cell is being received it is examined by a cell routing mechanism 315 within a cell processing mechanism 317. The cell routing mechanism 315 determines whether the cell is to be forwarded or swallowed and whether the cell is to be captured. Forwarded cells are then transmitted through the output section 307 to the outgoing end 309 of the output path 311. Swallowed and captured cells are passed, via a data path 318, to a cell management mechanism 319 that provides error recovery, flow control, and other mechanisms for processing cells. Data from the swallowed cell may be passed to the interface mechanism 313 via a data path 320.

The interface mechanism 313 may also send data over the ring. The interface mechanism 313 passes data, via a data path 321, to the cell management mechanism 319 where the data is packed into cells. These cells are then passed to the cell processing mechanism 317 vie a path 322. The cells are then transmitted onto the ring through the output section 307 to the outgoing end 309 of the output path 311. This cell circulates around the ring until it is swallowed by its destination node or until it arrives again at the source node that transmitted the cell. If the cell arrives at the same node that transmitted the cell (the source node), the source node swallows the cell. The source node identifies its cells by comparing the source node's address (its own address) with a reply address subfield in the cell's header (described in the *Cell Structure and Addressing* section hereinafter). In a preferred embodiment, when a source node receives a cell that it transmitted, the node also performs flow control operations (described in the *Cell Structure and Addressing, Broadcast Protocol* and *Flow Control* sections hereinafter).

The latency between the input section 301 and the link output section 307 is equal to the time required to receive the header. In a preferred embodiment this latency is only two periods of the data clock because the header is 32 bits, and the path is 16 data bits wide. Each node also generates node and data clock signals. The node clock signal is the clocking signal generated by the analog multiplying phase lock loop that is driven by the frequency reference signal. The data clock signals are half the node clock frequency and are of arbitrary phase relative to the incoming data signals. These signals are discussed hereinafter concerning FIGS. 4 and 5.

The above capabilities exist in all nodes on the ring. The clock originator node 300 has a number of additional capabilities. One of the responsibilities of the clock originator node is to remove cells with damaged headers from circulating in the ring. As mentioned previously, a cell is usually swallowed by its destination node and is always swallowed by its source node. Thus, if the destination node is unable to swallow the cell, the cell continues to circulate on the ring until it reaches its source node. The source node then swallows the cell removing the cell from the ring. A problem exists if the cell's header is damaged such that the cell's destination and/or source addresses are unrecognizable.

The clock originator node 300 has a header error check mechanism 325 that detects cells with corrupted headers and swallows and discards the problematic cell. Another capability of the clock originator node 300 is to insert idle sequences on the link. Idle sequences assure that the delay locked loops (DLLs), described hereinafter concerning FIGS. 4 and 6, remain locked to the data signal transitions. Although sufficient transitions to maintain synchronization typically appear in the course of normal data transmissions, there is no guarantee that all data signals receive transitions. Furthermore, no transitions occur during link idle periods. To ensure that the necessary transitions exists, the clock originator periodically emits two word idle sequences, all 0's followed by all 1's ("01") on each signal line 201 (including the flag signal line 205) on all outgoing links. An idle sequence removal mechanism 327 at the clock originator then removes these idle sequences when they have circulated completely around the ring and returned to the clock originator input 301. These idle sequences verify ring integrity because the clock originator node knows the ring is malfunctioning if the idle sequences are not received. In a preferred high speed embodiment, an idle sequence is circulated at approximately 1 MHz that corresponds to less than 0.2% of the system bandwidth. Looking again at FIG. 3, the clock originator node 300 also includes an idle sequence mechanism 329 that generates these idle sequences and passes them to the cell processing mechanism 317 from where the idle sequence is eventually emitted. In a preferred embodiment, the idle sequence consists of a single 1 on all signal lines (except for the frequency reference) followed by a single 0 on the same lines.

The clock originator node also has a master clock input 331 to originate the frequency reference signal. Other nodes in the ring simply propagate their frequency reference inputs. This frequency reference signal is used by a single analog phase lock loop (PLL) 333 within the node to generate the node's clock signals. The frequency reference signal is continuously emitted. This removes the need to encode the data clock in the data transitions and then to recover both frequency and phase information from the data. It further removes the need to operate in a pleisochronous manner. Thus, a cell is transmitted from one node to the next in what would be described as a source synchronous fashion, except that the source node does not provide a clock signal to the destination node.

Synchronization of the local clock and the incoming data occurs in two steps. The first step involves picking one of several, typically four, available data clock phases which is closest in phase to the incoming data signal. This occurs infrequently and serves to minimize the amount of adjustment necessary in the second step. The second step involves adjusting a delay line that is in series between each data (and flag) input and an input register. This adjustment minimizes the phase difference between the selected phase of the data clock and each data signal. Each delay line is part of a delay locked loop (DLL) that continuously adjusts the delay applied to the signal to minimize the phase error. The details of these training and continuous correction processes are provided hereinafter concerning FIGS. 4, 5 and 6.

Finally, each node 300 contains a fairness counter 335, described in the *Transmitting Decision* section hereinafter, that can be used to restrict the flow of cells out of the node 300. This counter 335 provides a programmable allocation of bandwidth among the nodes on the ring.

Figure 4:
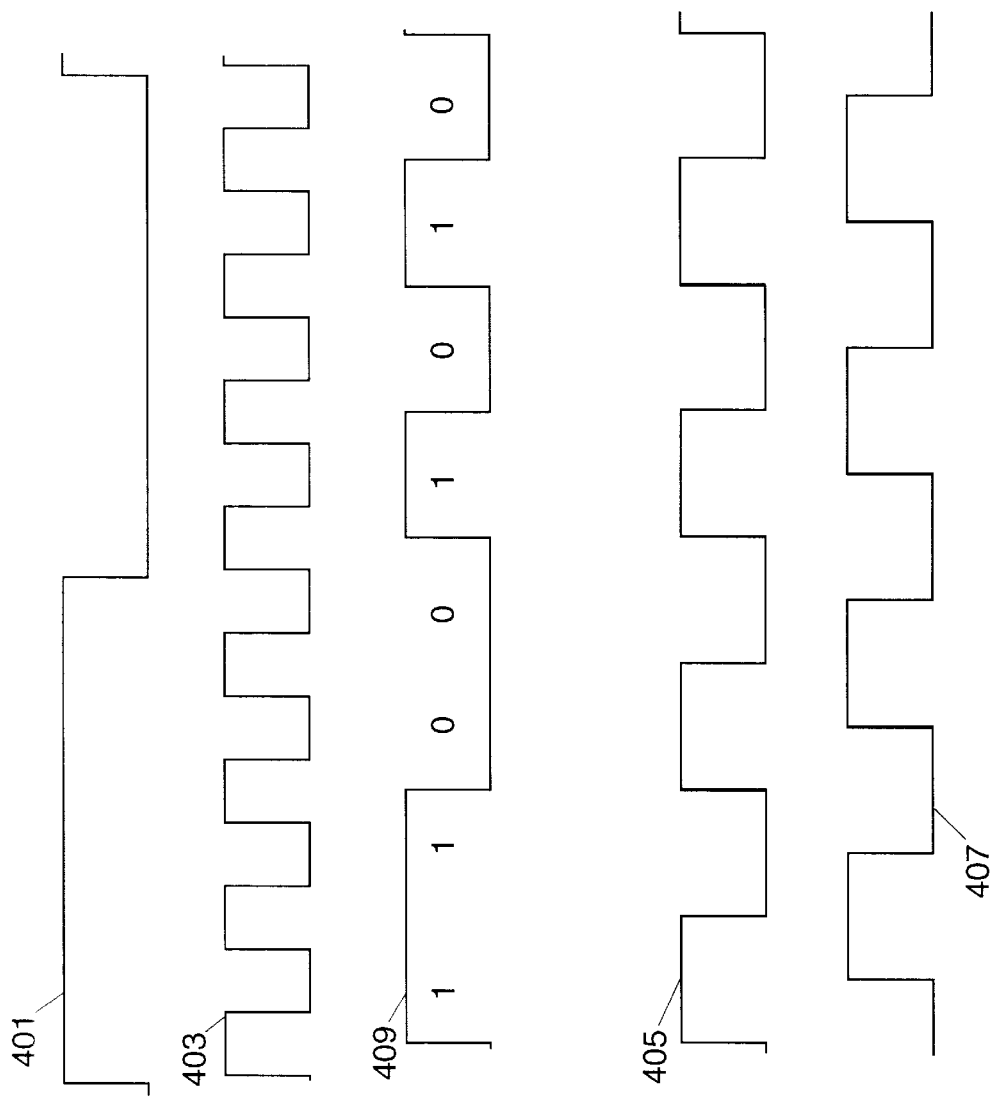
FIG. 4 illustrates the characteristics of the data and clock signals as used by the node in accordance with a preferred embodiment of the invention.

FIG. 4 illustrates relevant wave forms. A frequency reference signal 401 is distributed to each node. At each node this signal 401 is frequency multiplied by the single analog PLL 333 to create a node clock signal 403 (the PLL 333 is of the type commonly available in ASIC libraries). Thus, each node on the ring has the same frequency node clock signal 403. In some low speed embodiments of the invention, the frequency reference signal 401 can be directly used as the node clock signal 403. Although each node's node clock signal 403 has the same frequency as the node clock signal 403 in any other node, the phase of the incoming data relative to the node clock 403 at each node is arbitrary. Therefore, each node delays the incoming data signals to align with data clocks derived from the node clock signal 403.

Use of the frequency reference signal 401 differs from the use of a common, or central, clock signal because the phase relationship between the node clock at the transmitting end of the path is completely arbitrary relative to the phase of the node clock at the receiving end of the path. Distributing the frequency clock reference signal 401 at a lower frequency instead of a high frequency allows for improved clock handling. Lower frequency waveforms suffer less relative dispersion—this allows physically longer links. Furthermore, the lower frequency is simpler and cheaper to generate, and uses less power than a higher frequency clock signal. Thus, distributing a lower frequency reference signal, instead of a higher frequency data clock signal, eliminates most problems commonly associated with clock distribution in high speed, centrally clocked environments. (However, for lower speed interconnects, the frequency reference signal 401 could be the same as or higher frequency than the data clock frequency.) Since a node clock signal's phase is arbitrary, skew between the frequency reference signal 401 and the data signals is of no concern. However, as is described hereinafter with reference to FIG. 6, skew between the data signals is an issue.

Since the phase of the node clock signal 403 is arbitrary, each node's frequency reference signal 401 outputs can be (and are) inverted relative to the frequency reference signal 401 received at the node's inputs. This ensures that there is an equal or almost equal number of rise and fall delays for both the rising and falling edges of the waveform. This technique avoids increasing the pulse width distortion as the frequency reference signal is repeated at each node (this problem exists because the rise and fall delays are typically not the same). Were this not the case, pulse width distortion would eventually limit the number of nodes that could be supported in the ring. Since the frequency reference is distributed at a lower frequency than the node clock signal, the waveform degradation that does occur does not affect the quality of the node clock signal 403 generated from the frequency reference signal 401 at each node.

In a preferred implementation, to support a 250 MHz link clock rate, for example, the frequency reference 401 would be multiplied to 250 MHz then divided by two to provide a nearly perfect 50% duty cycle 125 MHz data clock signal. In a preferred embodiment, data signals are clocked at both edges of the data clock. This technique provides two separate pipelines for the data each pipeline operating at half the data rate. Thus, a 250 Mhz data rate is achieved using a 125 Mhz data clock. This again raises the maximum possible operating frequency. The two separate pipelines are further described hereinafter with reference to FIG. 19.

The ring is susceptible to loss of the frequency reference. Fault tolerance considerations relevant to the frequency reference signal are discussed hereinafter concerning FIG. 18.

Thus, the clock originator node contains the master clock mechanism 331 that generates the frequency reference signal 401 for the ling. Each node uses the PLL 333 to generate the node clock signal 403, an inphase clock signal (ICLK) 405 and a quadrature clock (QCLK) 407 signal. These data clock signals 405, 407 are used to clock data signals to recover the original data. A data signal 409 illustrates the waveform for one of the data lines resulting from a "11001010" data stream.

To summarize, each node uses the incoming frequency reference signal 401 to generate the node's corresponding node clock signal 403. The node clock signal 403 for each node has the same frequency as every other node's clock signal 403, but node clock signal is of arbitrary phase with respect to the node clock signal of the clock originator node or to the data signals arriving at the node's input section 301.

A preferred embodiment of the invention uses a dual path counter rotating ring. Thus, each node has two link interfaces, one for each path. Each link interface 153, 155 generates the inphase clock signal (ICLK) 405 and the quadrature clock (QCLK) 407 signal from the node clock signal 403. The inphase clock signal 405 and the quadrature clock signal 407 are data clocks that are one half the frequency of the node clock and are 90 degrees apart in phase. During an initialization and training period at system startup, the inphase clock signal 405 is shifted by 0, 90, 180, or 270 degrees as required to align its 405 edges (within a 90 degree resolution) with the edges of a reference data stream at the output of a DLL that has been reset to its initial midpoint delay. The quadrature clock signal 407 is delayed 90 degrees from the inphase data clock signal 405 and is used to clock the data signals 409. The inverse clocks are also available. They provide both additional phase information (that is, 180 and 270 degree clock signals) and can also be used as positive edge clocks aligned with the negative edge of the non-inverse clock signals.

Each link interface generates the data clock signals (the inphase clock signal 405 and the quadrature clock signal 407) and delays data signals entering the link interface from the input path 305 so to synchronize these data signals with the inphase clock signal 405. Once the inphase and quadrature clock signals 405, 407 are trained to be within 90 degrees of the data signals, the data signals on each of the plurality of data lines 201, including the cell flag signal line 205, are delayed so as to be in synchronization with the derived inphase clock 405. Training continues until each DLL is locked with the inphase clock signal 405.

Figure 5A:
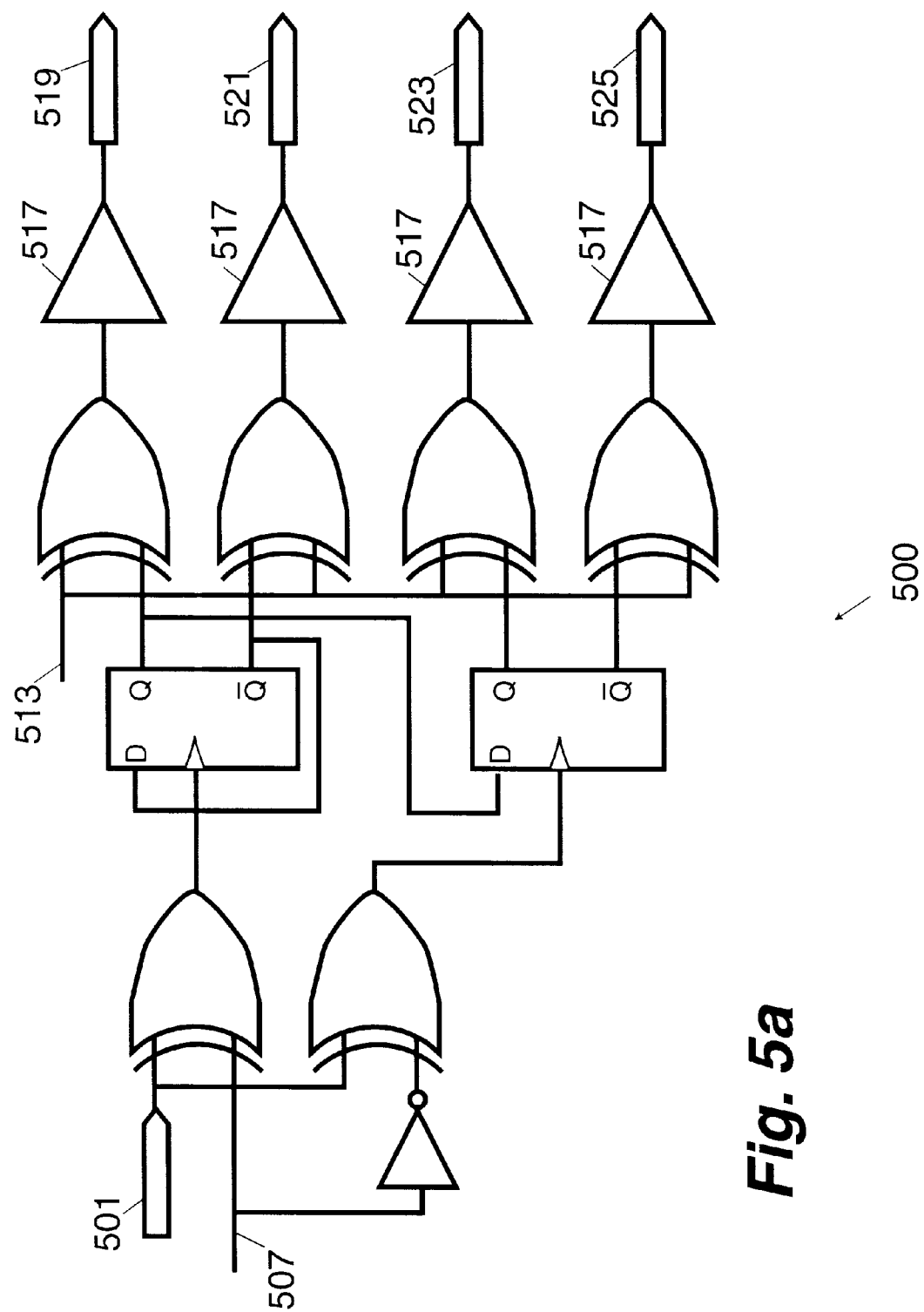
FIGS. 5a,b&c illustrate the circuitry used to generate the node's data clock signals in accordance with a preferred embodiment of the invention.

FIG. 5a illustrates the logic, as indicated by a general reference character 500, used to generate the inphase and quadrature clock signals 405, 407. This logic 500 generates the data clock signals 405, 407 and allows their phase to be shifted to reduce the phase error between the data signal 409 and the inphase clock signal 405. The logic 500 has three inputs. The first is the node clock signal 403 that is supplied at a terminal 501. When asserted, an invert node clock input 507 phase shifts both the ICLK signal 405 and the QCLK signal 407 by 90 degrees. When asserted, an invert clocks input 513 phase shifts both the ICLK signal 405 and the QCLK signal 407 by 180 degrees. By applying appropriate signals to these inputs 507, 513, the node clock signal 403 can be phase shifted by 90, 180, or 270 degrees. The four outputs from this logic 500 are the ICLK signal 405 (at a terminal 519), its complement (at a terminal 521), the QCLK signal 407 (at a terminal 523), and its complement (at a terminal 525). Thus, signals at these phase shift control inputs (the invert node clock input 507 and the invert clocks input 513) change the phase of the data clock signals 405, 407 as shown in Table 1.

TABLE 1

| Invert Clocks Input 513 | Invert Node Clock Input 507 | Phase Shift |
|---|---|---|
| 0 | 0 | 0 |
| 0 | 1 | 90 |
| 1 | 0 | 180 |
| 1 | 1 | 270 |

Figure 5B:
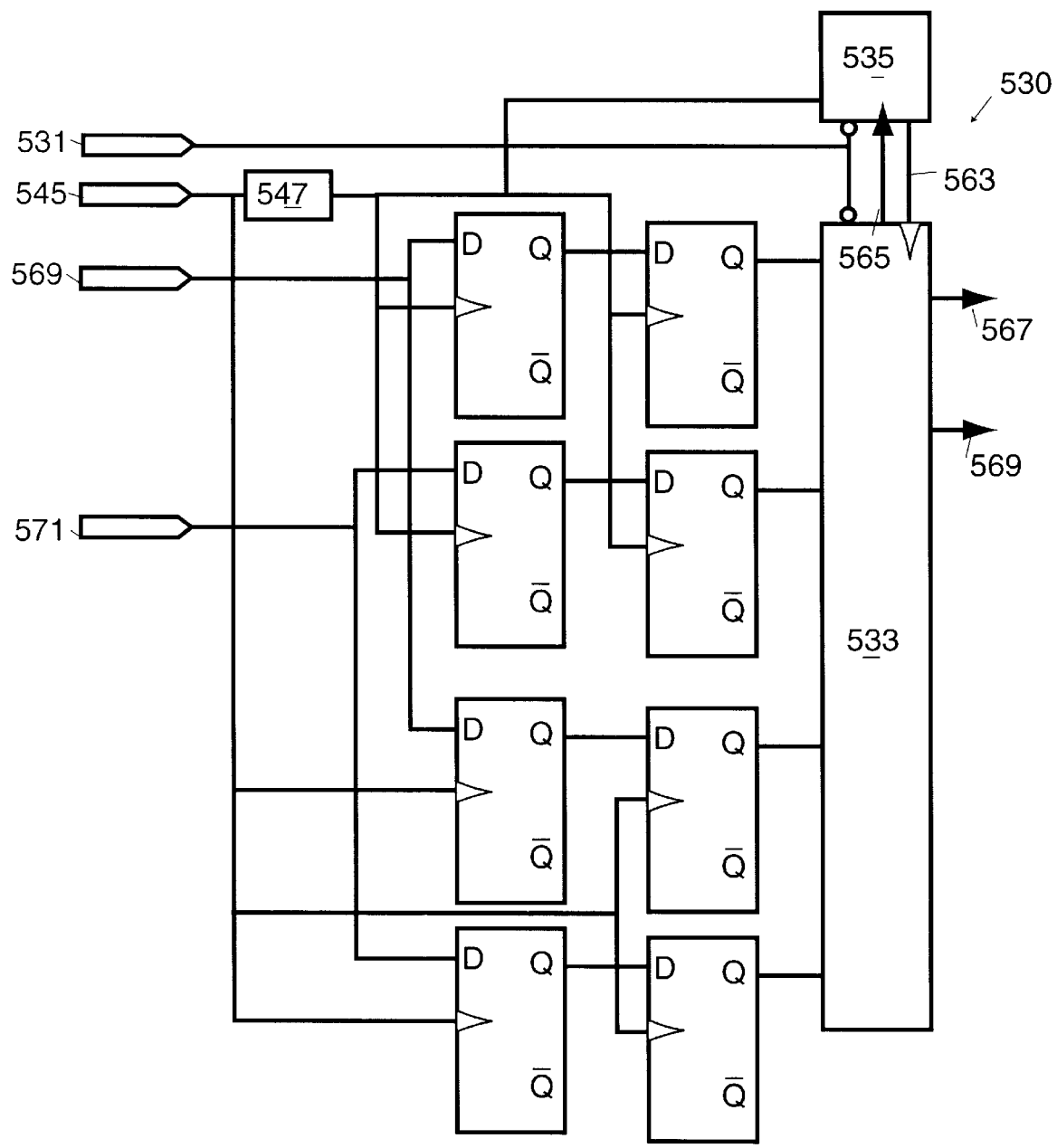
Figure 5C:
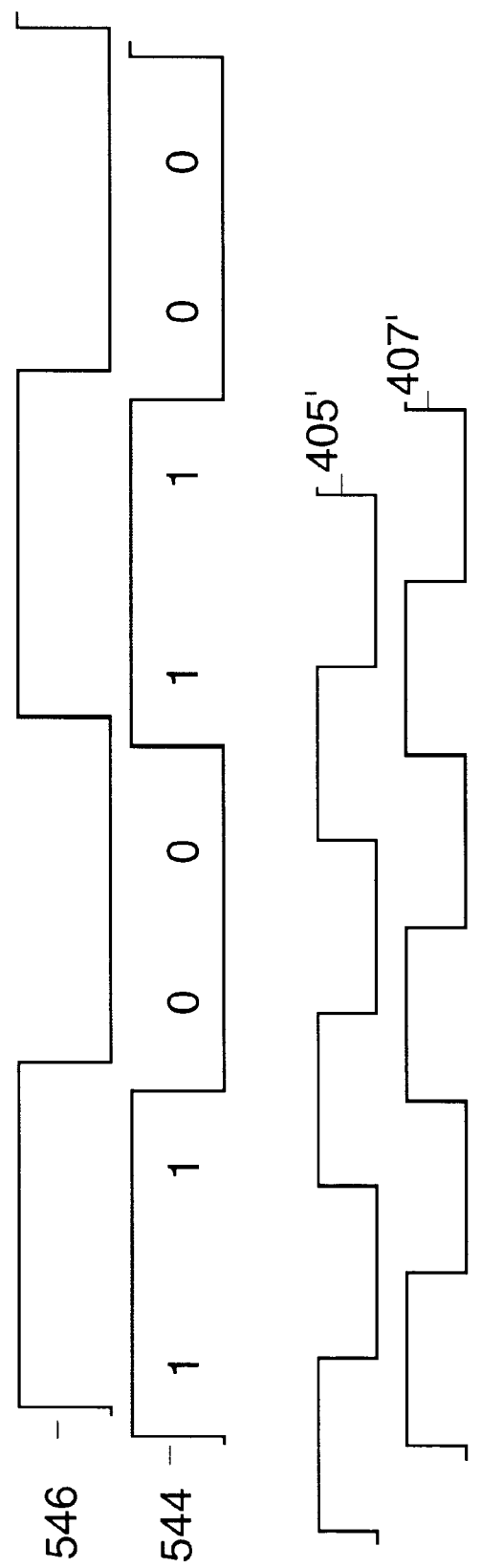

FIG. 5b illustrates logic, referred to by a general reference character 530, used to determine the signals (some of which are shown in FIG. 5c) to be applied to the shift control inputs 513, 507. This logic 530 is reset at node initialization when a reset signal is applied to a RESETL terminal 531. This reset signal resets a delay selection logic 533, and a save state logic 535. Initialization includes clearing any counters, setting the delay lines in each DLL to the midpoint and setting the initial values of the invert clocks signal 513 and the invert node clock signal 507, thus initializing the phase delay of the logic 500.

The logic 530 adjusts the phase of the ICLK signal 405 to approximately match the phase of data signals at the input path 305 as previously described. A training sequence 544 of signal transitions is provided on the data lines 201 by the source node. Samples taken of the ICLK signal 405' and the QCLK signal 407' at the rising edges of the training sequence signal 544 and a delayed training sequence signal 546 determine the required phase shift for the data clock signals 405, 407 as shown in Table 2. Invalid sample values (resulting from logic metastability) cause the sample process to be repeated. The training sequence signal transitions is equivalent to emitting a repeated "0011". This logic 530 uses the data signal on the flag signal line 205 to sample the state of the node's data clock signals 405', 407' at the training signal 544 transitions.

Once the state of these signals is captured these states drive logic (defined as shown in Table 2) that determines the phase delay for the ICLK and QCLK data clock signals 405', 407'. Eight edges of the training signal 544 are counted by the save state logic 535 to allow the logic 530 to settle. The save state logic 535 samples the data clock signals 405', 407' by asserting a sample command signal to the delay selection logic 533 through a trace 563 after eight edges have been counted. The delay selection logic 533 resets the sample command signal if the delay selection logic 533 detects a metastable state at the assertion of the sample command signal. In this circumstance the delay selection logic 533 resets the save state logic 535 by asserting a reset signal on a trace 565. The delay selection logic 533 generates the phase shift control signals 507, 513 specified by Table 1 at a terminal 567 and a terminal 569 to effect the phase shift values specified by Table 2 according the sampled ICLK signal 405' and the QCLK signal 407' values that are its 533 inputs.

TABLE 2

| ICLKFF 541 | QCLKFF 543 | ICLKFD 537 | QCLKFD 539 | Phase Difference | Select Phase | Retry |
|---|---|---|---|---|---|---|
| 0 | 0 | 0 | 0 | 270–360 | 270 | 0 |
| 0 | 0 | 0 | 1 | invalid | N/A | 1 |
| 0 | 0 | 1 | 0 | 0 | 0 | 0 |
| 0 | 0 | 1 | 1 | invalid | N/A | 1 |
| 0 | 1 | 0 | 0 | 270 | 270 | 0 |
| 0 | 1 | 0 | 1 | 180–270 | 180 | 0 |
| 0 | 1 | 1 | 0 | invalid | N/A | 1 |
| 0 | 1 | 1 | 1 | invalid | N/A | 1 |
| 1 | 0 | 0 | 0 | invalid | N/A | 1 |
| 1 | 0 | 0 | 1 | invalid | N/A | 1 |
| 1 | 0 | 1 | 0 | 0–90 | 0 | 0 |
| 1 | 0 | 1 | 1 | 90 | 90 | 0 |
| 1 | 1 | 0 | 0 | invalid | N/A | 1 |
| 1 | 1 | 0 | 1 | 180 | 90 | 0 |
| 1 | 1 | 1 | 0 | invalid | N/A | 1 |
| 1 | 1 | 1 | 1 | 90–180 | 90 | 0 |

In moderate to low speed ring, delaying the data clocks 405', 407' as previously described allows each node to synchronize with the data. For a high speed link, the effects of skew on the data signals must also be considered. Thus, a preferred embodiment adds a DLL to each data signal. One skilled in the art will understand that for some implementations the DLL can identically delay each data signal. However, the preferred embodiment independently delays each data signal to synchronize the signal with the inphase clock 405'.

Figure 6:
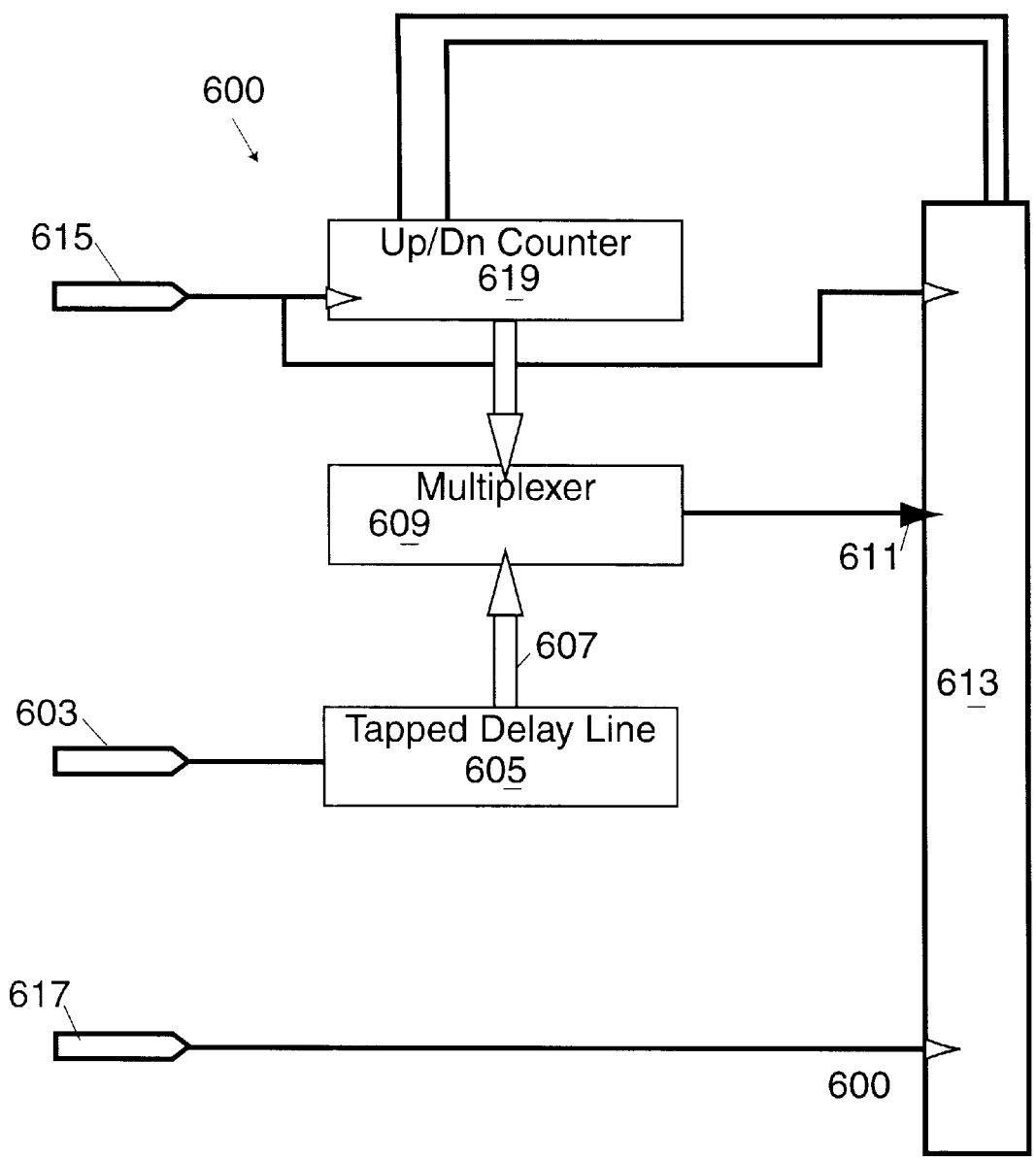
FIG. 6 illustrates the delay lock loop circuitry used to synchronize incoming data signals with the node's data clock signals in accordance with a preferred embodiment of the invention.

FIG. 6 illustrates the logic, indicated by a general reference character 600, to delay any given data signal (including the cell flag signal). The basic operation of this logic 600 is that the data signal is delayed by a variable delay. When an edge on the data line is detected the delay is adjusted.

A data signal enters at a terminal 603. A tapped delay line 605 provides a plurality of delayed data signals 607. One of these delayed data signals 607 is selected by a multiplexer 609 to produce a selected delayed data signal 611. The delayed data signal 611 is provided to an edge detection logic 613. The ICLK signal 405' and QCLK signal 407', as derived and previously described for FIG. 5b, are also provided to the edge detection logic. The ICLK signal 405' is supplied to a terminal 615. The QCLK signal 407 is supplied to a terminal 617. The edge detection logic 613 determines whether edges on the selected delayed data signal 611 are in phase with the ICLK signal 405'. If edges on the selected delayed data signal 611 occur prior to the corresponding edges on the ICLK signal 405', an edge detection logic 613 causes an up/down counter 619 to increment and thus select a more delayed data signal from the plurality of delayed data signals 607. Similarly if edges on the selected delayed data signal 613 occur after the corresponding edges on the ICLK signal 405', the edge detection logic 613 causes the up/down counter 619 to decrease thus selecting a less delayed data signal from the plurality of delayed data signals 607. Thus, once the circuitry is trained, the data signal is delayed so that edges on the data signal are in phase with transitions of the selected phase of the ICLK signal 405'.

The delay locked loop's phase detector 600 makes corrections only when a data transition occurs at a delay line's output. If the data edge samples a zero on the in-phase clock, the next higher delay tap is selected. If it samples a one, the next lower delay tap is selected. At lock, the data delay alternately increases and decreases to move the data edges back and forth relative to the clock edge with a phase error of a small fraction of a clock period. However, the clock phase never changes and the amount of clock jitter is independent of the number of nodes in the ring. Since the clock signal does not jitter, no jitter is passed on to link output data signals. Thus, no jitter is passed to the next node in the ring.

In a preferred embodiment, the DLL is used for each incoming data signal. Thus, each incoming data signal is individually delayed to be in synchronization with the ICLK signal 405'. Thus, the edges of the QCLK signal 407' are centered on the data signals and the QCLK signal 407', or its inverse, is used to clock the delayed data signals as required.

The above described training process occurs for each node on the ring. Once a node's link is trained, the node passes the training sequence to the next node on the ring. The entire system is synchronized when the training sequence circles the ring and returns to the clock originator node and locks the clock originator node's DLLs. The clock originator then proceeds as hereinafter described with reference to FIGS. 15 and 16.

The above description explained how data flows from one node to another and how the data transfer is synchronized and clocked. This data is organized into a structure called a "cell" or "packet". The cell protocol is a slightly modified ATM protocol that uses a variable length cell. Each cell is an integral multiple of 32 bits up to 64 bytes of data and up to 16 bytes of overhead for a total of 80 bytes. In a preferred embodiment, the maximum cell length is restricted to 52/56 bytes for compatibility with the ATM protocol and to reduce the amount of buffer storage required in each node. ATM cells have a length of 53 bytes. The invention limits bus transaction cells to 52 bytes so that these cells can fit within the 53 byte ATM cell. When an ATM cell is received by the invention, it is contained in a cell that is 56 bytes—determining the maximum cell length of 52/56.

Cells are classified as initiation cells, response cells, and operation and maintenance (OAM) "cells." Initiation cells are those that are generated to initiate an operation at a destination node(s). Response cells are generated in response to an initiation cell. An example of OAM "cells" are the idle and training sequences described above. OAM "cells" may or may not have a header or other internal cell structure.

Cell Structure and Addressing

Figure 7:
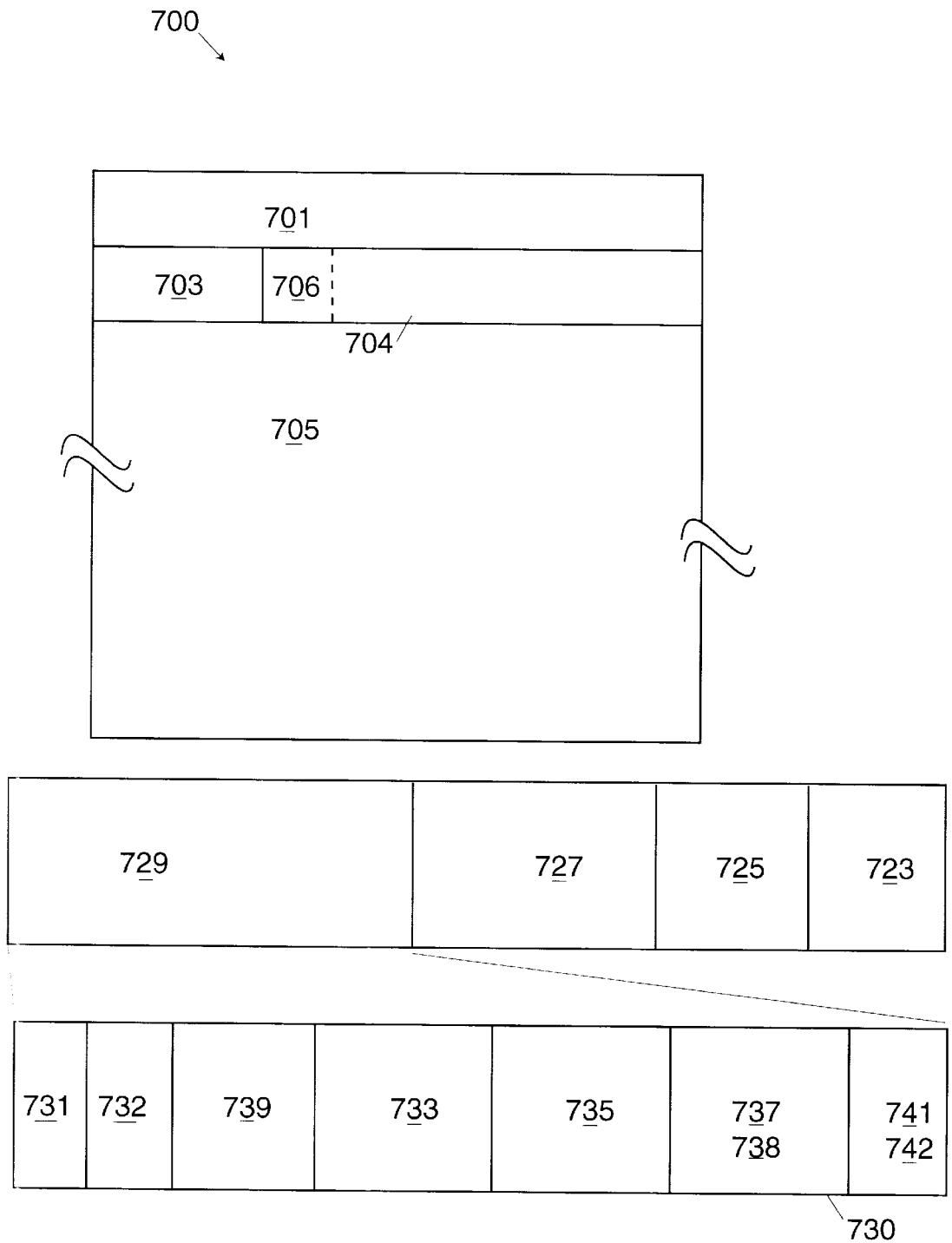
FIG. 7 illustrates the structure of data cells that are transmitted from one node to another over the ring nodes in accordance with a preferred embodiment of the invention.

FIG. 7 illustrates the format of a cell indicated by a general reference character 700. The cell 700 is the unit of transport in the interconnect and is composed of a header 701, a header error check (HEC) subfield 703, within a transfer attributes field 704 and a payload field 705. Although similar to an ATM cell, the size and composition of the payload field 705 of the cell 700 is dependent on the nature of the cell 700.

For bus transaction cells, the transfer attributes field 704 includes an address extension field used for systems employing an address longer than 32 bits. In primary/secondary ring topologies (discussed hereinafter in the *Network Topologies* section), part of the transfer attributes field 704 is used as a source node identification (SrcID) subfield 706 that is required when generating response cells for bus transaction initiation cells. If the cell is a bus transaction cell, the SrcID subfield 706 is filled with the source node's address when the cell is generated.

The cell header 701 has alternate definitions depending on whether the cell is a bus transaction cell or a standard ATM cell. However, transport of the cells by the ring is identical for both bus transaction cells and ATM adaptation layer cells (ATM/AAL cells). The cell header is similar to, but not identical with, the ATM forum's NNI standard header.

The following tables describe the layout of the header 701 and define its fields. The header 701 contains a payload type field 723, a read/write field 725, a command/address space field 727, and a routing tag field 729.

TABLE 3

| | Header 701 Definition | | |
|---|---|---|---|
| bits 31...8 | bits 7...4 | bit 3 | bits 2...0 |
| Routing Tag 729 | Command/Address Space 727 | Write/ Read 725 | Payload Type 723 |

The command/address space field 727 definition differs for ATM cells and bus transaction cells. All values of the command/address space field 727 are reserved for ATM cells. Bus transaction cells use the command/address space field 727 as described as follows.

The payload type field 723 contains the payload type encodings given by Table 4.

TABLE 4

| PT[2:0] | Payload Type |
|---|---|
| 000 | OAM cell |
| 001 | Initiation cell with local bus transaction subaction |
| 010 | Initiation cell with standard ATM/AAL payload |
| 011 | Read Response Cell |
| 100 | Write/ATM Response Cell |
| 101–110 | Reserved |
| 111 | OAM Cell |

The write/read field 725 is a single bit field that indicates the read or write state of a corresponding bus transaction. This bit is always asserted for ATM cells. The command/address space field 727 defines a command and/or address space associated with the payload of a bus transaction cell as defined in Table 5. Other command and address space codes may be implemented for other values of the payload type field 723. This field is currently unused by ATM and should be set to zero for ATM cells.

TABLE 5

| Value | Usage |
|---|---|
| B...Fh | Reserved |
| Ah | Reserved for Locked Transaction with Fetch & Add |
| 9h | Reserved for Locked Transaction with Compare & Swap |
| 8h | Reserved for Locked Transaction with Swap |
| 7h | Deassert Interrupt Request |
| 6h | Assert Interrupt Request |
| 5h | I/O Space read-modify-write (RMW) Transaction |
| 4h | I/O Space Transaction |
| 3h | Memory Space RMW Transaction |

TABLE 5-continued

| Value | Usage |
|---|---|
| 2h | Memory Space Transaction cell (except RMW) |
| 1h | CSR Space Transaction |
| 0h | Idle/unallocated cell |

The routing tag field 729 provides addressing for cells. There are two slightly different forms of the routing tag field 729. One form is used for bus transaction cells and the other form is for ATM cells. Table 6a illustrates the routing tag field 729 used for ATM cells. Table 6b illustrates the routing tag field 729 used for bus transaction cells. Flow control differs for ATM and bus transaction cells. ATM cells support up to three hops of addressing (described hereinafter) but require only a single response address because ATM cells are acknowledged and flow controlled on a hop by hop basis by ring coupler nodes.

Bus transaction initiation cells are flow controlled at the cell's original source node, not at ring coupler nodes. Responses to bus transaction initiation cells may require two hops to reach the cell's original source node. Thus, as is described hereinafter, the routing tag field 729 is different for ATM cells and bus transaction cells. Some of the subfields are the same in both forms of the routing tag field 729.

TABLE 6a

Header Routing Tag for ATM Cells

| Bit | [31] | [30] | [29:25] | [24:20] | [19:15] | [14:10] | [9:8] |
|---|---|---|---|---|---|---|---|
| Use | Bdcst Flag 731 | PTY 732 | 1RA 739 | 1FHA 733 | 2FHA 735 | 3FHA 737 | Destination Link Select 741 |

TABLE 6b

Header Routing Tag for Bus Transaction Cells

| Bit | [31] | [30] | [29:25] | [24:20] | [19:15] | [14:10] | [9:8] |
|---|---|---|---|---|---|---|---|
| Use | Bdcst flag 731 | PTY 732 | 1RA 739 | 1FHA 733 | 2FHA 735 | 2RA 738 cells | Interrupt pin ID on IRQ 742 |

A broadcast subfield 731 identifies a cell as being part of a broadcast addressed to every node. When the broadcast subfield 731 is set, each node that receives the cell both captures and forwards the cell. After the cell has traversed the ring, the source node that transmitted the cell onto the ring swallows the cell (thus removing the cell from the ring). Nodes that capture the broadcast cell generate a response cell back to the source node. Thus verifying the nodes that received the broadcast cell.

A single bit priority subfield 732 does not effect ring level operations. The priority subfield 732 allows embodiments to prioritize competing internal or local bus operations. High priority is specified when this subfield 732 is asserted.

A first forward hop address subfield (1FHA) 733 and a second forward hop address subfield (2FHA) 735 are common to both the ATM and bus transaction forms of the routing tag field 729. The ATM form of the routing tag field 729 also contains a third forward hop address subfield (3FHA) 737.

In a preferred embodiment each forward hop address subfield 733, 735, 737 specifies one of 32 destination nodes in a succession of transmissions (hops) across a number of rings. Each hop endpoint or destination is either a ring-to-ring coupler or the ultimate destination node for the cell. Bus transaction cells can take two hops and so have two forward hop address subfields, 1FHA 733 and 2FHA 735, and two corresponding response address subfields, a second response address (2RA) subfield 738 and a first response address (1RA) subfield 739. The 1RA subfield 739 is also used with ATM cells.

As mentioned above, ATM cells include the 3FHA subfield 737. These ATM cells have the contents of the 3FHA subfield 737 copied to the 2FHA subfield 735 after the second hop is complete. Thus, link routing decisions at the ring-to-ring couplers are based on the contents of the first and second forward hop address subfields 733, 735. The same location in the routing tag field 729 contains either the 3FHA subfield 737 or the 2RA subfield 738 depending on the cell type. Thus, up to three hops of addressing are supported for ATM cells. The final destination of an ATM cell is a plug-in module that employs the lowest level/ring in a hierarchy of rings instead of a local bus.

The final destination of a bus transaction cell is a microcomputer style local bus such as a PCI bus. A bus transaction initiation cell is acknowledged back to its original source node. Therefore, its routing tag field 729 requires both first and second hop response address subfields 738, 739. A bus transaction cell also requires the SrcID subfield 706.

Once an ATM initiation or broadcast cell has been received and fully processed at a destination node or ring-to-ring coupler node, the receiving node is required to transmit a response cell back one hop towards the source node of the initiation cell. When the ATM initiation cell is generated at the source node, the 1RA subfield 739 is filled with the source node's address. In a multi-hop network, ring-to-ring coupler nodes update the 1RA subfield 739 of each cell coupled from one ring to another ring so that the 1RA subfield 739 contains the address of the ring-to-ring coupler. To do this, the ring-to-ring coupler node inserts its node address into the 1RA subfield 739 and regenerates the HEC field 703.

Response cells to bus transaction initiation cells are returned to the cell's original source node. On a primary/secondary ring network (discussed hereinafter in the Network Topologies section), this requires both the 2RA subfield 738 as well as the SrcID subfield 706 previously mentioned. If the cell is a bus transaction cell, the ring-to-ring coupler copies the original contents of the 1RA subfield 739 to the 2RA subfield 738 prior to storing the ring-to-ring coupler's node address in the 1RA subfield 739.

A destination link select subfield 741 is used in ATM cells to select one of four external links at a destination allowing the use of Multi-PHY devices. For bus transaction cells, an "Interrupt Pin ID on IRQ Cells" subfield 742 is used in interrupt transition cells to identify one of four supported interrupt pins at each device attached to the node.

Network Topologies

The routing mechanism supports three basic topologies: a simple ring; a single primary ring with a plurality of secondary rings; and a plurality of peer rings each of which is attached to a (different) plurality of secondary rings. The simple ring topology is a single ring comprised of nodes and links. The primary/secondary ring topology includes of secondary rings (comprised of nodes and links) with each secondary ring connected to a primary ring. The peer ring topology includes of a number of peer rings that are interconnected in all pair-wise combinations. Each peer ring is also connected to at least one secondary ring. In a preferred embodiment, the number of peer rings plus the number of secondary rings attached to each peer ring is less than or equal to 32. Further, although the rings can comprise of a single path, the preferred embodiment uses at least two counter-rotating paths in each ring.

Variations on the primary/secondary ring and multiple peer ring topologies are derived by creating parallel high order ring structures. For example, a primary/secondary ring topology can be created with two or more primary rings instead of just one. In the case of two primary rings, each secondary ring has two ring-to-ring couplers optimally spaced 180° from each other. The far side of these couplers form two independent rings such that each secondary ring is coupled to both of the resulting primary rings.

In the same fashion, a multiple peer ring topology can be created with two or more sets of peer rings. In these topologies (including the topology described in the previous paragraph), cells that need to cross to another ring simply utilize the first ring-to-ring coupler they reach when traversing their home ring. Fault tolerance requires two couplers between each pair of peer rings or parallel peer ring structures. Fault tolerance also requires at least two couplers on each secondary ring to eliminate a single point of failure in the secondary to peer coupler.

Each ring in a multiple ring topology is assigned a ring number. By definition, the secondary ring numbers are the node addresses of their couplers on the next higher level of rings. Routing decisions at ring-to-ring couplers are based on matches/mismatches of the contents of the 1FHA subfield 733 with the ring number of the ring on one side of the coupler or the other, dependent upon the ring topology and the coupler's position within it. At a non-coupler node in a multiple ring network, the decision to swallow a cell requires a match of both the ring address and the node address. To simplify this decision, a cell that does not need to cross to another ring always has the value 1Fh in its 1FHA subfield 733. These routing decision rules are defined and hereinafter discussed. One skilled in the art will understand that these routing rules support additional topologies beyond those described herein and further that the routing rules may be modified to support yet additional topologies.

Addressing Rules

Table 7 provides the rules for composing the routing tag's 729 address subfields for routing over one, two and three hops. The following exception to the table is made for two and three hop routing: if the destination node is on the same secondary ring as the source node, the 1FHA subfield 733 is set to the value 1Fh. The contents of the 2RA subfield 738 are irrelevant when the cell is generated at the source node because ring-to-ring couplers subsequently copy the contents of the 1RA subfield 739 to the 2RA subfield 738 and replace the contents of the 1RA subfield 739 with the node address of the ring-to-ring coupler.

Tables 7, 8, and 9 use the following terminology:

A destination node is the target's node number on the destination (secondary) ring.

A destination ring is the node number of the coupler to the destination secondary ring on the primary or peer ring which couples to it.

A destination peer ring is the node number (on the peer ring to which the source node's secondary ring is attached) of the coupler through which the destination secondary ring is accessed.

A NodeID is the node number of the node on the ring to which it is directly attached.

A node address comprises the node's position on the ring and the HostID (discussed hereinafter).

TABLE 7

Header Address Field Composition Rules

| Topology | 1FHA 733 | 2FHA 735 | 3FHA 737 | 1RA 739 |
|---|---|---|---|---|
| One Hop | Destination Node | — | — | NodeID |
| Two Hop | Destination Ring | Destination Node | — | NodeID |
| Three Hop | Destination Peer Ring | Destination Secondary Ring | Destination Node | NodeID |

Routing Decision Rules

A link interface determines, for each cell it receives, whether to forward the cell, and whether to capture the cell. The operation of the routing decision logic is summarized in Table 8 and 9 and is a function both of a node's position in a hierarchy of rings and of the ring topology.

TABLE 8

Configurations of the Routing Decision Logic

| Config | Description |
|---|---|
| 0 | Any node on simple ring or Primary to Secondary Ring Coupler or Peer to Secondary Ring Coupler |
| 1 | Secondary to Primary or Peer Ring Coupler |
| 2 | Peer to Peer Ring Coupler |
| 3 | Any non-coupler node on a secondary ring |

TABLE 9

Routing Decision Rule Summary

| Topology | Position | Config | Rule |
|---|---|---|---|
| Any | Any | x | Swallow on Resp Addr1 = NodeID. |
| Any | Any | x | Capture/couple if Bdcst Flag high. |
| Simple | Any | 0 | Swallow on 1FHA = NodeID. Capture & forward all Broadcast cells. Forward on 1FHA != NodeID |
| Primary/ Secondary | Coupler, secondary to primary ring | 1 | Couple on 1FHA != 1Fh Forward on 1FHA = 1Fh |
| | Coupler, primary to secondary ring | 0 | Couple on 1FHA = Ring address of the secondary ring. Forward on 1FHA != Ring address of the secondary |

TABLE 9-continued

Routing Decision Rule Summary

| Topology | Position | Config | Rule |
|---|---|---|---|
| | | | ring. |
| | Secondary ring node, not a coupler | 3 | Swallow on 1FHA = 1Fh & 2FHA = NodeID; otherwise forward. |
| Multiple Peer | Coupler, secondary ring to peer ring | 1 | Couple on 1FHA != 1Fh. Forward on 1FHA = 1Fh. |
| | Coupler, peer ring to secondary ring | 0 | Couple on 1FHA = Ring address of attached secondary ring; otherwise forward. |
| | Coupler, peer ring to peer ring | 2 | Couple on 1FHA = Ring address of attached peer ring; otherwise forward. |
| | Secondary ring node, not a coupler | 3 | Swallow on 1FHA = 1Fh & 2FHA = NodeID; otherwise forward. |

Swallowing Decision

A node swallows a cell if the node captures the cell without forwarding the cell. A node swallows cells that are addressed to the node. A source node also swallows cells transmitted by the source node that have circulated the ring and returned to the source node. The only node that swallows a broadcast cell is the source node that transmitted the broadcast cell onto the ring.

A node must swallow cells whose contents of the 1RA subfield 739 match the node's address. These cells have circulated the ring without being swallowed by another node. This situation occurs at the completion of a broadcast, as the result of an error or fault condition, or because the destination node was busy and unable to swallow the cell.

A node on a primary ring or a peer ring in a multiple ring topology (these topologies are discussed concerning FIGS. 8 and 9) also swallows cells whose contents of the 1FHA subfield 733 matches the node's address. Such nodes are ring-to-ring couplers and their node address represents the address of the coupled ring. A node on a secondary ring, other than a ring coupler node, swallows cells having contents in the 1FHA subfield 733 of 1Fh and having contents of the 2FHA subfield 735 that match the node's address. The preceding conditions indicate that the cell is addressed to the node.

A ring coupler node swallows a cell from one ring and transmits the cell onto the second ring. A ring coupler node on a secondary ring swallows cells whose 1FHA subfield 733 does not contain a value of 1Fh and transmits them onto the coupled ring. The header of the cell transmitted onto the second ring is modified as hereinafter described concerning FIGS. 8 and 9.

Finally, a cell with a damaged header is swallowed by the clock originator node.

Forwarding Decision

A node forwards cells that it does not swallow to the next node in line around the ring. These include broadcast cells having contents in the 1RA subfield 739 that do not match the node's address and non-broadcast cells neither transmitted by, nor addressed to, the node.

Capturing Decision

A node captures broadcast and swallowed cells. The captured cells are buffered in the node, processed, and in many cases an appropriate response cell is returned to the source node.

Single Ring Topology Routing

The single ring topology, typically used for a backplane bus replacement, has up to 32 nodes. The 1FHA 733 subfield of the routing tag field 729 of the cell header 701 contains the address of the destination node. The routing decision logic examines the contents of the 1FHA subfield 733 of each cell that enters a node's link interface. The routing decision logic forwards cells that do not contain the node's address in the 1FHA subfield 733 and swallows those cells that do. (The node both captures and forwards cells whose broadcast flag subfield 731 is asserted independent of the contents of the 1FHA subfield 733.) When constructing a response cell, the contents of the 1RA subfield 739 field of the corresponding initiation cell is copied to the response cell's 1FHA subfield 733. The 2FHA subfield 735, 3FHA subfield 737, and 2RA subfield 738 are unused in this topology. Another preferred embodiment combines the 1FHA 733 with the 2FHA 735 subfield, and the 1RA subfield 739 with the 2RA subfield 738 to increase the maximum number of nodes on the ring.

Primary-Secondary Ring Topology Routing

The following description explains, by example, how cells hop across rings.

Figure 8:
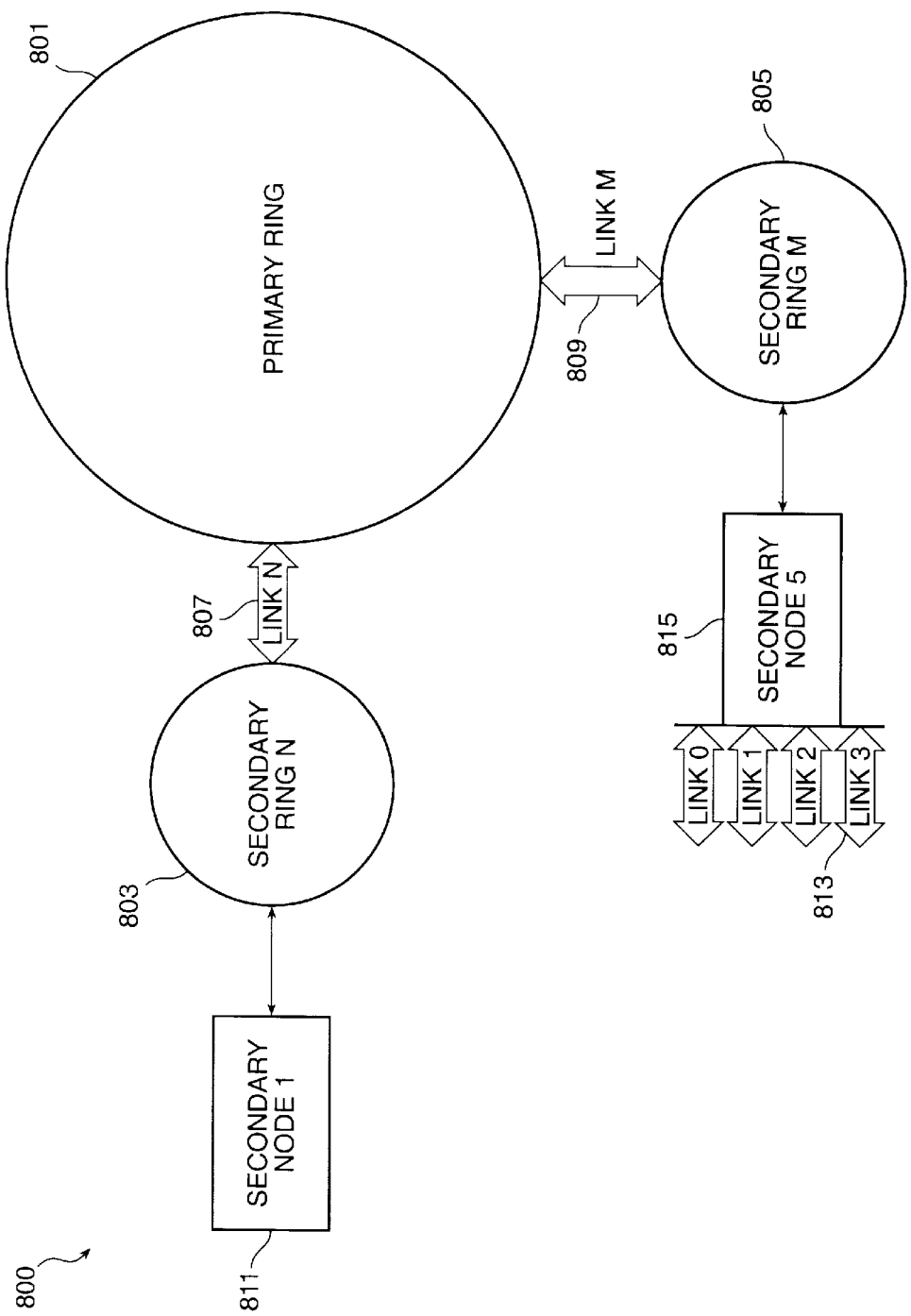
FIG. 8 illustrates a primary-secondary ring topology in accordance with a preferred embodiment of the invention.

FIG. 8 illustrates a primary secondary ring topology as indicated by a general reference character 800. A primary ring 801 can have a secondary ring such as one of a plurality of secondary rings 803, 805. The secondary ring 803, is attached to the primary ring 801 by a ring-to-ring coupler 807. Similarly, the secondary ring 805 is attached to the primary ring 801 by a ring-to-ring coupler 809. In a primary/secondary ring topology, there are up to 31 secondary rings that are accessed through ring-to-ring coupler nodes on the primary ring. The routing tag field 729 for this topology, uses the 1FHA subfield 733 to contain the address of the secondary ring containing the destination node unless the destination node is on the same secondary ring as the source node. If the destination node and the source node are on the same secondary ring, the 1FHA subfield 733 contains an address of 1Fh. In both cases, the 2FHA subfield 735 contains the address of the destination node on the secondary ring. The secondary ring address is the address of the ling-to-ling coupler node on the primary ring.

The secondary ring side of a ring-to-ring coupler node examines the contents of the 1FHA subfield 733 of each cell it receives. The coupler node forwards the cell to the next node on the secondary ring 803, 805 if the contents of the 1FHA subfield 733 is 1Fh. Otherwise, the coupler swallows the cell from the secondary ring 803, 805, and transmits the is cell onto the primary ring 801. The coupler node makes certain modifications to the cell's header when coupling cells from one ring to another. These modifications are hereinafter discussed.

The primary ring side of the ring-to-ring coupler compares its node address (the address of the coupled secondary ring) to the contents of the 1FHA subfield 733 of cells the node receives from the primary ring 801. If the addresses match, the coupler swallows the cell from the primary ring and transmits it onto the secondary ring 803, 805. If the address differs, the coupler node forwards the cell to the next node on the primary ring 801.

To decide whether or not to capture/swallow a cell, a non-coupler node on a secondary ring examines the contents of both the 1FHA subfield 733 and the 2FHA subfield 735. The node captures the cell if the cell's broadcast subfield 731 is asserted or if the contents of the 1FHA subfield 733 contains an address of 1Fh and the contents of the 2FHA subfield 735 match the node's address.

The routing tag 729 shown in Table 10 is used to transmit an ATM cell from a source node 811 (with address "1") on one secondary ring 803 (with address "N") to a specified link 813 (with address "3") attached to a destination node 815 (with address "5") on another secondary ring 805 with address "M".

TABLE 10

Header Routing Tag for Primary/Secondary Ring Example

| Bit | [31] | [30] | [29:25] | [24:20] | [19:15] | [14:10] | [9:8] |
|---|---|---|---|---|---|---|---|
| Field | Bdcst Flag 731 | PTY 732 | 1RA 739 | 1FHA 733 | 2FHA 735 | 3FHA 737 | Destination Link Select 741 |
| Contents | 0 | 0 | "1" | "M" | "5" | — | "3" |

The destination's secondary ling address is encoded in the 1FHA subfield 733 and the destination node address is encoded in the 2FHA subfield 735. The destination link address is encoded in the destination link select subfield 741. Since there is no third forward hop, the contents of the 3FHA subfield 737 is irrelevant. The 1RA subfield is initialized to the source node's 811 address.

The source node 811 transmits a cell onto the secondary ring 803. The cell's 1FHA subfield 733 contains an "M" and the cell's 2FHA subfield 735 contains a "5". The coupler node 807 checks the cell's header when the secondary-ring side of the ring-to-ring coupler node 807 receives the cell. The node 807 swallows the cell from the secondary ring 803 because the cell's 1FHA subfield 733 contains "M", not 1Fh. Then, the coupler node 807 replaces the contents of the 1RA subfield 739 with the coupler node's 807 ring address. Next the node 807 updates the HEC field 703 and transmits the cell onto the primary ring 801. (If this cell had been a bus transaction cell, the coupler node copies the contents of the 1RA subfield 739 to the 2RA subfield 738.) Because the cell is an ATM cell, the coupler node 807 constructs a response cell addressed to the source node 811 by using the contents of the 1RA subfield 739, and transmits the response cell onto the secondary ring 803. Once the source node 811 receives the response cell, it performs any required bookkeeping (such as updating the ITC hereinafter described concerning FIGS. 20, 21, and 22).

For an ATM cell the coupler node returns a response cell back to the node that transmitted the cell onto the ring from which the coupler node removed the cell. The coupler node does not make such a response to bus transaction cells. Only the final destination node responds to a bus transaction initiation cell. This response is routed back to the original source node of the responded-to-cell. The original source node does not respond to these bus transaction response cells. This is hereinafter discussed further in the *Structure of Cells Containing Bus Transaction Sub-actions section.*

The cell traverses the primary ring 801 to the ring coupler node 809 with an address of M. The ring coupler node 809 detects a match of its node address (equal to M in this example, the target secondary ring number) with the contents of the 1FHA subfield 733 of the cell and swallows the cell. Because the cell is an ATM cell, the coupler node 809 constructs a response cell addressed to the coupler node 807 using the address contained in the 1RA subfield 739 set by the coupler node 807 and transmits the response cell onto the primary ring 801. The coupler node 807 receives the response cell and performs any bookkeeping required by the coupler node 807. The coupler node 809 changes the contents of the 1FHA subfield 733 to 1Fh, sets the 1RA subfield 739 to the coupler node's 809 address ("M"), and updates the HEC field 703. Then, the node coupler 809 transmits the modified cell onto the secondary ring ("M") 805.

The cell now traverses the secondary ring 805 to the destination node 815. The link interface at the destination node 815 determines that the 1FHA subfield 733 contains an address of 1Fh and that the 2FHA subfield 735 matches the address of the destination node 815 ("5"). Therefore the destination node 815 swallows the cell. The destination node 815 now appropriately passes the information in the cell payload out the node's 815 external link 813 as selected by the contents of the destination link select subfield 741. Because the cell is an ATM cell, the destination node 815 constructs a response cell addressed to the coupler node 809 using the contents of the 1RA subfield and transmits the response cell onto the secondary ring 805.

Bus transaction cells hop from ring to ring in a similar fashion. However, the coupler nodes 807, 809 do not generate response cells. Instead, after receipt of an initiation cell, the final destination node 815 transmits a response cell back to the source node 811. Every node that couples a bus transaction cell from one ring to another places the contents of the 1RA subfield into the 2RA subfield. The coupler node also places its address in the 1RA subfield. Therefore, when the bus transaction cell arrives at its destination node (the node 815 of the ring 805 "M"), the 1RA subfield 739 field contains "M" (the node address of the last traversed ring-to-ring coupler) and the 2RA subfield 738 contains "N" (the node address of the first traversed ring-to-ring coupler 807). The address of the source node 811 that was initially placed in the 1RA subfield 739 has been overwritten during the second ring-to-ring coupling. However, the address of the source node was also stored in the SrcID subfield 706.

To route a response cell back to the original source node 811, the contents of the 2RA subfield 738 is stored into the 1FHA subfield 733 of the response cell and the contents of the 2FHA subfield 735 is generated from the SrcID subfield 706 of transfer attributes field 704.

Multiple Peer Ring Topology Routing

Figure 9:
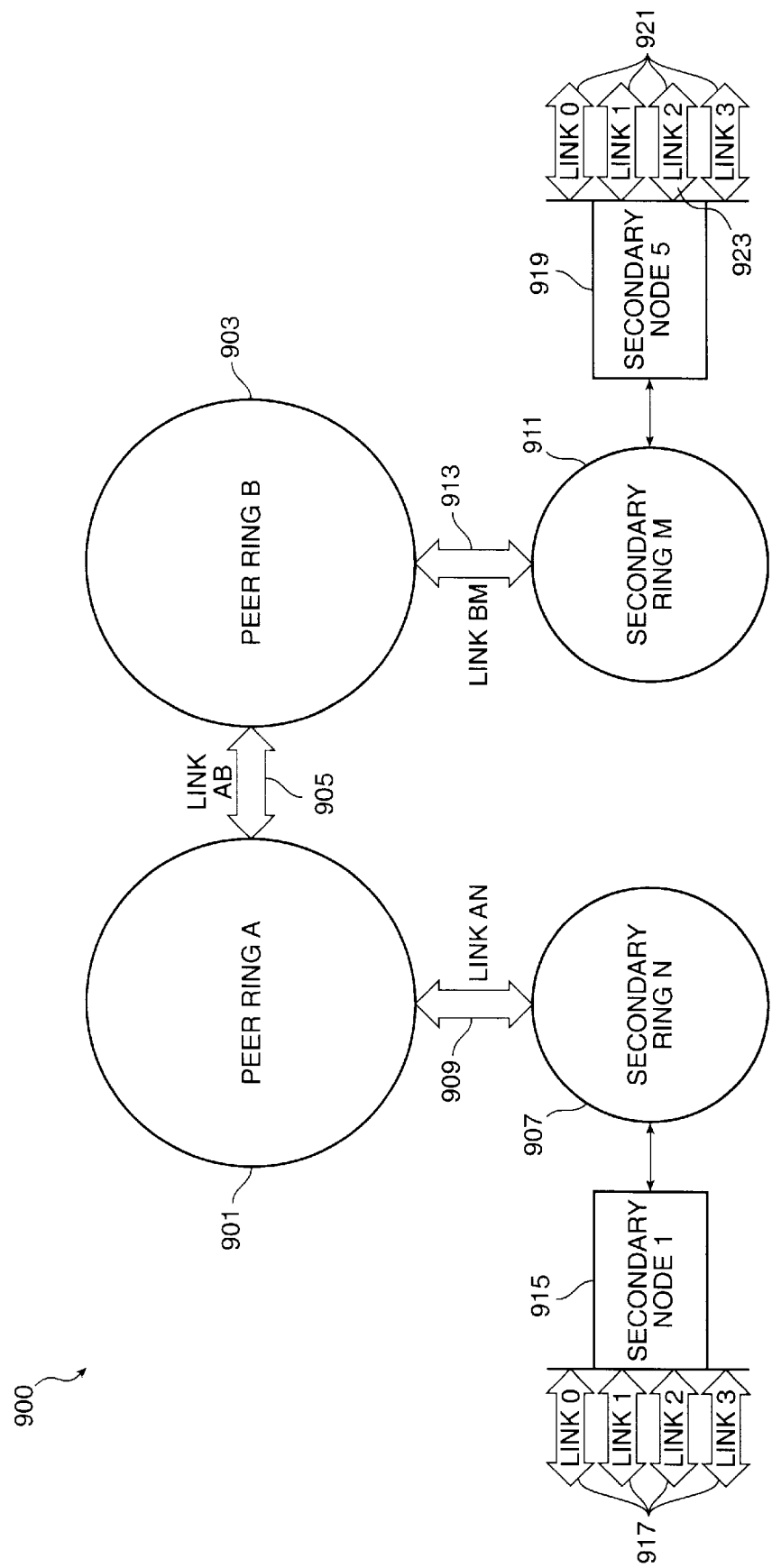
FIG. 9 illustrates a multiple peer ring topology nodes in accordance with a preferred embodiment of the invention.

FIG. 9 illustrates a multiple peer ring configuration indicated by a general reference character 900. (This is a simplified figure, in actual use there would be more than two peer rings.) A first peer ring 901 (having an address of "A") is connected to a second peer ring 903 (having an address of "B") through a first ring-to-ring coupler 905. The first peer ring 901 is connected to a first secondary ring 907 (having an address of "N") by a second ring-to-ring coupler 909. Similarly, the second peer ring 903 is connected to a second secondary ring 911 (having an address of "M") by a third ling-to-ring coupler 913.

The first secondary ring 907 includes a first secondary node 915 having a first plurality of links 917 (having addresses 0–3). The second secondary ring 911 includes a second secondary node 919 having a second plurality of links 921 (also having addresses 0–3) one of which is identified as a link 2 923.

Cells traverse three ring-to-ring couplers in this topology resulting in the need for the 3FHA subfield 737. The routing tag field 729 for this topology uses the 1FHA subfield 733 to contain the address of the destination peer ring 903, the 2FHA subfield 735 to contain the address of the destination secondary ring 911, and the 3FHA subfield 737 to contain the address of the destination node 919 on the destination's secondary ring 911. If the destination node 919 is on the same secondary ring as the source node, the 1FHA subfield 733 contains the value of 1Fh and the 2FHA subfield 735 contains the node address of the destination node 919 on the secondary ring 911. By definition, the secondary ring address is defined as the node address of its ring-to-ring coupler on the peer ring.

The secondary side of each ring-to-ring coupler node 909, 913 checks each cell's 1FHA subfield 733. If the subfield 733 does not contain 1Fh, the coupler node 909, 913 swallows the cell from the secondary ring 907, 911 and transmits it onto the peer ring 901, 903. If the 1FHA subfield 733 does contain 1Fh, the coupler node 909, 913 forwards the cell to the next node on the secondary ring 907, 911. Secondary to peer ring couplers 909, 913 do not couple cells containing the value 1Fh in the 1FHA subfield 733. Thus, a cell containing 1Fh or the address of the secondary ring that the cell is traversing will not be coupled to the primary ring 901, 903.

The peer ring side of each ring-to-ring coupler 909, 913 compares its node address (which is equal to the address of the coupled secondary ring) to the contents of the cell's 1FHA subfield 733. If the addresses match, the coupler swallows the cell from the primary ring and transmits the cell onto the secondary ring. If the addresses differ, the coupler forwards the cell to the next node on the peer ring.

Each non-coupler node on a secondary ring, examines the contents of both the 1FHA subfield 733 and the 2FHA subfield 735 to determine whether or not to capture/swallow a cell. The node captures the cell if its broadcast field 731 is asserted or if the contents of the 1FHA subfield is equal to 1Fh and the contents of the 2FHA subfield 735 matches the node's address.

The routing tag field shown in Table 11 is used to route a cell from the source node 915 (having an address of "1") on the secondary ring "N" 907 to the link 923 (having address of "2") of the destination node 919 (having an address of "5") on the secondary ring 911 (having an address of "M") attached to peer ling "B" 903.

TABLE 11

Header Routing Tag for Multiple Peer Ring Example

| Bit | [31] | [30] | [29:25] | [24:20] | [19:15] | [14:10] | [9:8] |
|---|---|---|---|---|---|---|---|
| Use | Bdcst Flag 731 | PTY 732 | 1RA 739 | 1FHA 733 | 2FHA 735 | 3FHA 737 | Destination Link Select 741 |
| Contents | 0 | 0 | "1" | "B" | "M" | "5" | "2" |

The 1FHA subfield 733 contains the address ("B") of the peer ring 903 closest to the ultimate destination 919. The 2FHA subfield 735 contains the address of the secondary ring 911 on the peer ring 903. The 3FHA subfield 737 contains the address ("5") of the destination node 919, and the destination link select subfield 741 contains the address ("2") of the link 923.

The initiation cell is transmitted from the source node 915 onto the secondary ling 907 and traverses the secondary ring 907 towards the coupler node 909 through some number of intermediate non-coupler nodes (not shown). The non-coupler secondary ring nodes forward the cell because the contents of the 1FHA subfield 733 is not equal to 1Fh. Since the 1FHA subfield 733 contains "B", these nodes do not swallow the cell. The cell is coupled from the secondary ring 907 to the peer ring 901 through the ring-to-ring coupler node 909 because the contents of the cell's 1FHA subfield 733 is "B" and not 1Fh.

The coupler node 909 transmits a response cell back to the source node 915. The coupler node 909 replaces the contents of the 1RA subfield 739 in the coupled initiation cell with the coupler's address ("N") and updates the HEC field 703 of the coupled cell. Then the coupled cell is transmitted onto the peer ring 901.

The cell traverses the peer ring 901 to the ring-to-ring coupler node 905. Here, the ring-to-ring coupler node 905 matches the contents in the cell's 1FHA subfield 733 ("B") with the address of the ring 903 coupled by the node 905 and swallows the cell. The coupler node 905 transmits a response cell to the coupler node 909 as directed by the contents of the 1RA subfield 739. The coupler 905 also places its address ("B") into the coupled cell's 1RA subfield 739. A hop update mechanism in the coupler 905 also replaces the contents of the 1FHA subfield 733 with the contents of the 2FHA subfield 735, followed by replacing the contents of the 2FHA subfield 735 with the contents of the 3FHA subfield 737. Finally, the coupler 905 generates a new header error check value, stores it in the HEC field 703 of the coupled cell and transmits the coupled cell onto the peer ring 903.

The cell then traverses the peer ring 903 to the ring-to-ring coupler node 913. The ring-to-ring coupler node 913 detects a match between the contents of the 1FHA subfield 733 (an "M") with the coupler node's 913 address and swallows the cell. The coupler node 913 transmits a response cell to the coupler cell 905 as directed by the contents of the 1RA subfield 739 of the swallowed cell. The coupler 913 also places its address ("M") into the coupled cell's 1RA subfield 739. The coupler 913 also replaces the contents of the 1FHA subfield 733 with 1Fh and generates a new HEC field 703, and transmits the cell onto the secondary ring 911.

The cell traverses the secondary ring 911 to the destination node 919. The destination node 919 determines that the contents of the 1FHA subfield 733 is "1Fh" indicating that the cell's destination is on this ring and matches the contents of the 2FHA subfield 735 ("5") to its node address. The destination node 919 therefore swallows the cell and queues it for output on its external link (having and address of "2") according to the contents of the destination link select subfield 741. The destination node 919 also transmits a response cell back to the node 913.

Summary of Header Modifications In Ring-to-Ring Couplers

Whenever a ring-to-ring coupler node couples a bus transaction initiation cell onto a ring, it copies the contents of the 1RA subfield 739 into the 2RA subfield 738 and places its own node address in the 1RA subfield 739. If any (bus transaction or ATM) cell fails to be coupled to the secondary ring of its destination due to a busy condition at the primary (peer) to secondary ring-to-ring coupler node, the cell returns to the ring-to-ring coupler node that transmitted the cell. This coupler node removes the cell from the primary (peer) ring.

If the cell is an ATM cell, the ring-to-ring coupler node retransmits the cell until the transaction succeeds or a system fault is declared. If the cell is a bus transaction initiation cell, the ring-to-ring coupler may retransmit the cell onto the primary (peer) ring or return the cell to the cell's source node. To return the cell to its source node, the ring-to-ring coupler copies the 2RA subfield 738 back into the 1RA subfield 739, updates the HEC field 703, and transmits the cell onto the secondary ring.

The cell returns to the ring-to-ring coupler node if the cell is not swallowed by its destination node on the destination's secondary ring. The ring-to-ring coupler node recognizes that it was the cell's source (on this ring) by detecting its own node address in the 1RA subfield 739. The coupler node may then return the cell to the original source by retransmitting the cell onto the primary (peer) ring, or retry transmitting the cell onto the secondary ring, or retry transmitting the cell onto the secondary ring a limited number of times and if still unsuccessful, retransmitting the cell onto the primary (peer) ring addressed to the cell's source node. If the coupler node retransmits the cell onto the primary (peer) ring for return to the cell's source node, the coupler first copies the contents of the 2RA subfield 738 field to 1RA subfield 739 and copies the SrcID subfield 706 from the cell to the 2RA subfield 738.

Whenever an ATM cell is coupled between two peer rings in a multiple peer ring topology, the contents of the 2FHA subfield 735 is rotated into the 1FHA subfield 733 and the contents of the 3FHA subfield 737 is rotated into the 2FHA subfield 735. This moves the target secondary ring address into the 1FHA subfield 733 and the target node address into the 2FHA subfield 735 as required for coupling onto the destination node's secondary ring. A primary (peer) to secondary ring coupler sets the cell's 1FHA subfield 733 to 1Fh when transmitting a cell onto the coupler's destination secondary ring.

Whenever the cell's header is modified as described above, the HEC field 703 is recalculated. One skilled in the art will understand that additional hops of addressing can be supported by lengthening the header to provide additional forward hop and response addresses fields and modifying the ring to ring couplers to rotate these fields into the existing fields in an appropriate fashion.

Transmitting Decision

Each link interface within a node includes a fairness counter 335 (shown in FIG. 3) that determines whether the link interface is permitted to transmit a cell onto a path. The fairness counter 335 increments whenever the link interface's output is idle at a data clock, unless the fairness counter 335 has reached its upper limit. The fairness counter 335 decrements on each data clock, down to a lower limit, while the link interface is emitting data from a locally originated cell. A link interface can transmit a locally originated cell onto a ring if the link interface's bypass FIFO is empty, its fairness counter is above a threshold, and the link interface is at a cell boundary.

The effect of the fairness counter 335 is to apportion path bandwidth between forwarded cells and locally originated cells. The fairness counter 335 also assures the presence of some minimum number of idle states at the link interface's output. These idle states allow the bypass FIFOs in downstream nodes to empty. The threshold defaults to a value that allows locally originated cells to be transmitted at half the link interface's bandwidth when the link interface is idle, and at one third of the link interface's bandwidth when the link is relatively busy. However, the fairness counter 335 may also be disabled to free a node of this bandwidth utilization constraint. Furthermore, the node's bandwidth can by restricted by setting the threshold to a relatively high value.

Broadcast Protocol

The ring topology supports broadcast and multicast using the broadcast flag subfield 731 in the routing tag. Broadcast flow control rules are imposed to eliminate queue overflow. Therefore, nodes that receive the broadcast cell transmit a response cell to the broadcast cell's source node. The source node counts response cells and thus ensures that each node receives the broadcast. The broadcast transaction is not considered complete until a positive acknowledgment response cell has been received from all nodes. The source node removes the broadcast cell from the ring when the broadcast cell returns to the source node.

Ring Hierarchy Related To System Packaging

The three levels of ring hierarchy correspond directly to system packaging practices. The simple ring topology corresponds to a simple single backplane based system. A more complex system may have one dual path ring network comprising the system backplane coupled to additional dual path rings on each plug-in module or it may have multiple ring backplanes coupled by a higher order ring. These are primary-secondary ring topologies. A larger system may need to interconnect several such systems or racks. The multiple peer ring topology fills this need. The convenient mapping of the network topology onto standard packaging technology results in packaging economies. In particular, the ring backplanes are less expensive than high performance bus backplanes because they use fewer signals running shorter distances on fewer levels.

Cell Processing Within the Node

Figure 10:
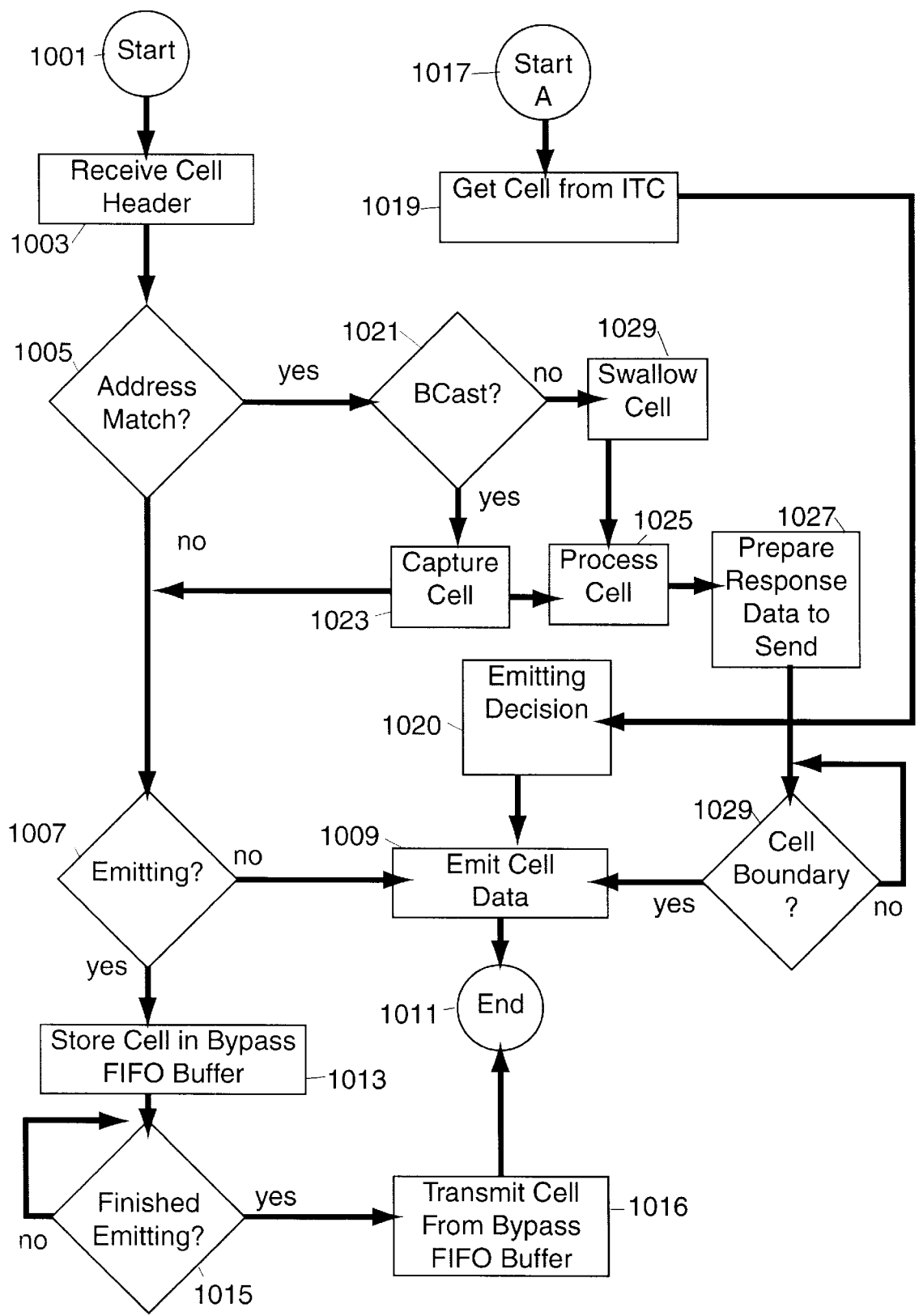
FIG. 10 illustrates the process used by the link interface to receive and transmit a cell over the ring in accordance with a preferred embodiment of the invention.

FIG. 10 illustrates the processes used by the link interface to receive and transmit a cell. Although these processes are described using a flow chart, the disclosed processes need not be a sequential series of steps. As one skilled in the art will understand, these steps are executed concurrently by dedicated logic in order to maximize performance whenever possible and practical. This comment also applies to the other disclosed flow charts.

The process initiates at a "Start" terminal 1001 and continues to a "Receive Cell Header" step 1003. This 1003 step examines the header portion of an incoming cell as the incoming cell is received by the node's link interface. The process then continues to an "Address match" decision step 1005 that determines whether the incoming cell being received is a broadcast cell, or whether either the response address or the destination address is the same as the node address. If none of these conditions exists, the incoming cell is to be forwarded and the process continues to an "Emitting" decision step 1007 to determine whether the link interface is currently in the process of transmitting (that is, emitting bits from) an outgoing cell. If the "Emitting" decision step 1007 determines that the node's link interface is not emitting an outgoing cell, the process continues to an "Emit Cell Data" 1009 step that emits the data of the incoming cell onto the outgoing end 309 of the output path 311. The process completes through an "End" terminal 1011.

However, if the "Emitting" decision step 1007 determines that the node's link interface is in the process of emitting cell data while receiving the incoming cell (including both the cases of emitting a cell from the bypass buffer as well as emitting a locally generated cell), the process continues to a "Store Cell in Bypass FIFO Buffer" step 1013. This step 1013 receives and stores the incoming cell in the bypass FIFO buffer until the outgoing cell is completely transmitted. Once the incoming cell is stored in the bypass buffer, the process continues to a "Finished Emitting" decision step 1015. The "Finished Emitting" decision step 1015 repeats if the outgoing cell has not been completely emitted. However, if the outgoing cell has been completely emitted onto the ring, the process continues to a "Transmit Cell From Bypass FIFO Buffer" step 1016 that starts emission of the received, and stored, cell. After the cell is transmitted, the process completes through the "End" terminal 1011. One skilled in the art will understand that another cell may be received while transmitting this cell from the bypass FIFO buffer.

The process can also initiate at a "Stawt A" terminal 1017. The process is entered via this terminal 1017 when there is a ready-to-send initiation (or response) cell stored in the ITC. The process continues to a "Get Cell From ITC" step 1019. The process continues to an "Emitting Decision" step 1020 that determines whether the stored initiation cell can be transmitted to the destination or whether the cell should be delayed. The stored initiation cell can be transmitted when the bypass FIFO buffer 165, 167 is empty and the fairness counter 335 is greater than the threshold and the link is at a cell boundary. Once the cell is to be transmitted, the process continues to the "Emit Cell Data" step 1009 that transmits the new cell on the outgoing end 309 of the output path 311. The process completes through the "End" terminal 1011.

Looking again at the decision step 1005 that determines whether the incoming cell being received is a broadcast cell or whether the destination address is the same as the node address. If the incoming cell is a broadcast cell or if the destination address is the same as the node address, the incoming cell must be captured or swallowed and the process continues to a "BCAST" decision step 1021. This "BCAST" decision step 1021 examines the incoming cell's header 701 and determines whether the incoming cell is a broadcast cell. If the incoming cell is a broadcast cell, the incoming cell is captured at a capture cell step 1023. The incoming cell is both forwarded, as described above, and also processed by a "Process Cell" step 1025. The "Process Cell" step 1025 processes the cell. This includes, without limitation, completing transactions, shipping data over a PCI bus, or changing states in the node responsive to the cell (such as a result of a response cell). After the incoming initiation cell is processed, a "Prepare Response Data to Send" step 1027 prepares a response cell directed to the appropriate source node. Nodes do not respond to response cells. The process continues to a "Cell Boundary" decision step 1029 that waits for the cell boundary, and then the process continues to the "Emit Cell Data" step 1004) where the response cell is transmitted onto the ring. The process completes at the "End" Terminal 1011.

Address Mapping Content Addressable Memory

The AMCAM 145 translates a PCI address into the routing information required to transport a bus transaction cell to a particular node. The size of the AMCAM 145 is implementation dependent and determines both the maximum number of nodes that can be supported as well as the granularity of mapping of local bus addresses to nodes on the interconnect. The AMCAM 145 of a bus interface node operates in a fashion similar to the header translation table of an ATM interface.

A PCI interface node includes configuration space registers (CSRs) defined in accordance with the PCI to PCI Bridge CSR Header format defined in the *PCI to PCI Bridge Architecture Specification*. Accordingly, each PCI interface node includes a set of base address and limit registers in each of three address spaces (non-prefetchable memory, I/O, and prefetchable memory). These address spaces define the address windows within which devices on the local PCI bus of the PCI interface node respond. In the ring interconnect topology, the PCI interface node acts as a secondary bridge for devices connected to its local PCI and so it contains these registers. In addition, copies of these registers are located in the PCI interface node located at the configuring host and at every other PCI interface node that engages in peer to peer communications. The AMCAM 145 is comprised of the set of copies of each node's base address and limit registers and associated address comparators.

The AMCAM 145 provides a mapping between local bus addresses and destination nodes on the interconnect. Given the PCI address the AMCAM 145 automatically generates the network address. The address of each transaction initiation on the attached PCI bus segment is associated into the AMCAM 145. When a match is found (that is, when the address is greater than or equal to the base address and less than or equal to the limit address of an entry), that entry's number is used to determine a value that is the destination address stored in the 1FHA and 2FHA subfields 733, 735, in a cell's a routing tag 729.

In a preferred embodiment, the entry number plus the five least significant bits of the contents of the secondary bus number register of the configuring host node (known at all nodes) is stored in the 1FHA subfield 733 and the three most significant bits of the secondary bus number register plus two leading zeros are stored in the 2FHA subfield 735. Consequently, these least significant eight bits of the contents of the combined 2FHA, 1FHA subfields 733, 735 of the routing tag 729 are equal to the subordinate bus number of the PCI bus segment accessible at the node. This allows standard configuration space accesses to be directed to the same node by using address bus subfields defined in the PCI—PCI bridge architecture as a value in the routing tag, instead of AMCAM 145 outputs, during configuration space accesses.

A preferred embodiment also includes a configuration option to use a eight bit contiguous subfield of the PCI address bus as a value for the routing tag 729 instead of the AMCAM 145 output during non-configuration space accesses. The AMCAM 145 provides both the first and second forward hop addresses. Bus interface nodes such as the PCI interface nodes are used on simple rings; on primary or secondary rings in a primary-secondary ring topology; on peer rings of a multiple peer ring topology (but not on the secondary rings of the multiple peer ring topology). Thus, in a preferred embodiment, only two forward hop addresses are required.

An example AMCAM use is provided in the discussion of a PCI interface node hereinafter. One skilled in the art will understand how to apply the principles discussed to other types of nodes.

Figure 11:
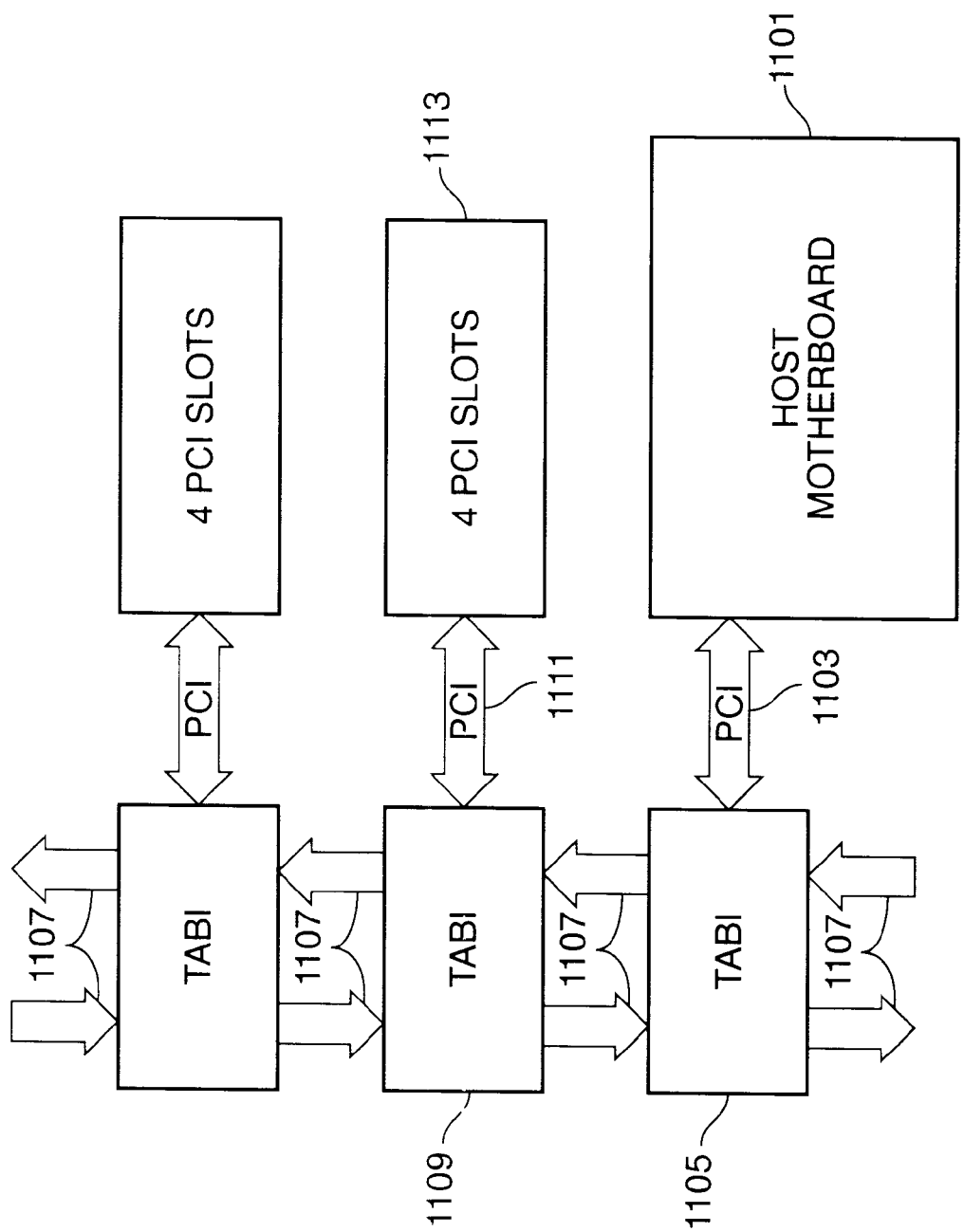
FIG. 11 illustrates one way the interconnect can be used as a backplane replacement in accordance with a preferred embodiment of the invention.

FIG. 11 illustrates the use of the interconnect. A host computer 1101 is connected to a PCI bus 1103, that is further connected to a PCI interface node 1105. PCI interface nodes on the interconnect are called TABIs. The TABI 1105 is connected to a dual path counter rotating ring 1107. As the host computer 1101 performs PCI operations, the TABI 1105 transmits cells across the ring 1107 to a second TABI 1109 that is connected to an independent PCI bus 1111 that is connected to four PCI slots 1113 that can be used to attach PCI bus devices.

Structure of Cells Containing Bus Transaction Subactions

One embodiment of the invention sends cells from one ring network of the interconnect over an ATM network to another ring network of the interconnect. This embodiment limits the size of the cell to 52 bytes (a multiple of 32 bits). This size limitation allows the cell to be encapsulated within a 53 byte external ATM cell. Thus, bus transaction cells may contain up to forty bytes of payload data (allowing for eight bytes of header and attributes, and two bytes for a CRC and two reserved bytes). Cells that pass through an ATM network are padded to 53 bytes at a ring-to-ATM interface node. The pad is removed when a cell arrives at the corresponding ring-to-ATM interface node connecting the destination ring to the ATM network. The pad is removed dependent on the data length field of the attributes word. Fifty-three (53) byte ATM cells can be transported through the interconnect once the ATM header is translated and the cell padded to 56 bytes.

Another embodiment of the invention supports cell sizes allowing up to 64 bytes of payload data. However, this embodiment does not support sending cells across an ATM network. If less than a full payload of data is transmitted, the cell is shortened. This is facilitated by the use of the cell flag signal in parallel with the data signal to delineate the start and end of each cell.

A sixteen bit CRC follows the last data and protects both the address and the data words but not the header (protected by the HEC field 703).

The following tables disclose the structure of bus transaction cells generated in response to bus transaction subactions. Each table entry represents a 32 bit field.

TABLE 12

Read Initiate Cell Format

Read-Initiate Cell

HEADER 701
HEC | INITIATION_ATTRIBUTES 704
ADDRESS
CRC

TABLE 13

Interrupt Request Cell Format

Interrupt Transition Cell

HEADER 701
HEC | Interrupt Attributes 704

TABLE 14

Read Response Cell Format

Read Response Cell

HEADER 701
HEC | RESPONSE_ATTRIBUTES 704
DATA1
DATA2
. . .
DATAn 0 <= n <= 10
CRC (if n > 0)

TABLE 15

Write Initiate Cell Format

Write-Initiate Cell

HEADER 701
HEC | INITIATION_ATTRIBUTES 704
ADDRESS
DATA1
DATA2

TABLE 15-continued

Write Initiate Cell Format

Write-Initiate Cell

. . .
DATAn 1 <= n <= 9
CRC (on ADDRESS and DATA)

TABLE 16

Write Response Cell Format

Write-Response Cell

HEADER 701
HEC | RESPONSE_ATTRIBUTES 704

Initiation and Response Attributes

The following table defines subfields in the attribute field 704 of a bus transaction cell. Separate definitions apply to the attributes words of bus transaction initiation cells and response cells. Parity is generated and detected on individual fields of the attribute words to provide error checking without the use of a CRC word. One skilled in the art will understand that ATM cells only have routing and header checksum structure.

The address extension subfield is twelve bits wide and holds A[43:32] of the system's physical address. If a smaller physical address is in use, this field is filled with the appropriate number of leading zeros. In primary/secondary ring topologies, Address Extension [11:7] is used as the SrcID subfield 706.

A five bit data length subfield defines the number of bytes of data that follow in the cell's payload or are requested in the response. If the MSB of this field is a zero, the data length is one word and the four remaining bits of the data length subfield are byte strobes. The byte enable encoding of DL[3 . . . 0] is identical to PCI's encoding of C/BE[3 . . . 0]#. The data length subfield is redundant with the cell flag signal that delineates cells. However, the data length subfield allows the invention's cells to be carried over standard ATM links and reconstituted at the far end by using the data length subfield to discard padding bytes. If the MSB of the data length subfield is a one, then DL[3:0] contains the number of quadlets (32 bit words) in the cell. DL=5'b11111 implies that the cell contains a cache line and that the corresponding PCI transaction should use the Read Line or Write & Invalidate commands as appropriate to its direction.

TABLE 17

Data Length Field Definition

| Data Length | Data Transferred | Data Length | # Bytes |
|---|---|---|---|
| 00001 | D[31:8] | 10001 | 4 |
| 00010 | D[31:16], D[7:0] | 10010 | 8 |
| 00011 | D[31:16] | 10011 | 12 |
| 00100 | D[31:24], D[15:0] | 10100 | 16 |
| 00101 | D[31:24], D[15:8] | 10101 | 20 |
| 00110 | D[31:24], D[7:0] | 10110 | 24 |
| 00111 | D[31:24] | 10111 | 28 |
| 01000 | D[23:0] | 11000 | 32 |
| 01001 | D[23:8] | 11001 | 36 |
| 01010 | D[23:16], D[7:0] | 11010 | 40 |
| 01011 | D[23:16] | 11011 | 44 |

TABLE 17-continued

Data Length Field Definition

| Data Length | Data Transferred | Data Length | # Bytes |
|---|---|---|---|
| 01100 | D[15:0] | 11100 | 48 |
| 01101 | D[15:8] | 11101 | 52 |
| 01110 | D[7:0] | 11110 | 56 |
| 01111 | none | 11111 | 60 |
| 00000 | D[31:0] | 10000 | 64 |

The SEQ# subfield associates response cells with the ITC entry that contains the initiation cell that is associated with the response cell. The operation of the ITC 149 is hereinafter described concerning FIG. 20. The SEQ# subfield of an initiation cell contains the value of an initiation cell counter that increments after each initiation cell is generated. Response cells return the SEQ# of the corresponding initiation cell in order for the response to be directed to the appropriate ITC entry.

A 12 bit subfield is reserved for response codes and associated messages. Table 21 gives the response codes as implemented in a preferred embodiment.

Initiation cell errors (other than header errors) are detected by means of the CRC or parity checks in the attributes word are reported with a response code of 1. Response code 2 (rejected due to lock) invokes a retry after a delay to allow the competing locked operation to lo complete. Response codes 3–5 result in the same error response being given at the source node that was given at the destination node unless the transaction was a posted write. In most cases a configuration option allows either a SERR# assertion or an error interrupt.

TABLE 18

Initiation Cell Attribute Definition

Initiation Cell Attributes

| Field | Width | Location |
|---|---|---|
| HEC | 8 | [31...24] |
| Data Length | 5 | [23...19] |
| Data Length Parity | 1 | [18] |
| SEQ# | 4 | [17...14] |
| SEQ# parity | 1 | [13] |
| Address Extension Parity | 1 | [12] |
| Address Extension | 12 | [11:0] |

TABLE 19

Response Cell Atrribute Definition

Response Cell Attributes

| Field | Width | Location |
|---|---|---|
| HEC | 8 | [31...24] |
| Data Length | 5 | [23...19] |
| Data Length Parity | 1 | [18] |
| SEQ# | 4 | [17...14] |
| SEQ# parity | 1 | [13] |
| Response Code Parity | 2 | [12] |
| Response Code | 10 | [11...0] |

TABLE 20

Interrupt Cell Atrribute Definition

Interrupt Attributes

| Field | Width | Location |
|---|---|---|
| HEC | 8 | [31...24] |
| Interrupt Message | 5 | [23...19] |
| Interrupt Message Parity | 1 | [18] |
| SEQ# | 4 | [17...14] |
| SEQ# parity | 1 | [13] |
| Security Code Parity | 1 | [12] |
| Interrupt Security Code [11:0] | 12 | [11...0] |

TABLE 21

Response Cell Code Definition

Response Cell Codes

| Code | Interpretation | Action |
|---|---|---|
| 000 | Positive acknowledgment | Transaction completes |
| 001 | Rejected due to initiation cell error | Retry up to retry limit |
| 010 | Rejected due to competing lock | Retry no limit |
| 011 | Rejected due to Target Abort | Same response at initiator |
| 100 | Rejected due to Target Parity Error | Same response at initiator |
| 101 | Rejected due to Target SERR# assertion | Same response at initiator |
| 110 | Mismatched interrupt security code | Generate error interrupt |
| 111+ | Reserved | |

Header Error Check

The HEC field 703 contains the result of a CRC check on the 32 bit header. The HEC is defined as the remainder of the division (modulo 2) of the header by the generator ploynomial: $X^8 + X^{2+X} + 1$. The Clock Originator node checks the HEC field of each cell moving through its link interface and scrubs those containing header errors from the ring.

Data CRC

The last 32 bits of each cell that contains a non-empty data field—write initiate cells and read response cells with a response code of 00—is a CRC check word. It is the remainder of the division modulo 2 of the address word (for write initiation cells) and all of the data words by the following generator polynomial:

$$X^{16} + X^{12} + X^5 + 1$$

Because the checkword word is sixteen bits long, it is followed by a sixteen bit reserved word subfield that is filled with zeros. The CRC of each captured cell is checked on entry into the Input FIFO or ITC at the destination node.

Figure 12A:
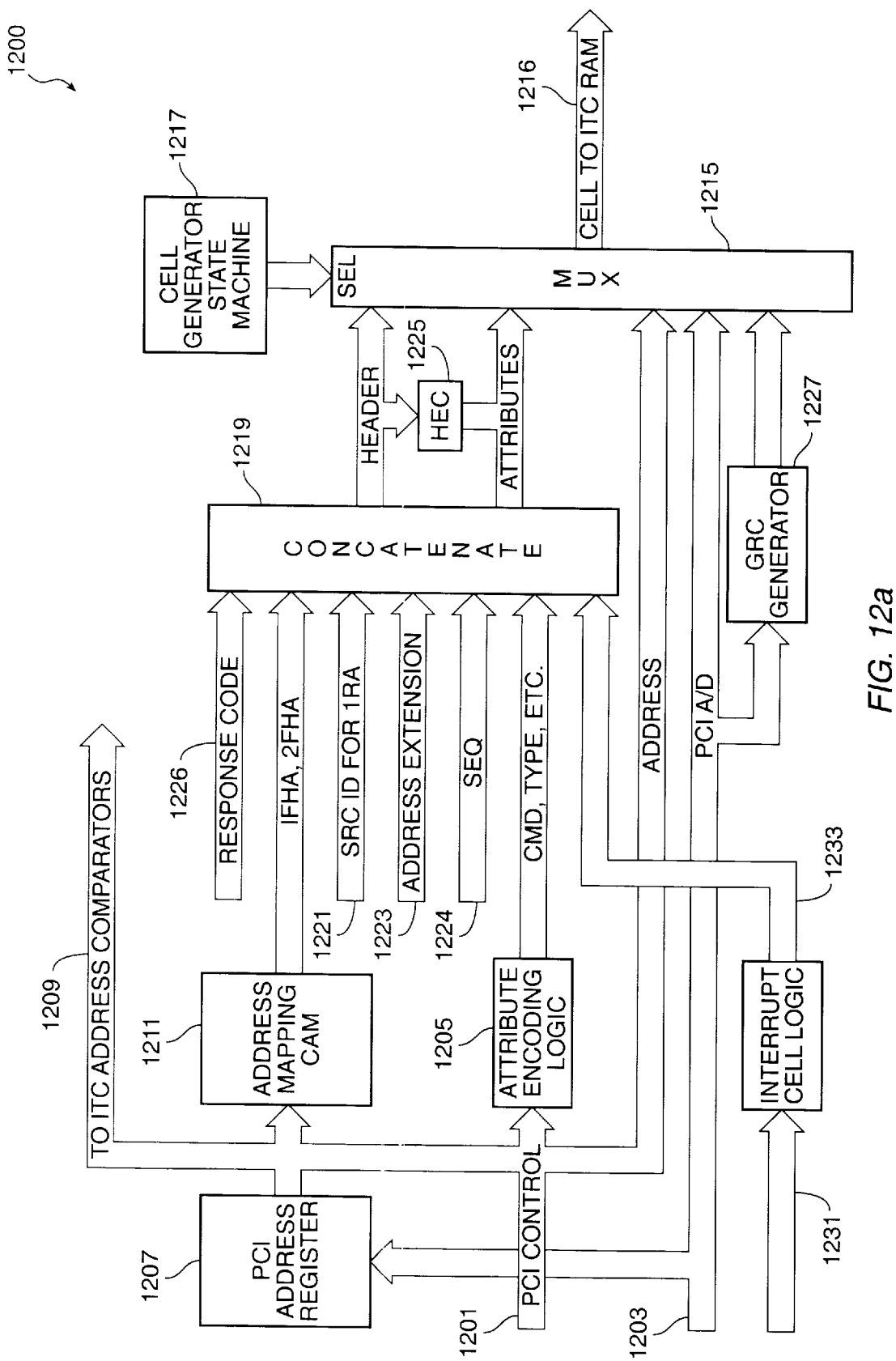
FIGS. 12a&b illustrate the components and operation of the node's cell generation section in accordance with a preferred embodiment of the invention.

FIG. 12a illustrates the data paths of the cell generation section of a PCI interface node indicated by a general reference character 1200. This cell generation section corresponds to the cell generator mechanism 147 of FIG. 1b. The PCI interface node receives PCI control signals at a terminal 1201, and PCI address and data signals from a terminal 1203. The PCI control signals, including C/BE#, flow from the terminal 1201 to an attribute encoding logic 1205 that generates transfer attributes. Some of these are used in the cell's header and the remainder are used in the attribute word that follows the header. The transfer attributes, for a bus transaction cell, include information required to recreate the bus operation at the destination node and (for some cells in some ling topologies) the SrcID subfield 706.

The PCI address and data signals flow from the terminal 1203 to a PCI address register logic 1207. This address register logic 1207 remembers the address during the data phase of the transaction and increments the address (by four bytes) as each word of data is transferred as part of the cell being generated. This incrementing address is also applied to the ITC address comparators through a terminal 1209, provided to an AMCAM 1211 and a multiplexer 1215. The ITC address comparators are used to determine if the data being requested by a PCI read cycle is contained in the ITC.

The multiplexer 1215 provides words to the ITC RAM through a terminal 1216. The multiplexer 1215 is controlled by a cell generator state machine 1217. First the concatenated header and attribute bits are selected and written to the first word of the cell through the terminal 1216. Next the address is passed through the multiplexer 1215 to the terminal 1216. Subsequently the data words and finally the CRC word are passed through the multiplexer 1215 and written to consecutive ITC entry RAM locations. If a burst write cycle completes without completely filling a cell, then the attribute word of the cell is rewritten to correct the data length subfield. This is all done in synchronization with the corresponding PCI transaction. The address of the destination node (generated by the AMCAM 1211) is grouped, by a concatenate logic 1219, with the source node's address flowing from a terminal 1221, the address extension flowing from a terminal 1223, the Seq# flowing from a terminal 1224 and the transfer attributes flowing from the attribute encoding logic 1205. The concatenation logic 1219 creates the header field 701 and the transfer attributes field 704. The header field is applied to an HEC generation logic 1225 that performs the header CRC calculation and supplies the resulting value to the HEC field 703. For response cells, the response codes flow from a terminal 1226.

The PCI address and data signals also flow from the terminal 1203 to the multiplexer logic 1215, and a CRC generator/checker logic 1227. This CRC generator logic 1227 generates the CRC for the cell's payload. This CRC then flows to the multiplexer 1215. The multiplexer 1215 and the cell generator state machine 1217 generate the cell. The generated cell flows to the ITC through the terminal 1216.

Each initiation cell includes the four bit Seq subfield supplied through a terminal 1224. The current value of Seq is included in the cell's attribute word whenever an initiation cell is generated. Once the initiation cell is generated, the value of the Seq subfield is incremented. When the corresponding response cell is generated at the destination node, the contents of the Seq subfield from the initiation cell is stored in the Seq subfield of the response cell. When the response cell returns to the source node, the contents of the Seq subfield in the response cell is compared to the contents of the Seq subfield of all the ITC entries that are in the wait response state (described hereinafter in relation to FIG. 22). A match between the response cell's and entry's Seq subfields means that the response cell is directed to the matching entry.

A plurality of interrupt inputs 1231 from the PCI bus are processed by an interrupt cell logic 1233 that generates the appropriate values for the "Interrupt Pin ID on IRQ Cells" subfield 742.

The attribute bits from the attribute encoding logic 1205 include the Bdcst Flag, the address extension subfield, the data length subfield, the command subfield, the type subfield, and the Wrd bit.

Figure 12B:
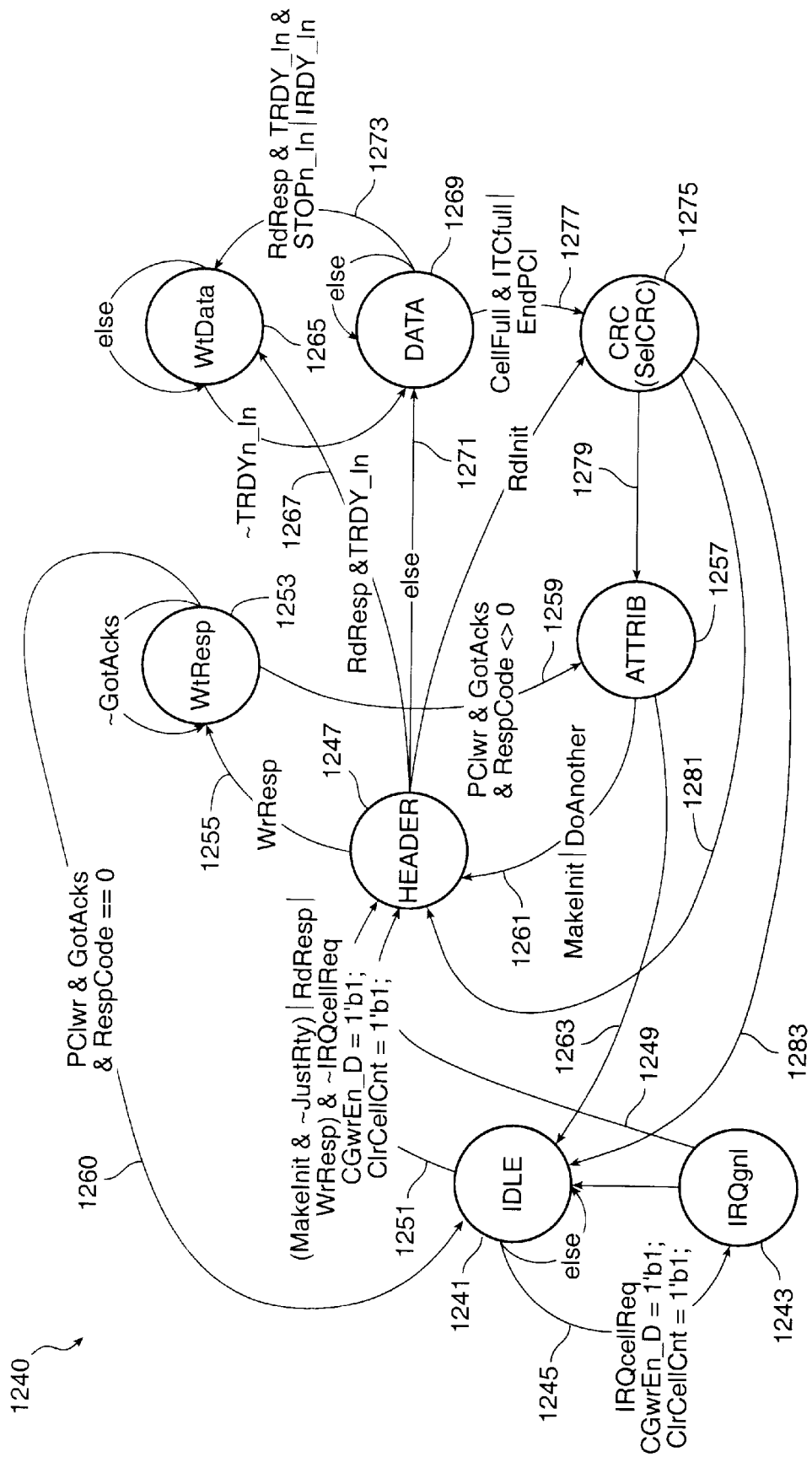

FIG. 12*b* illustrates the cell generator state machine 1217 as indicated by a general reference character 1240. The state machine starts at an idle state 1241 and advances to an IRQgnt state 1243 by following a state transition 1245. The state transition 1245 is initiated by an interrupt cell request. The IRQgnt state 1243 causes the data comprising the interrupt transaction cell to be written into the ITC and queues the cell to be transmitted onto the path. Then the machine returns to the idle state 1241 or if a bus transaction cell is pending, the machine transitions to a header state 1247 by following a state transition 1249. The state machine also advances from the idle state 1241 to the header state 1247 if a bus transaction cell is pending by following a state transition 1251.

In the header state 1247 the cell's header and attribute words are written to the appropriate ITC location. Some of the attribute subfields may be modified by later states. The state machine transitions to a wait response state 1253 by following a state transition 1255 if the cell being generated is a write response cell. In the wait response state 1253 the machine waits for a signal from the PCI master interface that indicates completion of a write transaction. If the response is not a success acknowledgment the state machine transitions to an attribute state 1257 by following a state transition 1259. In the attribute state 1257 the attribute word of the cell is rewritten with the correct response code. However, there is no need to correct the response code if the response is a positive acknowledgment and the state machine transitions directly to the idle state 1241 by following a state transition 1260. The attribute state 1257 updates the cell's attribute subfields and queues the cell for transmission. If a bus transaction cell is pending the machine transitions to the header state 1247 by following a state transition 1261. Otherwise, the machine transitions back to the idle state 1241 by following a state transition 1263.

If the machine is in the header state 1247 and the cell being generated is a read initiate cell and the associated data is not yet available on the PCI bus, then the machine transitions to a wait for data state 1265 by following a state transition 1267. The wait for data state 1265 waits for the data to be valid on the PCI bus. If the machine is in the header state 1247 and the cell being generated is a read initiate or a write response and the associated data is available on the PCI bus, then the state machine transitions to a data state 1269 by following a state transition 1271. The state machine remains in the data state 1269 for so long as data is available. If data is temporarily unavailable the machine transitions back to the wait for data state 1265 by following a state transition 1273. One word of data is written to ITC entry's RAM at each PCI clock while the state machine is in the data state 1269. The state machine transitions to a CRC state 1275 by following a state transition 1277 at the end of the PCI transaction. This transition 1277 is also followed if the cell's payload fills before the PCI transaction completes. The CRC state 1275 writes the CRC check word to the ITC entry's RAM. If the contents of the data length subfield needs to be corrected, such as if the PCI transfer completed before filling the cell, the state machine transfers to the attribute state 1257 by following a state transition 1279. The attribute state 1257 updates the data length subfield as described above. Otherwise, the machine transitions to either the idle state 1241 or the header state 1247 depending on whether the PCI transaction has not completed or if another PCI transaction has started. A transition 1283 takes the machine to the idle state 1241. A transition 1281 takes the machine to the header state 1247. During both of these transitions 1281, 1283 the cell is queued for transmission.

The AMCAM 1211 generates the contents of the 1FHA and 2FHA fields that comprise the address of the destination node.

Flow Control

Figure 13A:
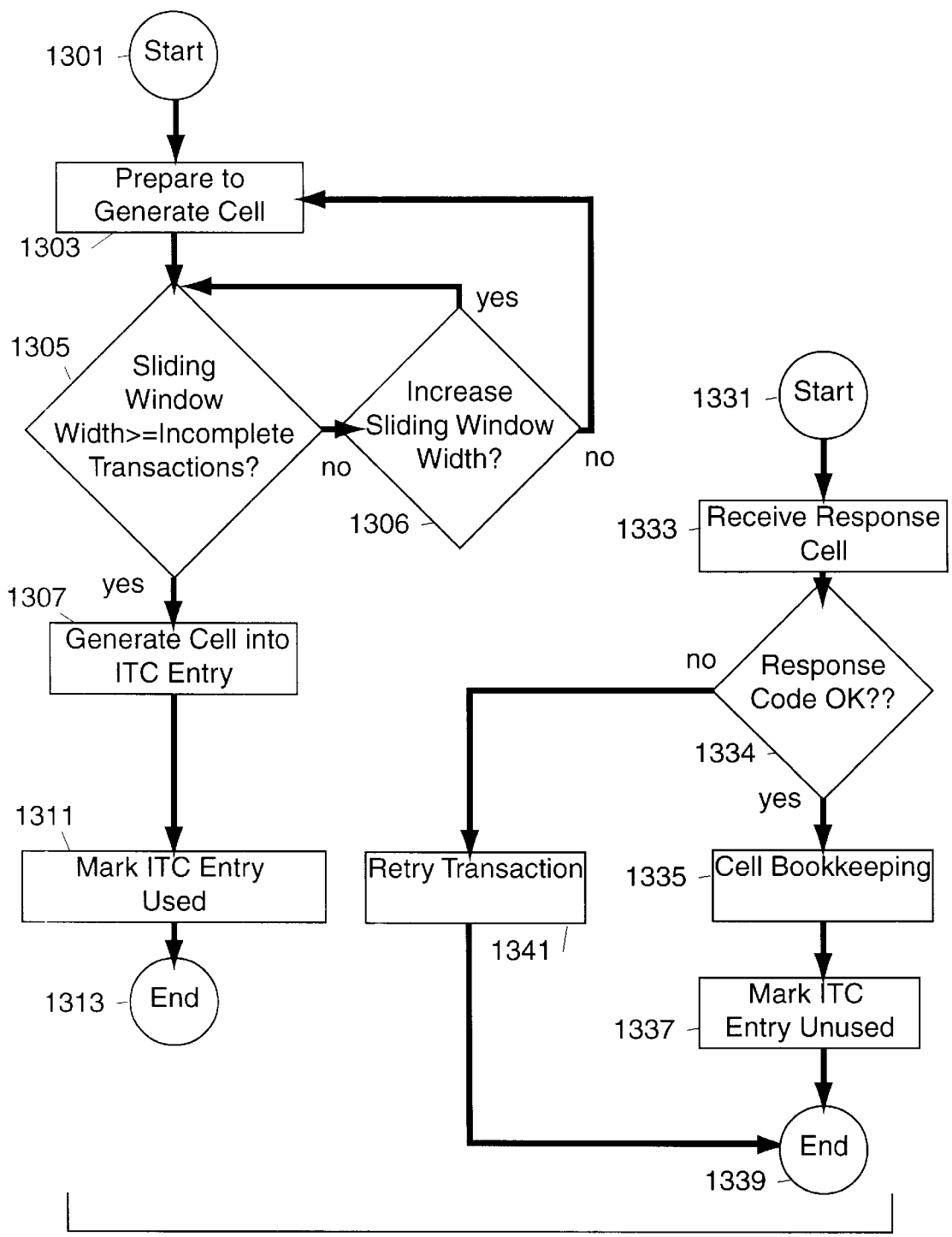
FIGS. 13a&b illustrate the processes used for flow control of cells sent from a source node in accordance with a preferred embodiment of the invention.
Figure 13B:
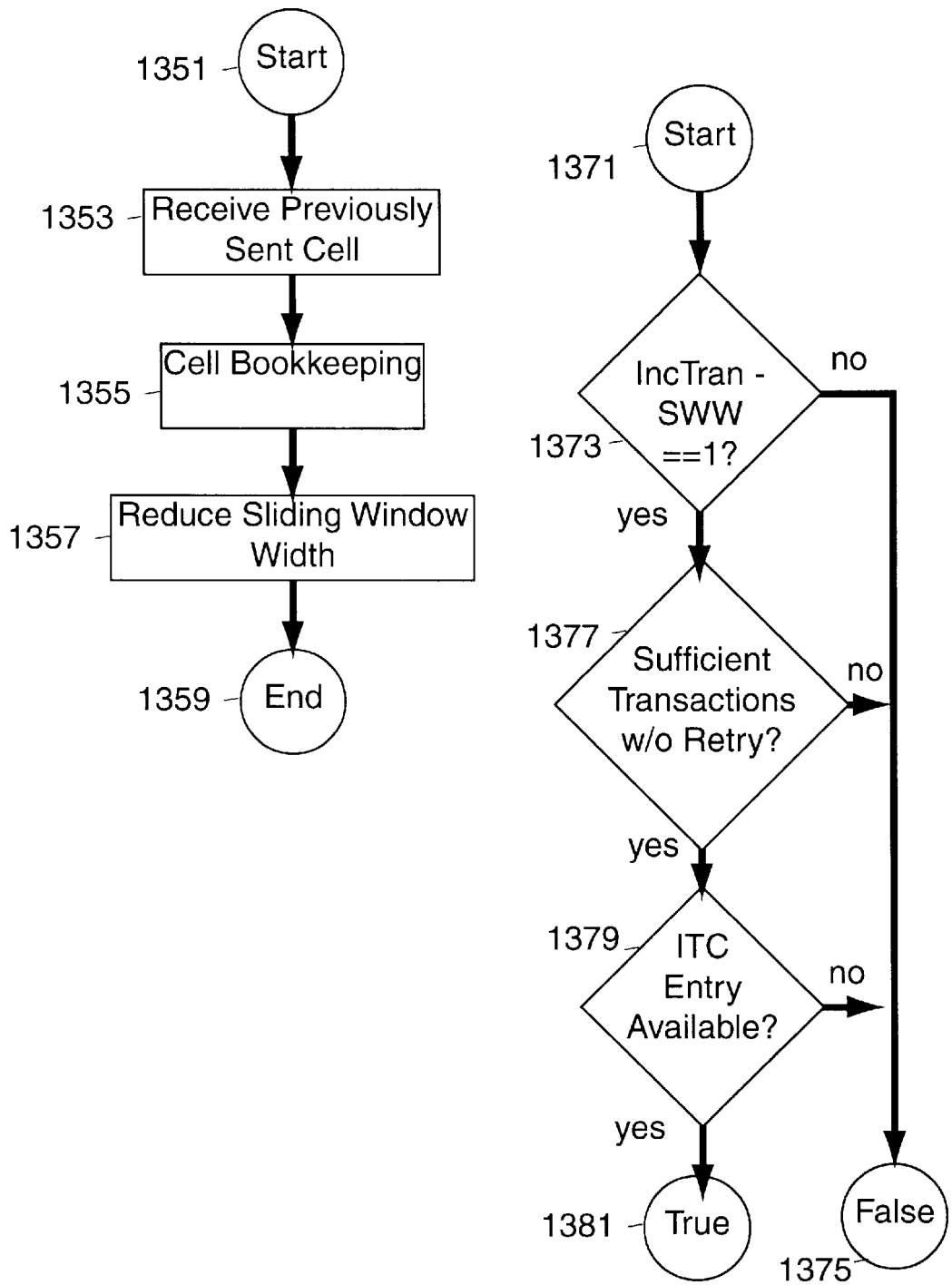

FIGS. 13a and 13b illustrate the process used to regulate the flow of initiation cells into the ITC at the source node and subsequently to destination nodes. The ITC avoids overrunning the input FIFO at destination nodes. Otherwise an initiation cell that overran the destination node's input FIFO would be returned to the source node and subsequently retried. Each node tracks the number of incomplete transactions and a sliding window width. A transaction starts with the transmission of an initiation cell by the source node and completes by receipt, by the source node, of a response cell containing a positive acknowledgment. If the number of incomplete transactions is equal to or greater than the sliding widow width, the source node delays the generation and subsequent transmission of a cell until the number of incomplete transactions is within the sliding window width. Once this condition occurs, the source node generates the cell, temporarily stores the cell in the ITC and queues the cell for transmission. If an initiation cell returns to its source node, the source node reduces its sliding window width. Under certain circumstances, based upon the number of transactions completed without such a return, the sliding window width is incremented. One skilled in the art will understand that the receipt of a response cell indicates that an initiation cell has been removed from the destination node's input FIFO thus making space for another initiation cell.

The process initiates at "Start" terminal 1301 and continues to a "Prepare to Generate Cell" step 1303. This step 1303 is the address phase of a bus transaction initiation. The process continues to a decision step 1305 that compares the number of incomplete transactions with the sliding window width. If the number of incomplete transactions is more than the sliding window width, the process continues to an "Increase Sliding Window Width" decision step 1306, described hereinafter concerning FIG. 13b. If this step 1306 is unable to increase the sliding window width, the process loops back to the "Prepare to Generate Cell" step 1303. The number of incomplete transactions is determined by examining the state of each ITC entry. The number of incomplete transactions is the number of ITC entries that are not in not in use.

If step 1306 is unable to increase the sliding window width sufficiently to allow the cell generation and subsequent transmission, the process delays the generation of a cell by whatever mechanism is appropriate. That is, if the node is a PCI node, one embodiment of the process delays the generation of the cell by retrying the bus transaction (that is, the cell generation terminates and the process restarts on the next PCI address phase). Another embodiment stores the cell and allows its transmission as soon as the number of incomplete transactions is less than the sliding window width. Regardless of which embodiment is used, the process loops back to the decision step 1305 to determine whether the sliding window width is now greater than or equal to the number of incomplete transactions. If the sliding window width is greater than or equal to the number of incomplete transactions, the process continues to a "Generate Cell" step 1307.

The "Generate Cell" step 1307 builds the cell by generating the cell header 701, the HEC 703, and packing the payload 705 with the transfer attributes, the data, and the error check code. For a PCI node, this process was described concerning FIG. 12. The entire cell is assembled in an ITC entry (described hereinafter). The ITC entry's state machine (also described hereinafter) is dedicated to tracking the cell's status until its transaction completes.

Transitions of the ITC state machine are made in response to events such as a transaction initiation or completion, arrival of response cells, return of initiation cells to the originating node, response time-out mechanisms and read prefetch cell aging mechanisms. A "Mark ITC Entry Used" step 1311 flags the corresponding ITC entry as used (thus increasing the number of incomplete transactions—the details of this operation are hereinafter discussed concerning FIG. 22). One embodiment of the invention determines the number of incomplete transactions initiated from the source node by considering all incomplete transactions originated by that source node. Another embodiment of the invention uses a node specific tracking mechanism that determines the number of incomplete transactions for flow control based on each destination node by comparing the address of each cell stored in the ITC with that of the cell to be sent and determining the number of cells that have the same destination address as the cell to be sent. The process completes at an "End" terminal 1313.

The number of incomplete transactions is reduced when the source node receives a response cell sent from a destination node back to the source node with an appropriate response code. This process initiates at a "Start" terminal 1331. The process continues at a "Receive Response Cell" step 1333 that receives a response cell addressed to the source node. Next at a "Response Code OK" decision step 1334, the process examines the response code contained in the cell and if the transaction has successfully completed the process continues to a "Cell Bookkeeping" step 1335. The "Cell Bookkeeping" step 1335, processes the received cell to match the response cell with the appropriate incomplete transaction by comparing the contents of the Seq# subfield. Finally, a "Mark ITC Entry Unused" step 1337 clears the ITC entry associated with the response cell, and the process completes through an "End" terminal 1339. However, if in the "Response Code OK" decision step, the response code indicates an error, the process continues to a "Retry Transaction" step 1341 that retransmits the cell to the destination node. The process completes through the "End" terminal 1339. These steps are further described with respect to the state machine illustrated in FIG. 22 and described hereinafter.

Looking now at FIG. 13b the process used to reduce the sliding widow width initiates at a "Start" terminal 1351 and continues to a "Receive Previously Sent Cell" step 1353. As previously described, source nodes swallow cells that are returned to them. This occurs if the destination node was unable to swallow the cell because its input FIFO was full. Thus, a node that receives a cell that the node previously transmitted, knows that the destination node is blocked. The process continues to a "Cell Bookkeeping" step 1355 that prepares the cell for retransmission and/or causes the node to raise an error. Next, the process continues to a "Reduce Sliding Window Width" step 1357 that reduces the sliding window width thus reducing the number of incomplete transactions that can be maintained by the source node. The process completes through an "End" terminal 1359.

Figure 14:
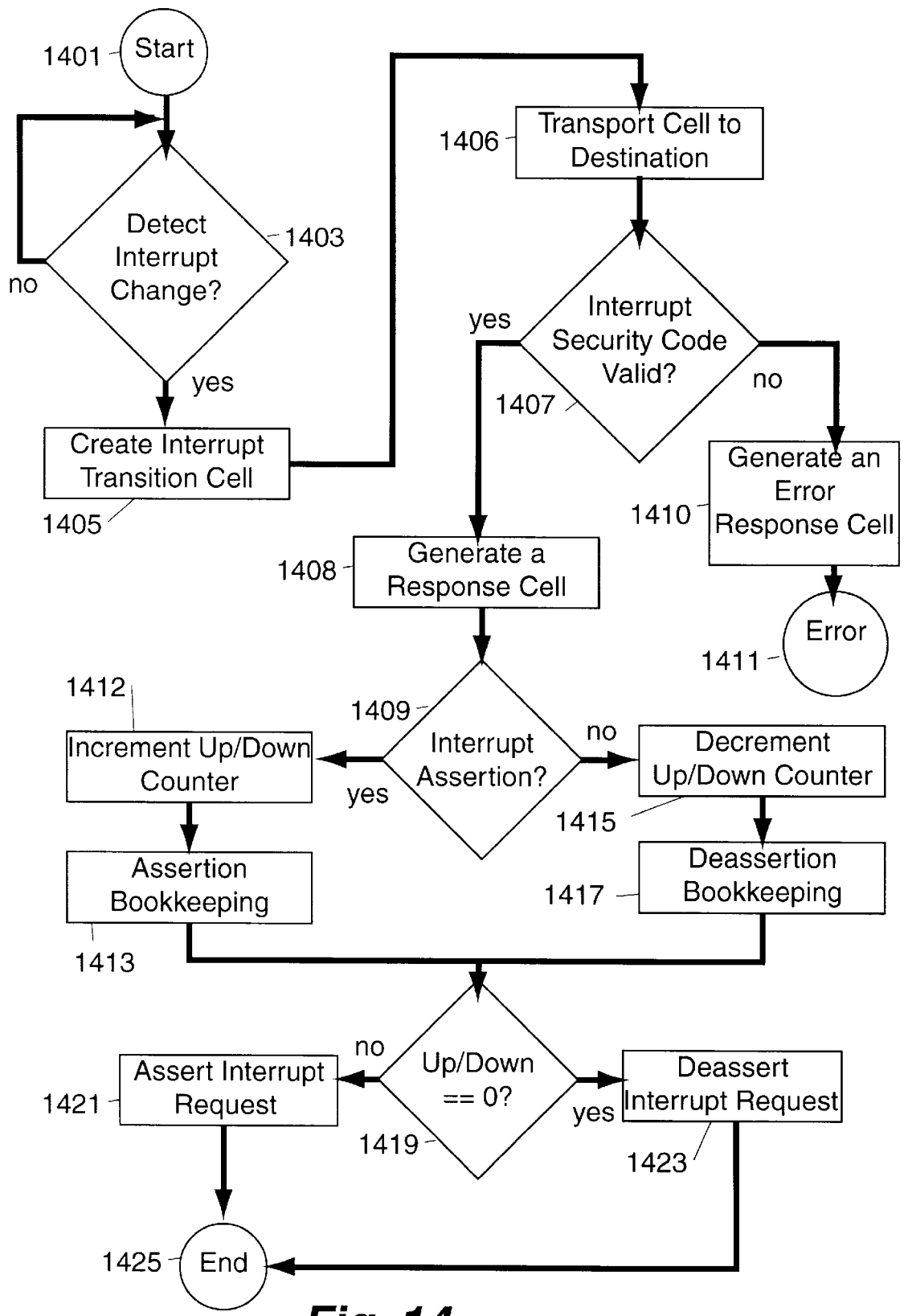
FIG. 14 illustrates the process used to communicate interrupt information from one node to another node in accordance with a preferred embodiment of the invention.

The "Increase Sliding Window Width" decision step 1306 initiates at a "Start" terminal 1371 and continues to a decision step 1373. This decision step 1373 determines that the number of incomplete transactions is one greater than the sliding widow width. If the number of incomplete transactions minus the sliding window width is not equal to one, the process completes through a "False" terminal 1375. Otherwise, the process continues to a "Sufficient Transactions w/o Retry" decision step 1377 that determines whether a programmable-number of transactions has occurred without retry (that is, without return of a previously sent initiation cell). If, at the decision step 1377, a retry has occurred within the last programmable-number of transactions, the process completes through the "False" terminal 1375. However, if no retry has occurred within the last programmable number of transactions, the process continues to an "ITC Entry Available" decision step 1379. The "ITC Entry Available" decision step 1379 determines if an ITC entry is available for the transaction. If not, the process completes through the "False" terminal 1375. However, if an ITC entry is available, the process completes through a "True" terminal 1381. One skilled in the art will understand that these steps can be performed either sequentially or in parallel. Interrupt handling The interconnect also transports interrupt information from one bus device to another. In a preferred embodiment, the bus device is a PCI bus. FIG. 14 illustrates the process used to communicate interrupt information.

An interrupt transition cell contains only header and attributes information. Interrupt transition cells are generated both to signal transitions of external interrupt pins and to signal internal events such as error conditions. The interrupt attribute word contains an interrupt message field. For interrupt transition cells relating to external interrupt pins, this field is filled with zeros. For signaling an internal event, this field contains a binary code that represents the event. An interrupt transition cell is handled as an initiation cell that engenders a response cell. The "Interrupt pin ID on IRQ cells" field 742 of the header routing tag 729 identifies which of four supported interrupt pins at the source node are addressed. The effect of the cell at the destination node is to increment/decrement a counter whose non-zero status asserts an interrupt request output. The attribute word 704 contains a security code. The security code is checked at the destination node and, if appropriate, the node generates an error interrupt instead of its interrupt transition signal.

The process starts at a "Start" terminal 1401 and continues to a "detect interrupt change" decision step 1403. The interrupt change is one of an interrupt assertion or an interrupt deassertion. If no interrupt change occurs, the process continues to wait until one does. However, if at the "Detect Interrupt Change" step 1403, the process detects a change, the process continues to a "Create Interrupt Transition Cell" step 1405. The "Create Interrupt Transition Cell" step 1405 constructs a cell, addressed to a destination node, that contains an indication of the interrupt condition change and a source node identifier. Next, at a "Transport Cell to Destination" step 1406, the interrupt cell is transported to the destination node using the methods described above. Once the interrupt cell is received at the destination node, an "Interrupt Security Code Valid" decision step 1407 determines whether the interrupt security code contained in the cell matches a value stored in the destination node. If these values match, the process continues to a "Generate Response Cell" step 1408 that sends a response cell, indicating success, back to the appropriate node. The process continues at an "Interrupt Assertion" decision step 1409. If the "Interrupt Security Code Valid" decision step 1407 determines that the security codes did not match, the process continues to a "Generate an Error Response Cell" step 1410 that sends a response cell, indicating an error, back to the appropriate node and the process completes through an "Error" terminal 1411.

The "Interrupt Assertion" decision step 1409 determines whether the cell contains an interrupt assertion condition or an interrupt deassertion condition. If the cell contains an interrupt assertion condition, the process continues to an "Increment Up/Down Counter" step 1412. Then the process performs bookkeeping functions relating to the incoming interrupt assertion cell at an "Assertion Bookkeeping" step 1413. In one embodiment of the invention, the "Assertion Bookkeeping" step 1413 writes the response routing tag (1RA 739, 2RA 738, and SrcID 706 subfields plus the interrupt pin number 742) that identifies the source node into a circular buffer in local PCI memory space. In this embodiment, the security code serves a dual function as the high order address of the circular buffer.

However, if at the "Interrupt Assertion" decision step 1409 determines that the cell contains an interrupt deassertion condition, the process continues to a "Decrement Up/Down Counter" step 1415. The process then continues to a "Deassertion Bookkeeping" step 1417 to perform processes relating to the incoming interrupt deassertion cell. After either the "Assertion Bookkeeping" step 1413 or the "Deassertion Bookkeeping" step 1417, the process continues to a decision block 1419 that determines whether the Up/Down counter is zero or non-zero. If the counter is non-zero, the process continues to an "Assert Interrupt Request" step 1421 that posts (asserts) an interrupt. Then the process completes through an "End" terminal 1425. However, if at the decision block 1419 the Up/Down counter is equal to zero, the process continues to a "Deassert Interrupt Request" step 1423 that clears (deasserts) the interrupt request output. Then the process completes through the "End" terminal 1425. System configuration, Node ID Assignment and Ring Initialization Before the ring network can be made operational, each node must be given a node number, the DLLs in each link interface must be brought into synchronization, and the address mapping registers and AMCAM 145 in each node must be configured. In the preferred embodiment, this configuration is done in a way that is indistinguishable from a standard hierarchical bridge topology and uses only standard PCI—PCI bridge CSRs. This makes the interconnect compatible with the BIOS and operating system of standard personal computers.

Logical Bus Hierarchy

In a preferred embodiment, each TABI on a ring network appears to a configuring host computer to be a secondary bridge connected to a PCI bus segment. Each node of the network and each device attached to the PCI bus of a TABI responds to configuration space accesses in an identical fashion to devices in a conventional PCI bus hierarchy where PCI busses are interconnected with conventional PCI—PCI bridges.

During configuration space accesses bus operations, the PCI specification defines PCI_ADDR[23:16] as containing the number of the secondary bus upon which the target device is located and PCI_ADDR[15:8] as containing a pointer to the target device and function. When PCI_ADDR [23:16] of a configuration space access match the node's secondary bus number register, the access is known to target the configuration registers (CSRs) of one of the nodes of the network. Accordingly, for such an access, PCI_ADDR [12:8] is stored in the 1FHA subfield 733 and PCI_ADDR [15:13] is stored with two leading zeros in the 2FHA subfield 735 In addition, if the cycle is a write to a base address or limit register, it is broadcast to all network nodes using the broadcast protocol defined previously.

A similar mechanism is used to direct configuration space accesses on the PCI bus which target devices attached to one of the network nodes to the appropriate node. For such accesses, per the PCI—PCI Bridge Standard Architecture, PCI_ADDR[23:16] contain the number of the subordinate bus on which the target device is located. If this address subfield is greater than the contents of the node's secondary bus number register and less than or equal to the contents of its subordinate bus number register, than the target device is known to be located at the node whose ID is equal to PCI_ADDR[23:16]. Accordingly, for such accesses, PCI_ADDR[20:16] is used as the contents of the 1FHA subfield 733 and PCI_ADDR[23:21] plus two leading zeros is used as the contents of the 2FHA subfield 735 of the routing tag 729, instead of the AMCAM 145 output.

Automatic Node ID

The TABI located at the host computer (the host TABI) is generally the clock originator node. During the AutoNodeID, process detailed hereinafter, the clock originator node sends a synchronization pattern until all nodes are synchronized. After the nodes are synchronized they are provided with a HostID value (described hereinafter) from the clock originator node. Each node also determines its relative position number. When this process completes, each node knows its own address as well as that of the host and learns the number of nodes in the network. Each node computes its own address by adding the HostID to the relative position number recorded on the clockwise link.

After the interconnect is initialized, the host computer normally writes to the CSR registers of all the devices to configure the devices. The host TABI is configured by Type0 CSR cycles in which its IDSEL input is asserted. All other nodes are configured by configuration cells sent from the host TABI. These configuration cells are generated by Type1 CSR cycles in which PCI_ADDR[23:16] match the contents of the secondary bus number register of the host node. Any such write that affects an address mapping CSR of any node or the secondary bus number register of the configuring host is performed using the broadcast protocol so that every node receives the information. In the preferred embodiment the address mapping registers are the I/O Limit, I/O Base, Memory Limit, Memory Base, Prefetchable Memory Limit, Prefetchable Memory Base, I/O Limit Upper and I/O Base Upper Registers as defined in the PCI—PCI Bridge Standard Architecture. When a node receives such a write, via a broadcast or other initiation cell it updates the AMCAM entry corresponding to the node that is the direct target of that write. When a node receives a write to the host TABI's secondary bus number register through a broadcast cell, the node updates its HostID register. This has the effect of also updating its own address because the node's address is the sum of the HostID and the node's relative position number.

A preferred embodiment of the invention assigns node addresses to other nodes in the interconnect during a system configuration process. One node in the interconnect is designated as the configuration node. In a preferred embodiment the configuration node is specified by a strapped input pin. A second node is defined as a backup configuration node.

The backup configuration node takes over the duties of the configuration node if configuration does not happen within a time-out period after the interconnect is reset. In a preferred embodiment, the clock originator node is the same node as the configuration node.

The automatic NodeID process is initiated by the configuring node (the clock originator node) in which each node learns the NodeID of the clock originator node and is itself assigned a NodeID that matches the configuration PCI bus number of the PCI bus segment attached to it. Each node also learns the number of nodes in the ring. The process concludes with the initialization of the link selection register (LSR) 151 so that the LSR specifies the shortest path for each outgoing cell to take. The process includes a sequence of transmissions of special "cells" (these "cells" are signal sequences that do not have cell headers or other cell attributes) that first reset each node in the ring, synchronize each node's DLLs, then transmits the clock originator node's NodeID and assigns a relative position number to each node on both paths.

Figure 15:
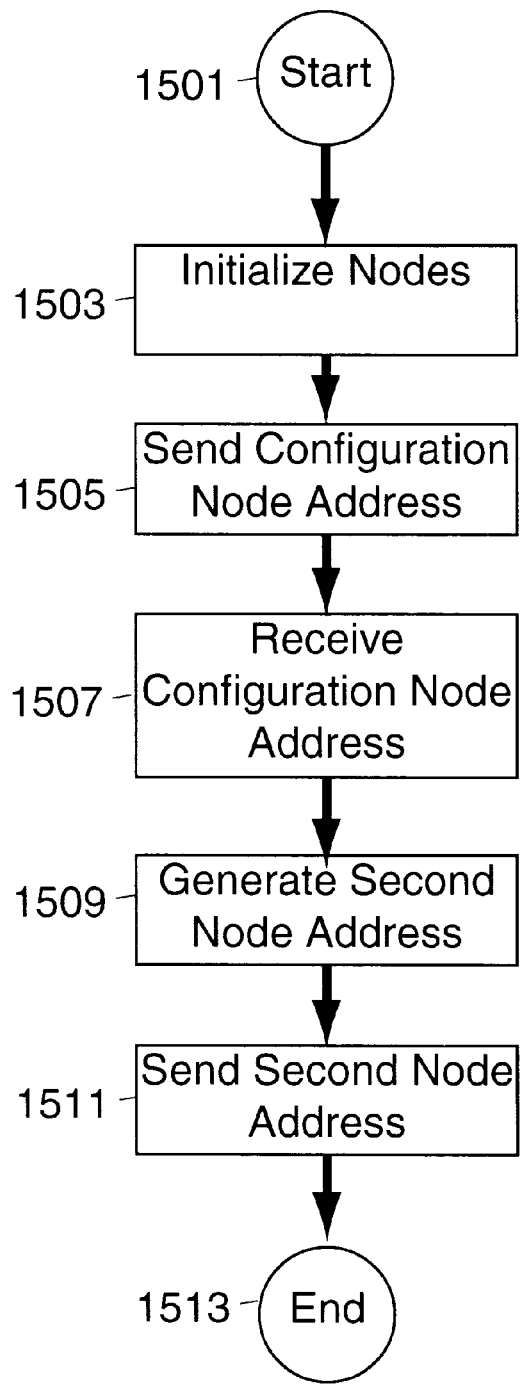
FIG. 15 illustrates the process used to assign node addresses in accordance with a preferred embodiment of the invention.

FIG. 15 illustrates the process used to assign node identifiers (node addresses). The process initiates at a "Start" terminal 1501 and continues to an "Initialize Nodes" step 1503 that causes all the nodes in the ring to be initialized, as hereinafter described with respect to FIG. 16. Then the process continues to a "Send Configuration Node Address" step 1505 that emits an identifying address sequence that contains the address of the configuration node (called the HostID). The identifying address sequence includes a host identification subfield and a relative position number. The host identification subfield in a PCI implementation is the contents of the secondary bus number CSR. For a non-PCI implementation this field is a configuration and implementation option. A "Receive Configuration Node Address" step 1507, operating at some second node other than the configuration node, receives the identifying address sequence containing the configuration node address. At a "Generate Second Node Address" 1509 the receiving node increments the relative position subfield of the configuration node address creating a second node address. The second node address is used as the address for the second node. Next, at a "Send Second Node Address" step 1511, the second node emits another identifying address sequence using the second node address to another node on the interconnect. The process completes through an "End" terminal 1513.

The node addresses includes both the original HostID and the node's relative position number on the ring.

Figure 16:
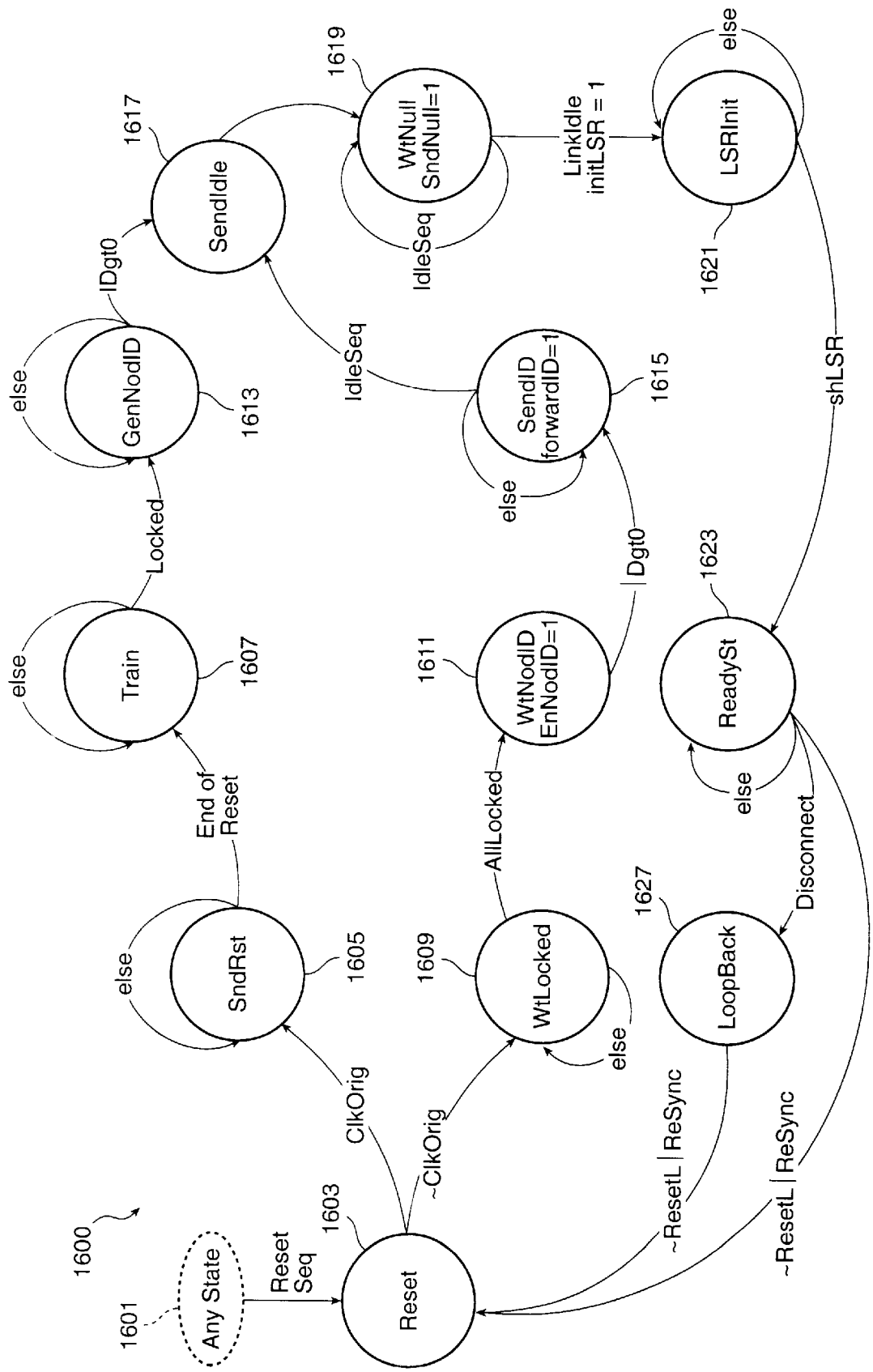
FIG. 16 illustrates the states used to initialize the nodes on the ring in accordance with a preferred embodiment of the invention.

FIG. 16 is a state diagram, indicated by a general reference character 1600, that illustrates the ring initialization and node identifier assignment processes. A node in any state 1601 will enter a reset state 1603 after detecting a reset. A reset includes either a power-on input or receipt of a reset data pattern. The reset data pattern is defined to be the flag signal being asserted and the data signals being AAAAh maintained for more than 63 data clocks. A node other than the configuring node that detects the reset input pattern for this period immediately forwards the same pattern out both of its link interface outputs. Once the clock originator node is reset, it advances to a send reset state 1605. At power-on reset and in this state 1605, the configuring node emits the reset data pattern. The node advances to a train state 1607 at the expiration of a time-out counter of sufficient duration to guarantee that all nodes are reset by the reset sequence. This requires a nominal minimum of 64 clocks times the number of nodes. One skilled in the art would understand that a longer sequence provides additional assurance that all nodes reset.

In the train state 1607, the clock originator node emits a training sequence including two bits of all-0s followed by two bits of all-1s on all the clock originator node's output signal lines 209, 219. Other nodes recognize the end of the reset sequence and enter a wait for lock state 1609 that uses the training signals to select what phase of the node clock signal to use and to synchronize the node's link interfaces' DLLs to the training signal as described above. The training sequence is propagated to each node on the ring and eventually returns to the clock originator node. A node generates a null signal from the end of reset sequence until the node's DLLs are synchronized. A null signal is when all data output signals are at an unchanging 1. After a node synchronizes, it advances to a wait for node identifier state 1611 and in that state 1611 emits the training sequence. Once the clock originator node receives the training sequence from both paths, the link interface at the clock originator node synchronizes and advances the state to a generate node identification state 1613.

In the generate node identification state 1613, the training sequence output is replaced by an ID word as defined in Table 22.

TABLE 22

| LinkBit | 15...8  | 7...3            | 2...0 |
|---------|---------|------------------|-------|
| Field   | HOST ID | $X_4X_3X_2X_1X_0$ | 000   |

The $X_{4\text{-}0}$ in the table represent the node's position counted from 0 at the clock originator node. The HostID is the five least significant bits of the secondary bus number register at the configuring node (assuming a PCI node). The secondary bus number register is defined in the previously mentioned *PCI to PCI Bridge Architecture Specification.* Bits 2.0 correspond to the payload type field 723 of what would be the header of a normal cell. This classifies the data as an OAM "cell" and is therefore ignored by the initiation and response cell processing logic of the link interface. The clock originator node sends an X of 0.

Every node other then the host node determines its address using the HostID and the node's position on the ring. If the secondary bus number register is written before the link initialization process reaches the generate node identification state 1613, then each node receives the HostID during the link initialization process. If the secondary bus number register is written later than this, then each node receives the HostID by means of a broadcast of this write operation on the secondary bus number.

Each node in turn registers the HostID field and the node's position, adds one to the position (X) it receives from its link inputs, and passes the ID word with the incremented position on to the next node at a send identifier state 1615. An ID word with a non-zero position eventually returns to the clock originator node to cause the process to advance to a send idle state 1617. The clock originator node emits a two-word idle sequence followed by a null output and advances to the wait for a null state 1619.

The non-clock originator nodes are now in the send identifier state 1615. When each such node receives an idle sequence instead of an ID word, the node advances to the send idle state 1617 and passes the idle sequence on to the next node. An idle sequence is a series of "10" data transitions on all the data signal lines. The node then advances to a wait null state 1619. (The null signal is defined to be when all data output signals are at an unchanging 1.) In the wait null state 1619, the clock originator node emits a null signal and other nodes simply forward their link inputs to their link outputs thus propagating the null signal.

The null signal eventually traverses the ring and returns to the clock originator node advancing that node to a link selection register initialization state 1621. Each non-clock originator node in the wait null state 1619 passes whatever signal it receives through to its neighbor node. When a non-clock originator node detects a null signal for more than 31 data clocks, the non-clock originator node advances to the link selection register initialization state 1621. At the conclusion of the link selection register initialization process, described hereinafter, the node enters a ready state 1623. When both links have reached the ready state 1623 on all nodes, the system is fully configured. If a node detects a disconnect (defined as all zero at the link inputs for greater than 31 data clocks) on one path, the node enters a loopback state 1627 that uses the other path of the link but otherwise operates normally. Finally either the loopback state 1627, or the ready state 1623 can enter the reset state 1603 as a result of a reset or resync condition. Resync is a control register output that allows software on the host/clock originator node to initiate this configuration process.

In the AutoID process, each node except the clock originator node receives the HostID and its own position from both rings. The sum of the two positions is simply the number of nodes in the ring (N). One of these positions is used as the node's address. In a preferred embodiment, the node's address is its position on the clockwise path. One skilled in the art will understand that other embodiments may use the counterclockwise path position. At the clock originator node, N is computed as the position number returned to it during the AutoID process plus 1. Each node, except the clock originator node, adds the HostID to its clockwise position to obtain its NodeID that it then uses in the response address field (1RA 739) of its initiation cells. The node then left shifts N/2+1 ZEROs into the link selection register (LSR) which has previously been initialized to FFFF_FFFFh. The node then performs a number of left rotate operations on the LSR. The number of left rotate operations is the node's NodeID+1. The LSR now shows the shortest path, being the preferred path, from its node to any destination. During operation, the destination NodeID indexes into the LSR. If the selected bit is a 0, the clockwise path is used for the transmission. Otherwise, the counterclockwise path is used. Once the cell is transmitted onto the path, the cell is transported to its destination node as described above.

Looking again at FIG. 1*b,* the link selection register 151 determines which path 161, 163 an initiation cell takes when the cell is transmitted from a node. The link selection register 151 contains as many fields as there are addressable nodes on the rings. Thus in a preferred embodiment that uses a node address field of five bits the link selection register 151 contains 32 fields. In a dual path ring system, each field is one bit wide to indicate whether the cell is to take the counterclockwise or clockwise path. One skilled in the art will understand that a system containing four paths would require each field to be two bits wide. The link selection register 151 is configured when the node addresses are assigned as described above. This process configures the LSR to specify the preferred path to every other node on the ring. Often the preferred path is the shortest path or one of two equivalent paths. A preferred path is one that is not faulty over a path that is faulty. Thus, when a source node is about to transmit a cell, and the cell's header is on an output cell path 171, the contents of the cell's 1FHA subfield 733 is used as an index into the LSR 151. The accessed field in the LSR 151 determines whether the clockwise path 163 or the counterclockwise path 161 will be used to transmit the cell. The above is used for the simple ring topology. For topologies with ring-to-ring coupler nodes, the 32nd bit of the LSR (the LSR 1Fh field) indicates which direction to take to reach the nearest coupler node. In such topologies, only 31 nodes are permitted on each ring. If the 1FHA subfield 733 contains the value 1Fh, then the contents of the 2FHA subfield 735 is used as an index into the LSR 151. However, if the contents of the 1FHA subfield 733 is not equal to the value 1Fh, the node uses the LSR 1Fh field to determine which link to use to get to the nearest ring to ring coupler node.

Figure 17:
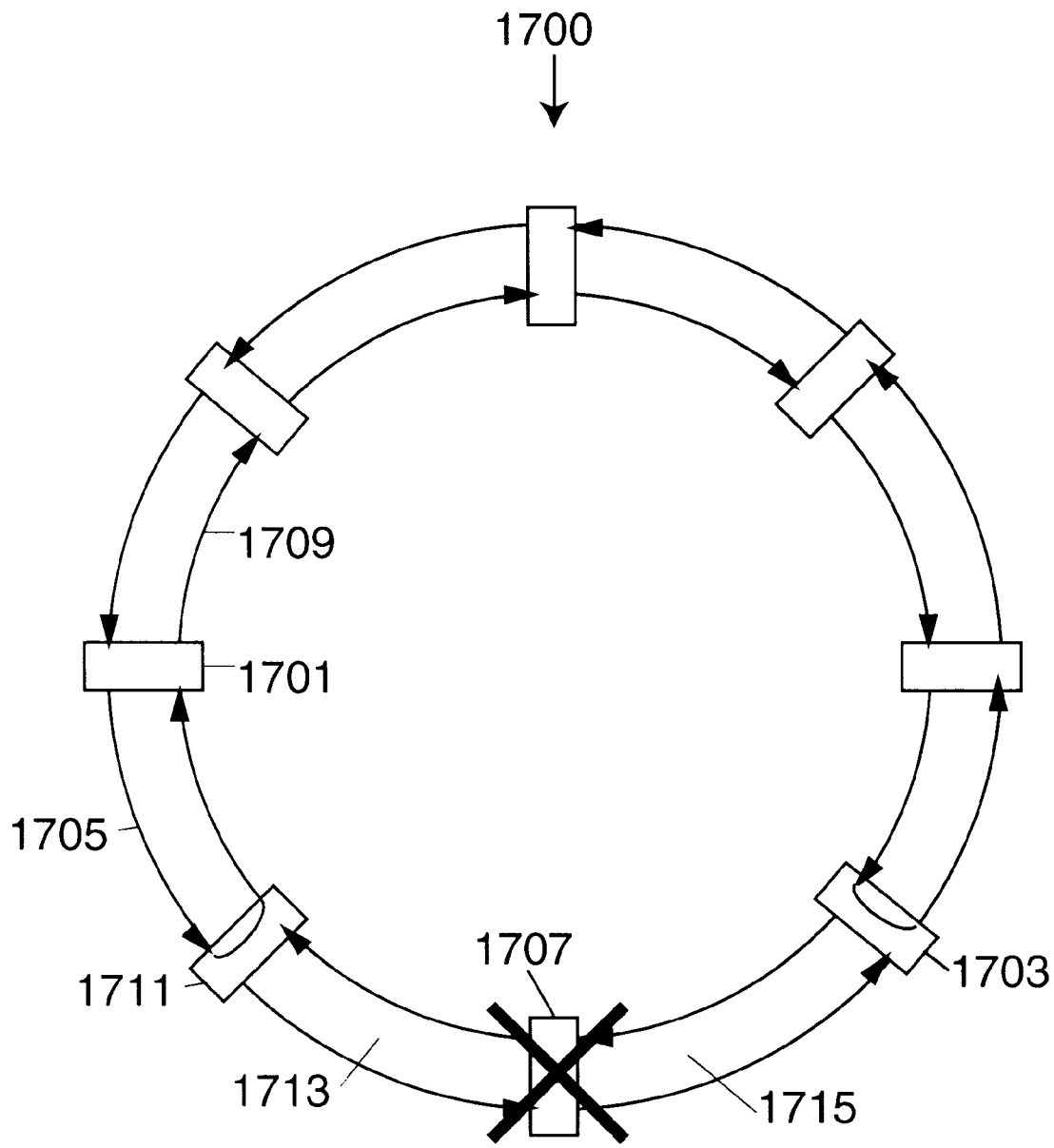
FIG. 17 is used to describe the operation of the LSR in accordance with a preferred embodiment of the invention.

The operation of the LSR is discussed using FIG. 17. A general reference character 1700 indicates a dual counter rotating ring. During normal operation, a cell sent from a source node 1701 addressed to a destination node 1703 would use the routing tag 729 of the cell to index into the LSR and select which path is the shortest path to the destination. Thus, during normal operation of the ring 1700, a cell sent from the source node 1701 to the destination node 1703 would be transmitted onto the counterclockwise path 1705. The cell sent from the source node 1701 to the destination node 1703 over the counterclockwise path 1705 passes through an intermediate node 1707.

If the intermediate node 1707 ceases to function, or if a link 1713 fails, the counterclockwise path 1705 cannot be used to transmit the cell to the destination node 1703 from the source node 1701. Prior art recovery methods exist to transport the cell from the counterclockwise path 1705 to the clockwise path 1709 at a node 1711. There are two disadvantages to these recovery methods. The first is that the cell must traverse an even longer path to reach the destination node 1703 than if the cell was originally transmitted onto the clockwise path 1709. The second disadvantage is that the nodes 1711, 1703 adjacent to the failed intermediate node 1707 now become "hot spots" in the ring handling more cell traffic because these nodes 1711, 1703 must transport cells from one path to another. The invention addresses these problems by changing the contents of the LSR so as to direct the cell (at its source node) onto the path that does not traverse the intermediate node 1707.

In the hot swap situation, where the functioning intermediate node 1707 is to be removed from the ring, the LSR of each node can be reconfigured to isolate the intermediate node 1707. This reconfiguration includes determining the shortest path from each node to every other node without traversing the intermediate node 1707 and storing the appropriate LSR in each node. Once the intermediate node 1707 is isolated, it can be removed. There is no "hot spot" condition because each node is configured to transmit cells to any other node via the shortest path that does not include the intermediate node 1707.

The invention also facilitates recovery from network faults. For example, if the intermediate node 1707 fails and the source node 1701 transmits a cell onto the counterclockwise path 1705, the cell will not be received at the destination node 1703. Eventually, the recovery mechanism in the source node 1701 will retransmit the cell over the same path 1705. After a predetermined number of attempts, the recovery mechanism in the source node 1701 will retransmit the cell over the clockwise path 1709. If the cell is now received at the destination node 1703 (thus causing a response cell to be sent to the source node 1701), the destination node 1703 responds to the source node 1701 and the source node changes its LSR to transmit future cells over the working link. The destination node also dynamically adjusts its LSR to respond to faults. The destination node remembers which path provided the initiation cell. If the LSR selects the same path for the response cell (in normal operation, the shortest path back to the source node would be the opposite path from the path that supplied the initiation cell), a fault is indicated. The destination node then changes the state of the appropriate field in the LSR and transmits the response cell onto the path specified by the new contents of the LSR.

Frequency Reference Fault Tolerance

The need for a central frequency reference raises fault tolerance issues. The invention both provides a backup frequency reference in the event that the primary reference fails and distributes the frequency reference signals in a fault tolerant fashion. As previously described for FIG. 2 the link includes the plurality of data signal lines 201, the flag signal line 205 for cell delineation, and the frequency reference signal line 203. The frequency reference signal on the frequency reference signal line 203 is normally provided by the clock originator node. This node is identified/selected in an implementation dependent fashion, typically by a strap input on the device. Each node, including the clock originator (which uses it only as an indication of ring integrity), receives a frequency reference signal from both the clockwise and counterclockwise paths 207, 219 because the preferred embodiment of the ring is a dual path counter-rotating ring. If one path fails, the node switches to the frequency reference signal on the other path and drives this frequency reference out both of the node's frequency reference outputs. The invention includes phase equalization circuitry that ensures that this transition from one frequency reference signal to another occurs without a significant timing discontinuity. Thus the nodes do not need to be retrained as a result of a loss of frequency reference and subsequent switching to the backup reference.

In a preferred embodiment, a back-up clock originator is also selected (in an implementation dependent fashion). Should both frequency reference signals fail at the backup clock originator, the backup clock originator begins supplying the backup frequency reference to both its outgoing paths. In a preferred embodiment, the node clock signal is the output of the single analog PLL on the chip. A flywheel effect guaranteed by a sufficiently large loop filter capacitor keeps this clock on-frequency during the short term absence of a frequency reference signal or during changeover from the primary to the backup frequency reference signals. The frequencies of the primary and back-up frequency reference are close enough, typically within +/–0.01%, so that the smooth transition from one to the other provided by the flywheel effect does not lead to a dropped word. Loss of the frequency reference signals is most likely to occur as the result of the unscheduled removal of the module generating the frequency reference signal. The preferred embodiment contains error detection and retry capability sufficient to survive this removal without loss of data integrity or transaction integrity.

Figure 18:
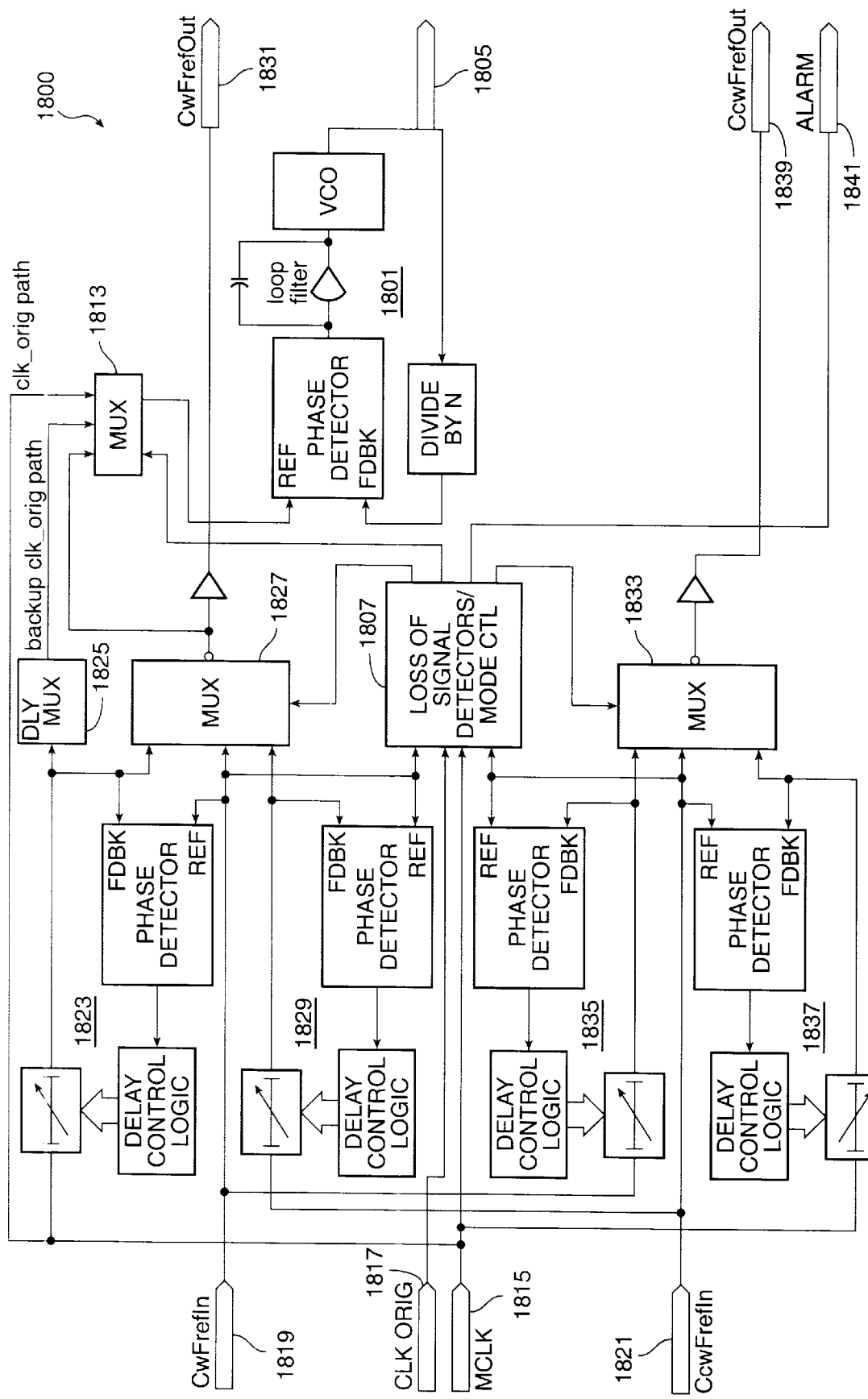
FIG. 18 illustrates the clock generation and frequency reference propagation circuitry in accordance with a preferred embodiment of the invention.

FIG. 18 illustrates the clock generation and frequency reference propagation circuitry. A frequency multiplying PLL 1801 provides the node clock based on the frequency reference signal. The node clock signal 403 is provided at a terminal 1805. A "Loss of Signal Detector/Mode Control" logic 1807 is used to select which of the available frequency reference signals the node uses. The reference frequency for the PLL 1801 is provided by a multiplexer 1813. If the node is a clock originator node, a master clock (MCLK) signal is provided at a terminal 1815. For a correctly functioning clock originator node, the MCLK signal is selected by the multiplexer 1813 under control of the "Loss of Signal Detector/Mode Control" logic 1807. This logic 1817 monitors the MCLK signal (provided at the terminal 1815), the CLK_ORIG signal provided at a terminal 1817 that is used to indicate whether the node is a clock originator node, the clockwise frequency reference input signal provided at a terminal 1819, and the counterclockwise frequency reference input signal provided at a terminal 1821. The "Loss of Signal Detector/Mode Control" logic 1807 monitors these signals and controls the following operations.

The multiplexer 1813 selects the MCLK input if the node is the clock originator. If the node is the backup clock originator and the frequency reference signals at both the CwFrefIn terminal 1819 and CcwFrefIn terminal 1821 are missing, the multiplexer 1813 selects a delayed version of the MCLK signal that has been placed in phase with the clockwise frequency reference signal at a DLL 1823. This delayed MCLK signal is further delayed at a delay 1825 that is carefully constructed to have the same delay as a multiplexer 1827. The input signals to this multiplexer 1827 are the clockwise frequency reference from the terminal 1819, the MCLK signal delayed by the DLL 1823 to be in phase with the clockwise frequency reference signal, and the counterclockwise frequency reference from the terminal 1821 that is delayed by a DLL 1829 to be in phase with the clockwise frequency reference signal. Thus, the output of the multiplexer 1813 (used to drive the node clock signal) is either the MCLK (if the node is a clock originator node), a delayed MCLK (that is in phase with the now missing clockwise signal—if both the clockwise and counterclockwise frequency reference signals are missing and the node is a backup clock originator node), or for normal operation, the signal that also drives the clockwise frequency reference.

The MCLK input to this multiplexer passes through a fixed delay element that is carefully constructed to have the same delay as the multiplexer that feeds both the second input to this multiplexer and the CwFrefOut of a non-clock originator node. The output of the multiplexer 1827 also drives the node's clockwise frequency reference signal output at a terminal 1831.

A multiplexer 1833 has as its inputs, a clockwise frequency referenced signal that has been delayed by a DLL 1835 to be in phase with the counterclockwise frequency reference signal from the terminal 1821, the counterclockwise frequency reference signal, and a MCLK signal that has been delayed by a DLL 1837 to be in phase with the counterclockwise frequency reference signal. The output of the multiplexer 1833 is used to provide the node's counterclockwise frequency reference signal output at a terminal 1839.

The phase detector in each DLL 1823, 1829, 1835, 1837 is designed so that a correction cannot be made if the reference signal is inactive. Therefore, loss of the primary reference does not drive the DLL away from phase match. After the node detects the loss of the primary signal, the "Loss of Signal Detector/Mode Control" logic 1807 switches to the backup reference and freezes the appropriate delay line. Because the backup reference and the reference were in phase at the time of signal loss and because no subsequent delay changes are made, there is no change of phase (within the accuracy of the DLL) at the frequency reference outputs 1831, 1839 due to a switch to the backup reference. MCLK is the local generated frequency reference and is only available at the clock originator node and the backup clock originator node. At all other nodes, MCLK is a static input. MCLK is the primary reference at the clock originator node. CwFrefIn is the primary reference at all other nodes. CcwFrefIn is the backup reference at all nodes. If both CwFrefIn and CcwFrefIn fail at the backup clock originator node, then the backup clock originator node takes over the clock originator function and drives its MCLK input, suitably delayed, out both the CwFrefOut 1831 and CcwFrefOut 1839 as well as into its own frequency multiplying PLL 1801. All other nodes ignore the loss of both the CwFrefIn and CcwFrefIn signals, except for asserting an ALARM signal at a terminal 1841. If either of CwFrefIn and CcwFrefIn signals are missing, the circuit selects the other signal as its backup frequency reference. Whenever a failed frequency reference is detected an alarm condition is raised at the terminal 1841. This results in interrupt output assertion or interrupt transition cell generation (for a bus) to notify the appropriate node of the condition.

Figure 19A:
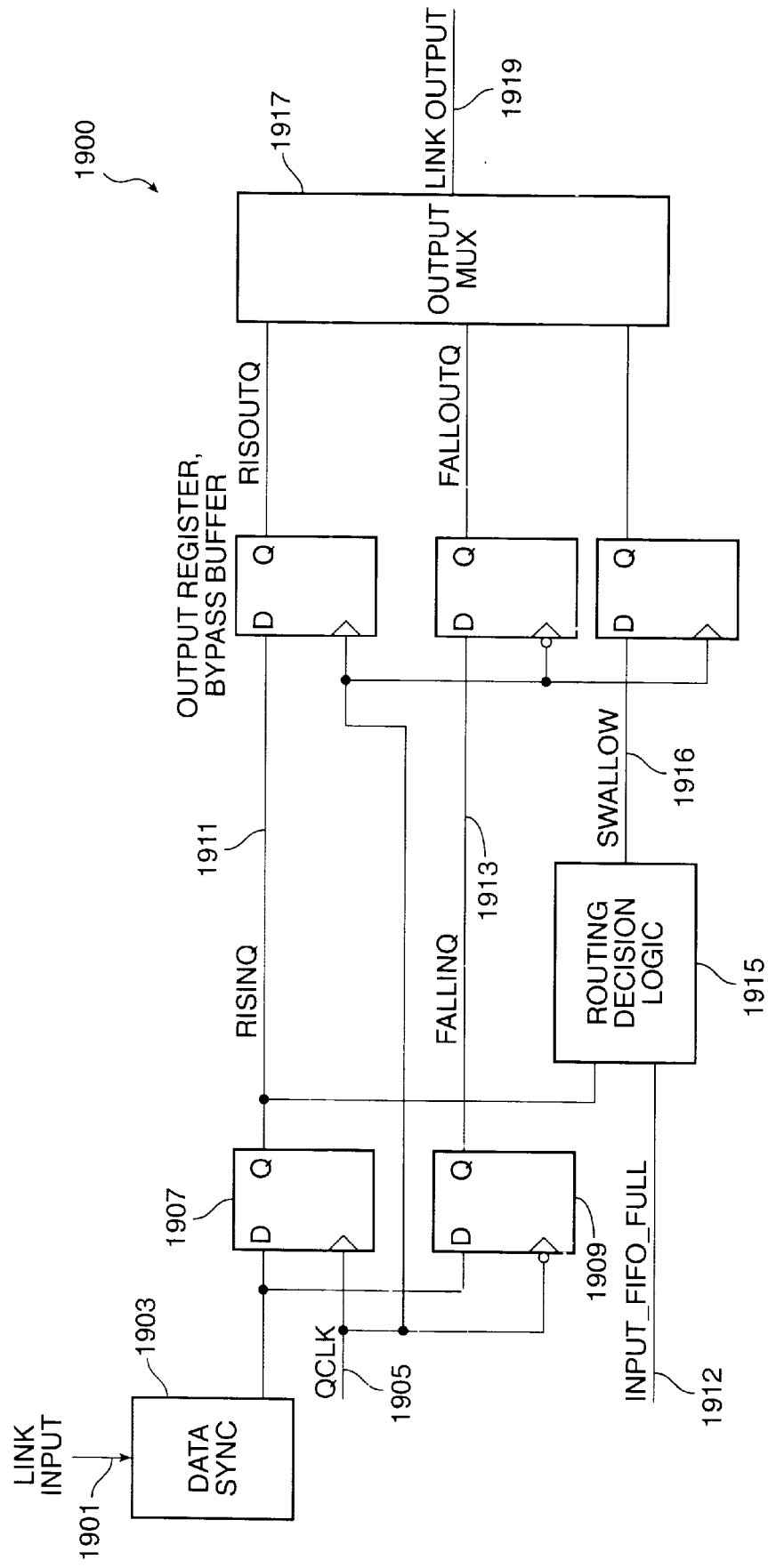
FIGS. 19a&b illustrate the operation and timing of the link interface in accordance with a preferred embodiment of the invention.

FIG. 19*a* illustrates the operational concepts of the link interface circuitry 153, 155 of FIG. 1*b*. One of the data signals from an incoming path 1901 is delayed by a data synchronization delay logic 1903, as described above, to be in synchronization with the ICLK signal. (Each data bit from the incoming path is processed in a similar manner.) The data signal is supplied to two registers that are clocked by the quadrature clock (QCLK) that enters at a terminal 1905. The QCLK signal samples the data signal at the rising edge of the QCLK at a risingQ flip-flop 1907. The QCLK signal also samples the data signal at the falling edge of the QCLK at a fallingQ flip-flop 1909. This results in two pipelines that carry data 1911, 1913 (one skilled in the art will understand that the pipeline consists of a plurality of data signals corresponding to the width of the parallel data paths comprising the incoming path). The first word of a cell is present on the risingQ pipeline 1911 after the first QCLK. Thus, a routing decision logic 1911, monitors the first word of data on the risingQ pipeline 1911 and makes routing decisions based on the routing tag field 729 and the status of an input-FIFO-full signal provided at a terminal 1912. One skilled in the art will understand that this technique could be extended to create four or even more pipelines operating at even lower data rates. If the cell is to be swallowed, the routing decision logic 1915 generates a swallow signal 1916 that disables an output multiplexer 1917 so that data on the pipelines 1911, 1913 is not forwarded to the next node through an outgoing path 1919. If the incoming cell is to be forwarded, the routing decision logic 1915 enables the output multiplexer 1917 so that the data on the pipelines 1911, 1913 are multiplexed onto the outgoing path 1919. One skilled in the art will understand that this forwarding logic operates with a very short latency (that is, incoming data appears at the outgoing path 1919 approximately a single QCLK cycle after it is clocked into the input registers 1907 & 1909) and will appreciate that a system architecture that allows routing decisions to be made so quickly represents a significant advance in the state of the art.

Figure 19B:
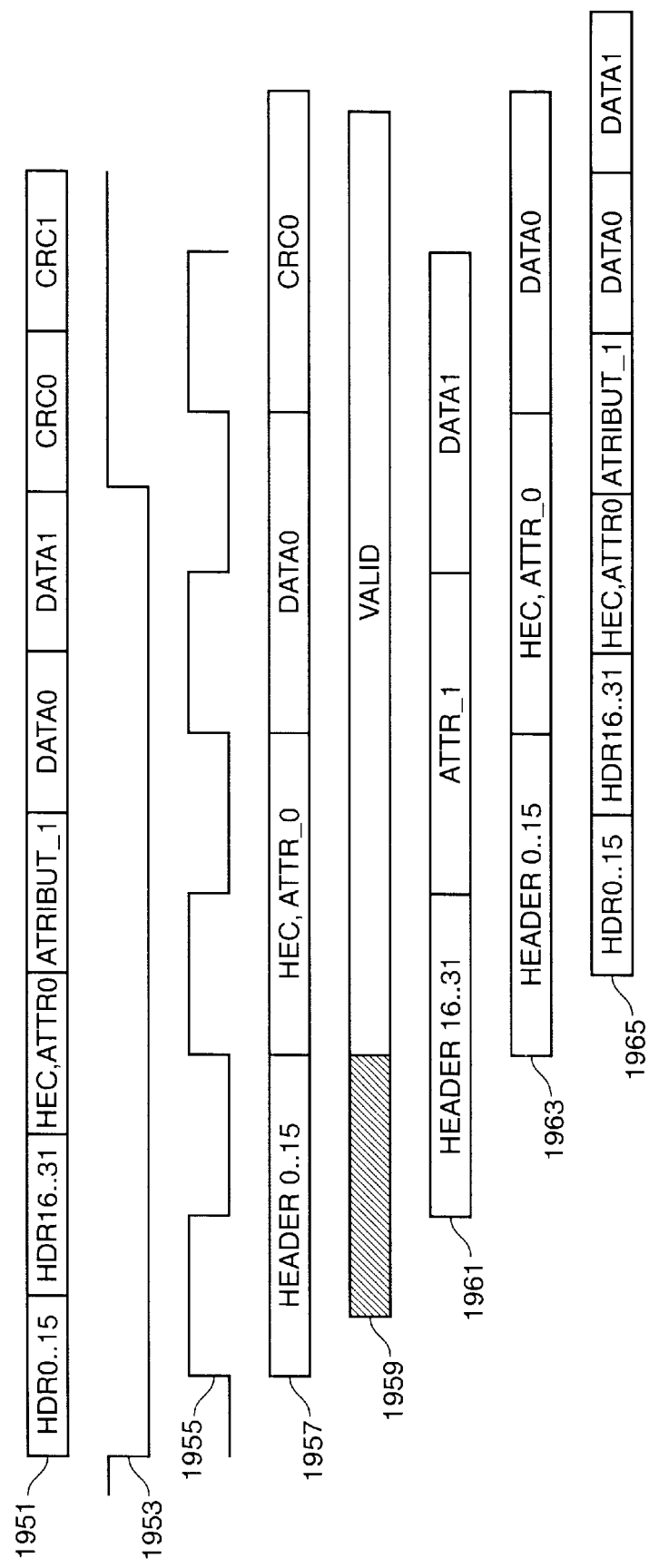

FIG. 19*b* illustrates the timing for the signals processed by logic illustrated in FIG. 19*a*. Again, the data signals 1951 are delayed to be in phase with the ICLK signal as described above. One embodiment provides sixteen data signals and the flag bit signal in parallel. The received data signals 1951 are part of a cell because a cell flag signal 1953 is asserted. A QCLK signal 1955 clocks the data signals 1951 on both edges of the QCLK signal 1955. One skilled in the art will understand that the clocking of the data signals 1951 can also be accomplished using the inverse of the QCLK signal or some combination of the QCLK and the inverse of the QCLK signals with flip-flops sensitive to the appropriate clock edges. The received data signals 1951 are clocked into a first pipeline 1957 at the first edge of the QCLK signal 1955. The cell header is the first word of the cell. Once the data signals making up the cell header is clocked in the first pipeline register 1957 routing decision logic indicates whether or not to forward the cell by asserting or deasserting a swallow signal 1959. This decision is valid at the next upward edge of the QCLK signal. The received data 1951 is clocked into a second pipeline register 1961 at the second edge of the QCLK signal 1955. These pipelines 1957, 1961 transport the data at half the frequency that the data is received. If the cell is to be forwarded, the ends of the pipeline are multiplexed onto an output path 1965 using the levels of the QCLK signal 1955 to select between the rising and falling edge pipelines.

Figure 20:
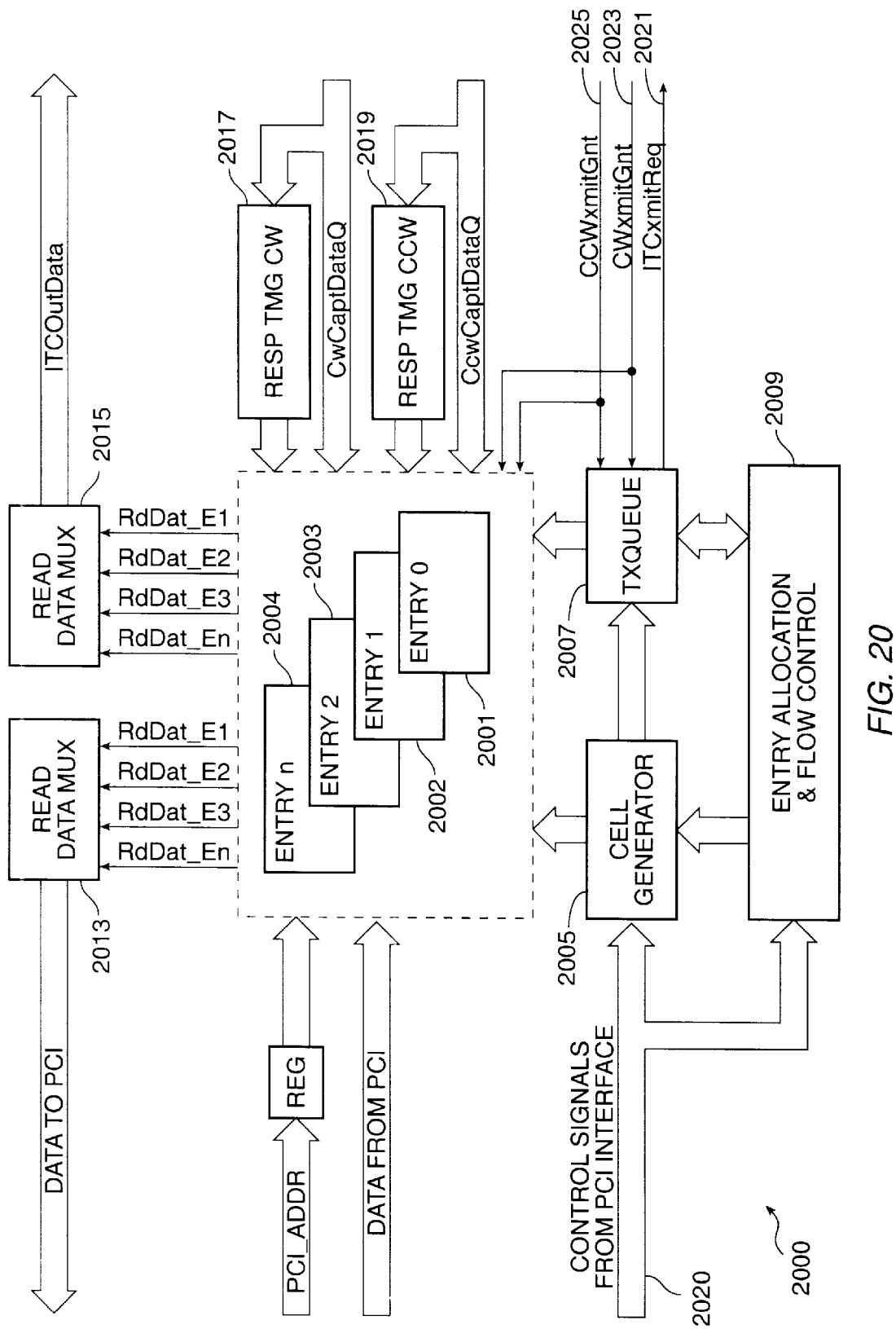
FIG. 20 illustrates the incomplete transaction cache in accordance with a preferred embodiment of the invention.

FIG. 20 illustrates the overall structure of the incomplete transaction cache. The ITC is indicated using a general reference character 2000. The ITC includes of a plurality of entries, 2001, 2002, 2003, 2004, a cell generator 2005, a transmit queue 2007, an entry allocation and flow control circuit 2009, a PCI read data multiplexer 2013, a link read data multiplexer 2015, a response synchronization circuit 2017 for the clockwise link, and a response synchronization circuit 2019 for the counterclockwise link.

The cell generator 2005 receives control signals from the PCI interface through a terminal 2020. These control signals cause the cell generator 2005 to create a cell that will be stored in one of the plurality of entries 2000–2004. The entry allocation and flow control logic 2009 first determines whether the generation of the cell needs to be delayed by the flow control algorithms (described in the Cell Structure and Addressing, Broadcast Protocol and Flow Control sections above). If the generation of the cell is not delayed, the entry allocation and flow control logic 2009 selects the ITC entry 2001–2004 to hold the cell. This selection is communicated to the cell generator 2005, the transmit queue 2007, and the selected entry 2001–2004. The cell generator 2005 then sequences control signals as required to form the cell and to store it into the selected ITC entry's RAM. As generation of the cell nears completion, the cell generator 2005 signals the transmit queue 2007 to allow the newly formed cell to be transmitted. This signal precedes the actual completion of the cell by up to two clocks (depending upon the length of the cell that has been formed) to minimize the delay in transmitting the cell.

Figure 21:
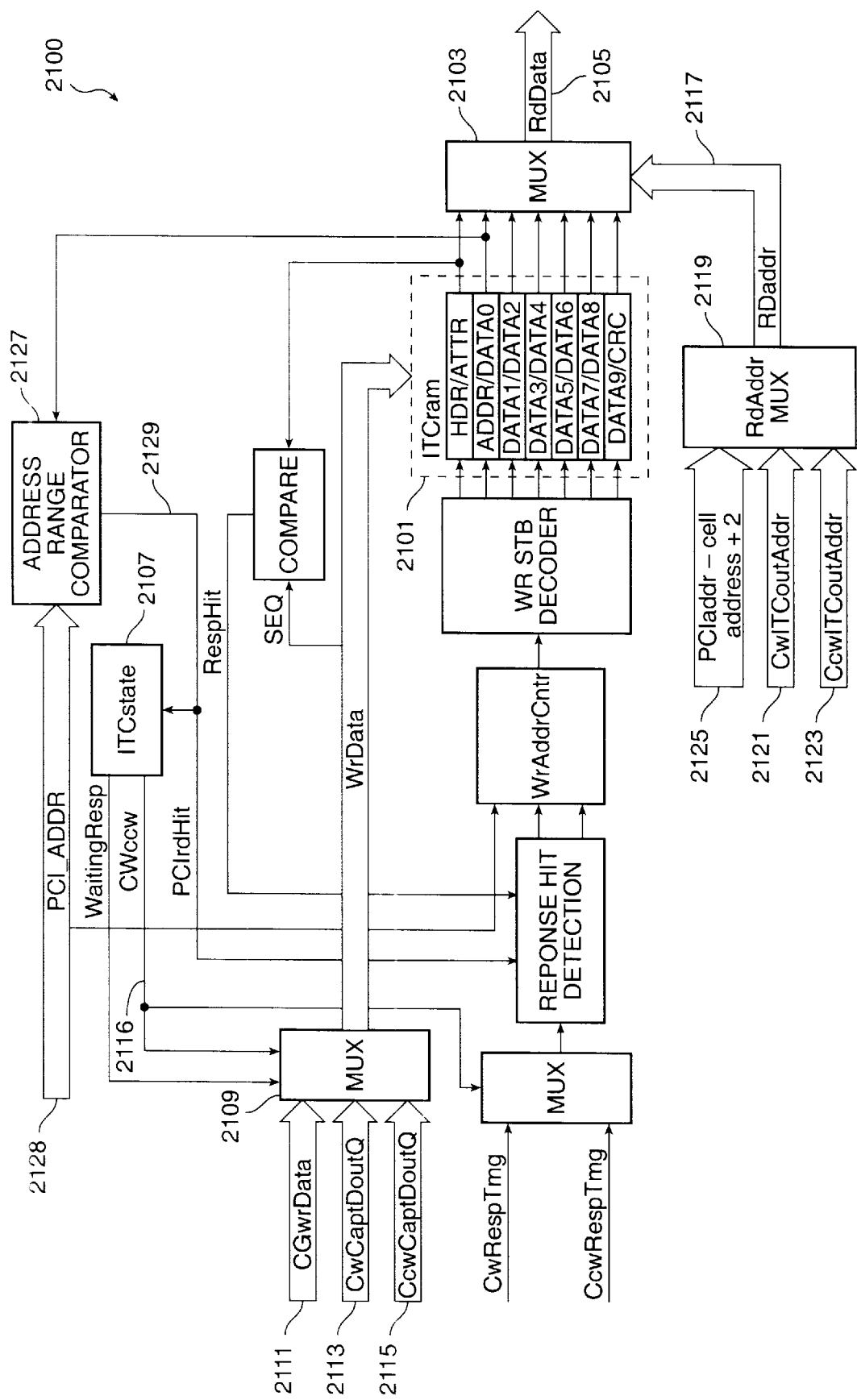
FIG. 21 illustrates an incomplete transaction entry in accordance with a preferred embodiment of the invention.

FIG. 21 illustrates one of the ITC entries 2001–2004 as indicated by a general reference character 2100. The ITC entry 2100 contains a dual-port RAM 2101 of sufficient size to contain the largest cell. In one preferred embodiment the dual-port RAM 2101 has seven 66 bit words. The word structure is further broken down into two 32 bit words representing various fields of the cell—the header, attributes word, address, data and CRC words. Associated with each 32 bit word is a 33rd bit used to delineate cell boundaries. This 33rd bit is generates the flag signal when the cell is transmitted out the link interface. The ITC entry includes a read data multiplexer 2103. The read data multiplexer 2103 sends the entry's output data to the read data multiplexes 2013, 2015 of FIG. 20 through a read data terminal 2105.

The status of the ITC entry 2100 is recorded and maintained in an ITC entry state machine 2107. The operation of the ITC entry state machine 2107 is explained in reference to FIG. 22.

A multiplexer 2109 selects the data written to the dual-port RAM 2101 dependent on the state of the ITC entry state machine 2107. The multiplexer 2109 selects data from a cell generator write data terminal 2111 while the ITC entry 2100 is unused and until a cell is fully formed within the ITC entry 2100. After an initiation cell has been transmitted and while a response cell is expected the multiplexer 2109 selects the captured data from either a clockwise link 2113 or from a counter-clockwise link 2115, according to a CWccw 2116 output from the ITC entry state machine 2107. Data read from the dual-port RAM 2101 is selected by the read data multiplexer 2103. The select inputs to this multiplexer 2103 form a read address 2117. The read address 2117 is selected by a multiplexer 2119 according to the status of the entry 2100.

The read address 2117 is selected to be a clockwise ITC output address 2121 if the cell contained in the dual-port RAM 2101 is to be transmitted out the clockwise link. However the read address 2117 is selected to be a counter-clockwise ITC output address 2123 if the cell contained in the dual-port RAM 2101 is to be transmitted out the counter-clockwise link. Otherwise, the read address is selected from a PCI address 2125. Thus, if the cell contained in the dual-port RAM 2101 is to be transmitted out the clockwise link, the read address 2117 is selected to be the clockwise ITC output address 2121. During cell transmission, the appropriate ITC output address 2121, 2123, 2125 is incremented by state machine logic in the link interface to bring successive words of the cell to the output multiplexer 2103.

The ITC entry 2100 also includes a PCI address range comparator 2127. The address range comparator 2127 determines whether the data contained within an entry in the WtPCI or RdPref states (described hereinafter) corresponds to the current PCI address. The address range comparator 2127 is implemented as a subtraction followed by a comparison. First the PCI address, from a terminal 2128, is subtracted from the address field of the cell stored in the dual-port RAM 2101. Next, the difference is compared to the data length subfield. If the entry's state is as previously indicated and the result of the subtraction is greater than or equal to zero and less than or equal to the entry's data length, a PCIrdHit signal 2129 is asserted. On a read cycle, this indicates that the dual-port RAM 2101 holds data currently being read by PCI. On a write cycle, this indicates that the cycle should receive a completion based upon the response code contained in the entry. When the PCIrdHit signal 2129 is asserted the result of the above subtraction plus two are the PCI read address 2125 for the cell. The read address 2125 is used to bring the addressed data word of the cell to data path 2105 and subsequently to the PCI AD bus for completion of the PCI read cycle. The PCI address from the terminal 2128 is the output of the register/counter 1207 in the PCI interface that is incremented after each data word of a burst.

Looking now at FIG. 20, an ITCxmitReq signal 2021 is asserted whenever the transmit queue 2007 is not empty. The entry number of the cell at the head of the transmit queue 2007 is decoded. The decoded entry number is used to select the ITC entry having its read data output 2105 is routed to the link interface by the multiplexer 2103 in order to transmit the cell. Assertion of the ITCxmitReq signal 2021 eventually leads to the assertion of one of two transmit grant signals, 2023, 2025 depending upon which path is selected for transmission by the LSR. The cell is known to have been transmitted at the deassertion of the grant signal 2023, 2025. Then, the transmit queue 2007 continues to transmit the next cell until the transmit queue 2007 is empty.

Figure 22:
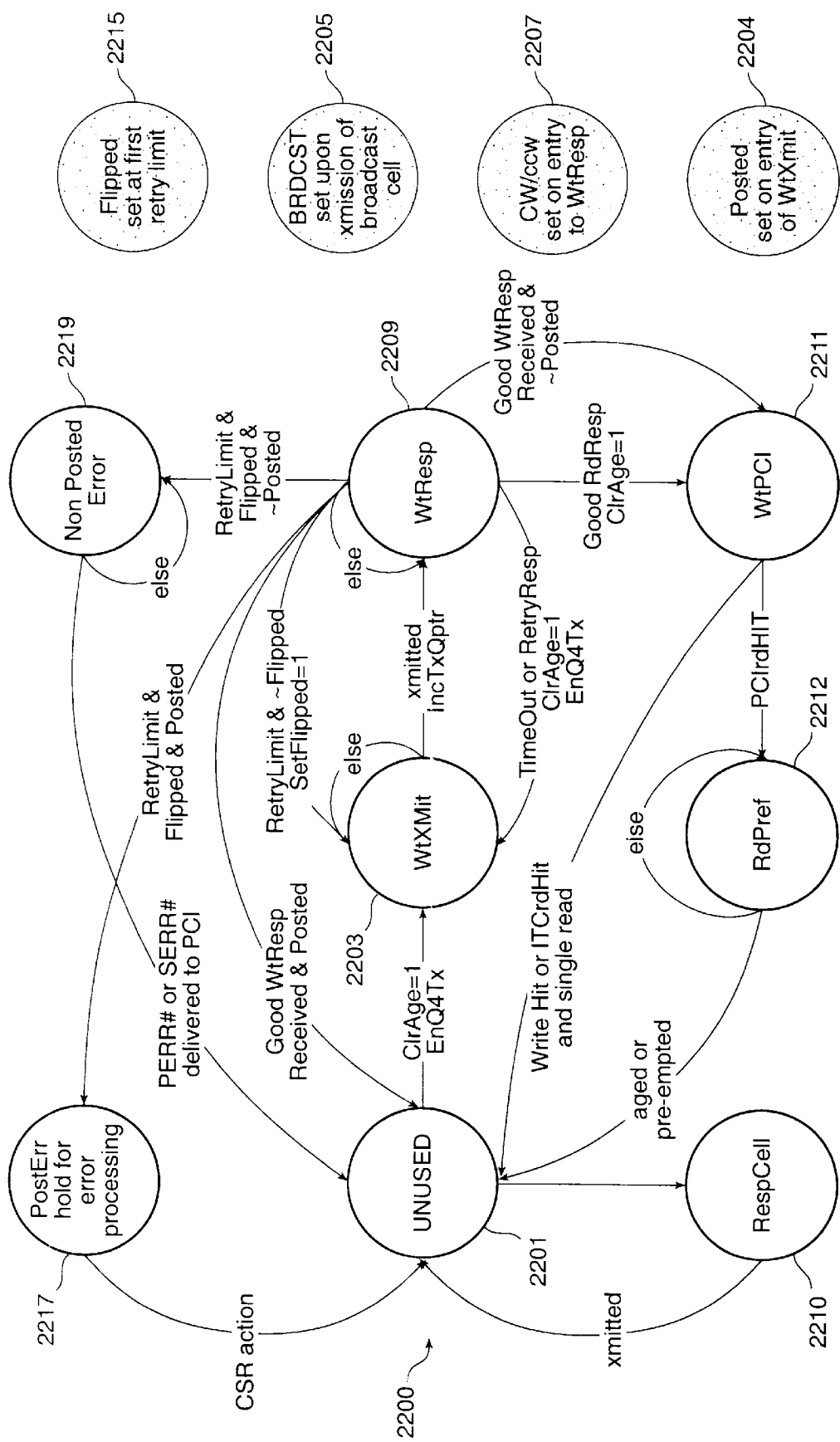
FIG. 22 illustrates the incomplete transaction state machine in accordance with a preferred embodiment.

FIG. 22 illustrates the state diagram, as indicated by a general reference character 2200, used by the ITC entry state machine 2107 to record and maintain the status of the ITC entry 2100. The ITC entry 2100 is initially in an unused state 2201. During the formation of an initiation or response or interrupt transition cell within the dual-port RAM 2101, the cell generator 2005 causes the ITC entry state machine 2107 to advance to a wait for transmit state 2203. At this time, a posted status bit 2204 is set if the corresponding PCI transaction has been completed. The posted status bit 2204 is cleared if the corresponding PCI transaction will receive a delayed completion upon receipt of an appropriate response cell. Additional status bits are appropriately set or cleared when the initiation cell is transmitted. A BRDCST bit 2205 is set if the cell is a broadcast cell and cleared otherwise. A CW/ccw bit 2207 is set or cleared dependent on the path taken by the initiation cell. The state machine 2107 advances to a wait response state 2209 after the initiation cell has been transmitted,.

When the ITC entry state machine 2107 is in the unused state 2201, the ITC entry 2100 can also be used to hold a response cell while the response cell is created. The state machine 2200 transitions to the response cell state 2210 when the data for the response cell is written to the dual-port RAM 2101. The response cell remains in the entry until the cell is transmitted. The state machine 2107 returns to the unused state 2201 after the response cell is transmitted. The ITC entry state machine 2107 remains in the wait response state 2209 until a response cell is received and then transitions based upon the contents of the received response cell. If no response cell is received before expiration of a timer or if a response cell containing a retry response is received (and the retry limit has not been reached) the ITC entry state machine 2107 returns to the wait for transmit state 2203. During this transition the ITC entry state machine 2107 causes the transmit queue 2007 to again queue the ITC entry 2100 for transmission.

If the ITC entry state machine 2107 is in the wait response state 2209 and receives an error-free read response cell containing data, the ITC entry state machine 2107 enters a wait for PCI state 2211. In the wait response state 2209, as well as a read prefetch state 2212, data may be supplied from the dual-port RAM 2101 to the PCI bus in response to a PCI read operation having an address within the range of addresses corresponding to the cell's data (described above for FIG. 21). In such a case, the PCIrdHit signal 2129 is asserted within the ITC entry 2100. The PCIrdHit signal 2129 causes the ITC entry state machine 2107 to advance to the read prefetch state 2212. An aging timer starts upon entry to the read prefetch state 2212. The ITC entry state machine 2107 transitions to the unused state 2201 when the age limit is reached or when the highest addressed data of the cell is supplied to the PCI in response to a PCI read operation.

The ITC entry state machine 2107 also enters the wait for PCI state 2211 from the wait response state 2209 when the ITC entry state machine 2107 receives a write response cell indicating successful completion and the POSTED bit 2204 is clear. The ITC entry state machine 2107 waits in the wait for PCI state 2211 until a PCI write cycle having an address matching the address and data of the write response cell is detected. Once the PCI write cycle is detected, the ITC entry state machine 2107 returns to the unused state 2201.

The ITC entry state machine 2107 returns to the unused state 2201 if the ITC entry state machine 2107 is in the wait response state 2209, the POSTED bit 2204 is set, and the ITC entry state machine 2107 receives a write response cell indicating successful completion. If the ITC entry state machine 2107 is in the wait response state 2209 with a FLIPPED status bit 2215 cleared, and the ITC entry state machine 2107 either times out or receives a response cell indicating need for a retry (and the retry limit has been reached), the ITC entry state machine 2107 sets the FLIPPED status bit 2215, requeues the initiation cell for transmission and enters the wait for transmit state 2203.

The FLIPPED status bit 2215 causes the LSR bit corresponding to the cell's destination to be toggled. This causes the cell to be transmitted over the alternate path. It also sets an internal fault indication CSR bit and may (depending upon configuration options) assert an interrupt output or generate an interrupt transition cell. If the ITC entry state machine 2107 is in the wait response state 2209 with the FLIPPED status bit 2215 set, and the ITC entry state machine 2107 either times out or receives a response cell indicating need for a retry (and the retry limit has been reached), the ITC entry state machine 2107 transitions to either a posted error state 2217 or a non-posted error state 2219 depending on the status of the POSTED bit 2204.

The non-posted error state 2219 causes the corresponding PCI transaction to be terminated. This termination will be either with either a PERR# or a SERR# signal assertion. The PERR# assertion occurs if the response code indicates that a PERR# assertion was received at the target node. Otherwise the PCI transaction terminates with the SERR# signal assertion.

In the posted error state 2217, the ITC entry state machine 2107 asserts an internal error signal in a status register and may (depending upon configuration options) cause an interrupt output to be asserted or an interrupt transition cell to be generated or cause the SERR# output to be asserted. The transition from the posted error state 2217 to the unused state 2201 is forced by writing to a vender specific CSR.

Although the present invention has been described in terms of the presently preferred embodiments, one skilled in the art will understand that various modifications and alterations may be made without departing from the scope of the invention. Accordingly, the scope of the invention is not to be limited to the particular invention embodiments discussed herein, but should be defined only by the appended claims and equivalents thereof.

What is claimed is:

1. A method for implementing a system interconnect for transporting a first cell containing a plurality of data between a plurality of nodes wherein said system interconnect includes: a first unidirectional path between each pair of adjacent nodes of said plurality of nodes, said first unidirectional path includes an incoming end and an outgoing end and a first plurality of signal lines and a frequency reference line, said pair of adjacent nodes having a source node and a receiver node, each of said plurality of nodes includes an input section connected to said incoming end of an input path, and an output section connected to said outgoing end of an output path, said method comprising steps of:

(a) providing a frequency reference signal on said frequency reference line to said plurality of nodes;

(b) generating, by a phase lock loop frequency multiplier, a node clock based on said frequency reference signal, said node clock having the same frequency for each of said plurality of nodes, said source node having a source node clock and said receiver node having a receiver node clock;

(c) transmitting said first cell from said output section of said source node to said input section of said receiver node over said first unidirectional path, by emitting a plurality of data transitions representing said first cell, onto said first plurality of signal lines at said outgoing end of said first unidirectional path; and (d) receiving said data transitions from said first plurality of signal lines at said incoming end of said first unidirectional path at said input section of said receiver node.

2. The method of claim 1 wherein said receiver node further comprises an address comparator mechanism and a node address, said first cell comprises a destination address, and said method further comprises:

(e) comparing said node address with said destination address.

3. The method of claim 2 wherein said method further comprises:

(f) emitting said plurality of data transitions, in synchronization with said receiver node clock, onto a second plurality of data lines at said outgoing end of a second unidirectional path while receiving said data transitions from said first plurality of signal lines.

4. The method of claim 2 wherein said method further comprises:

(f1) detecting that said receiver node is transmitting a second cell at said outgoing end of a second unidirectional path;

(f2) storing a third cell in a bypass buffer if said node address is different from said destination address, said third cell constructed from said data transitions received at step (d);

(f3) detecting when said second cell has been completely transmitted; and (f4) transmitting said third cell from said bypass buffer at said outgoing end of said second unidirectional path.

5. The method of claim 2 wherein said method further comprises:

(f) swallowing said plurality of data transitions defining a second cell if said node address is the same as said destination address.

6. The method of claim 5 wherein said method further comprises the steps of:

(g) processing said second cell; and (h) transmitting a response cell addressed to said source node from said output section of said receiver node.

7. The method of claim 6 wherein step (c) further comprises storing a copy of said first cell in a cell storage, and further comprising the steps of:

(i) receiving said response cell at said source node; and (j) removing said copy of said first cell from said cell storage.

8. The method of claim 2 wherein said first cell is a broadcast cell, and further comprising:

(f) capturing a second cell; and (g) emitting said plurality of data transitions onto a second plurality of data lines at said outgoing end of a second unidirectional path.

9. The method of claim 8 further comprising:

(h) processing said second cell; and (i) transmitting a response cell to said source node.

10. The method of claim 1 further comprising:

initializing each of said nodes by emitting a plurality of training signal edges on each of said first plurality of signal lines to condition at least one delay locked loop such that said training signal edges are synchronized with said node clock.

11. The method of claim 1 wherein said input section includes a plurality of adjustable delays with one adjustable delay for each of said first plurality of signal lines, and further comprising:

synchronizing said data transitions from said first plurality of signal lines to said receiver node clock through use of said plurality of adjustable delays.

12. The method of claim 1 wherein said input section includes an adjustable delay and further comprising:

synchronizing said data transitions from said first plurality of signal lines to said receiver node clock through use of said adjustable delay.

13. A system interconnect apparatus for transporting a first cell containing a plurality of data between a plurality of nodes wherein said system interconnect includes: a first unidirectional path between each pair of adjacent nodes of said plurality of nodes, said first unidirectional path includes an incoming end and an outgoing end and a first plurality of signal lines and a frequency reference line, said pair of adjacent nodes having a source node and a receiver node, said apparatus comprising:

a clock originator node configured to provide a frequency reference signal on said frequency reference line to said plurality of nodes;

a phase lock loop frequency multiplier configured to generate a node clock based on said frequency reference signal, said node clock having the same frequency for each of said plurality of nodes, said source node having a source node clock and said receiver node having a receiver node clock;

an output section of said source node connected to said outgoing end of an output path configured to transmit said first cell to said input section of said receiver node over said first unidirectional path, by emitting a plurality of data transitions using said source node clock, representing said first cell, onto said first plurality of signal lines at said outgoing end of said first unidirectional path; and an input section of said receiver node connected to said incoming end of an input path configured to receive said data transitions using said receiver node clock, from said first plurality of signal lines at said incoming end of said first unidirectional path.

14. The apparatus of claim 13 wherein said first cell comprises a destination address and said receiver node further comprises a node address and a routing decision logic mechanism configured to compare said node address with said destination address.

15. The apparatus of claim 14 wherein said receiver node further comprises:

a forwarding logic mechanism configured to emit said plurality of data transitions, in synchronization with said receiver node clock, onto a second plurality of data lines at said outgoing end of a second unidirectional path while receiving said data transitions from said first plurality of signal lines, said forwarding logic mechanism dependent on said routing decision logic mechanism.

16. The apparatus of claim 14 wherein said receiver node further comprises:

an emitting decision mechanism configured to detect that said receiver node is transmitting a second cell at said outgoing end of a second unidirectional path;

a bypass buffer configured to store a third cell if said node address is different from said destination address, said third cell constructed from said data transitions received by said input section;

a finished emitting decision mechanism configured to detect when said second cell has been completely transmitted; and a transmit cell from bypass buffer mechanism configured to transmit said third cell from said bypass buffer at said outgoing end of said second unidirectional path.

17. The apparatus of claim 14 wherein said receiver node further comprises:

a cell swallowing mechanism configured to swallow said plurality of data transitions defining a second cell, said cell swallowing mechanism dependent on said routing decision logic mechanism.

18. The apparatus of claim 14 wherein said receiver node further comprises:

a cell management mechanism configured to process said second cell; and a response cell mechanism configured to transmit a response cell addressed to said source node from said output section of said receiver node.

19. The apparatus of claim 18 wherein said source node further comprises:

an incomplete transaction cache (ITC) configured to store a copy of said first cell in a cell storage, said ITC further configured to remove said copy of said first cell from said cell storage dependent on receipt of a response cell at said source node.

20. The apparatus of claim 14 wherein said first cell is a broadcast cell and said receiver node further comprises:

a cell swallowing mechanism configured to swallow said plurality of data transitions defining a second cell; and a forwarding logic mechanism configured to emit said plurality of data transitions, in synchronization with said receiver node clock, onto a second plurality of data lines at said outgoing end of a second unidirectional path while receiving said data transitions from said first plurality of signal lines.

21. The apparatus of claim 20 wherein said receiver node further comprises:

a cell processing mechanism configured to process said second cell and to generate a status; and a response mechanism configured to transmit a response cell to said source node, said response cell containing said status.

22. The apparatus of claim 13 wherein each node further comprises:

a training signal generator configured to emit a plurality of training signal edges on each of said first plurality of signal lines; and an initialization logic configured to condition at least one delay locked loop such that said training signal edges received from said first plurality of signal lines at said incoming end of said first unidirectional path are synchronized with said node clock.

23. The apparatus of claim 13 wherein said input section comprises:

a plurality of adjustable delays with one adjustable delay for each of said first plurality of signal lines; and a synchronization mechanism configured to synchronize said data transitions from said first plurality of signal lines to said receiver node clock through use of said plurality of adjustable delays.

24. The apparatus of claim 13 wherein said input section comprises:

an adjustable delay; and a synchronization mechanism configured to synchronize said data transitions from said first plurality of signal lines to said receiver node clock through use of said adjustable delay.

* * * * *